US012615893B2

(12) United States Patent
Iizumi et al.

(10) Patent No.: US 12,615,893 B2
(45) Date of Patent: Apr. 28, 2026

(54) BINDER COMPOSITION, COMPOUND, BINDER LAYER, OPTICAL LAMINATE, OPTICAL LAMINATE MANUFACTURING METHOD, AND IMAGE DISPLAY DEVICE

(71) Applicant: FUJIFILM Corporation, Tokyo (JP)

(72) Inventors: Takashi Iizumi, Kanagawa (JP); Soichiro Watanabe, Kanagawa (JP); Yutaka Nozoe, Kanagawa (JP); Kazushige Nakagawa, Kanagawa (JP); Kunihiro Atsumi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 668 days.

(21) Appl. No.: 18/147,003

(22) Filed: Dec. 28, 2022

(65) Prior Publication Data

US 2023/0138456 A1 May 4, 2023

Related U.S. Application Data

(63) Continuation of application No. PCT/JP2021/025454, filed on Jul. 6, 2021.

(30) Foreign Application Priority Data

Jul. 29, 2020 (JP) ................................ 2020-128049
Feb. 8, 2021 (JP) ................................ 2021-018078
Feb. 24, 2021 (JP) ................................ 2021-027223

(51) Int. Cl.

| | |
|---|---|
| ***H01L 33/50*** | (2010.01) |
| ***B32B 7/023*** | (2019.01) |
| ***C08F 8/26*** | (2006.01) |
| ***C08F 20/22*** | (2006.01) |
| ***C08F 220/22*** | (2006.01) |
| ***C08F 267/06*** | (2006.01) |
| ***C08L 33/00*** | (2006.01) |
| ***C08L 33/16*** | (2006.01) |
| ***C08L 101/00*** | (2006.01) |

(Continued)

(52) U.S. Cl.

CPC ......... *H10H 20/8511* (2025.01); *B32B 7/023* (2019.01); *C08F 8/26* (2013.01); *C08F 20/22* (2013.01); *C08F 220/22* (2013.01); *C08F 267/06* (2013.01); *C08L 33/00* (2013.01); *C08L 33/16* (2013.01); *C08L 101/00* (2013.01); *C09J 201/04* (2013.01); *C09K 19/38* (2013.01); *C09K 19/542* (2013.01); *G02B 5/30* (2013.01); *G02F 1/1337* (2013.01); *C09K 2019/0448* (2013.01); *C09K 19/3852* (2013.01); *C09K 2019/528* (2013.01); *C09K 2219/03* (2013.01)

(58) Field of Classification Search

None

See application file for complete search history.

(56) References Cited

U.S. PATENT DOCUMENTS 5,391,587 A 2/1995 Wu
5,623,089 A 4/1997 Yang (Continued)

FOREIGN PATENT DOCUMENTS

CN 114364711 4/2022
JP H07502066 3/1995

(Continued)

OTHER PUBLICATIONS

"Request for the Submission of an Opinion of Korea Counterpart Application", with English translation thereof, issued on Feb. 12, 2025, pp. 1-22.

(Continued)

*Primary Examiner* — Eli D. Strah
(74) *Attorney, Agent, or Firm* — JCIPRNET

(57) ABSTRACT

An object of the present invention is to provide a binder composition in which air unevenness is suppressed and which has excellent upper layer coating properties after being formed as a layer, a compound, a binder layer, an optical laminate, an optical laminate manufacturing method, and an image display device. The binder composition of the present invention is a binder composition containing a binder and a compound having a group represented by Formula (B1) or (B2).

(B1)

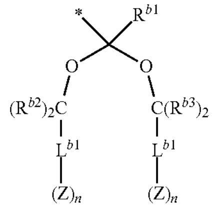

(B2)

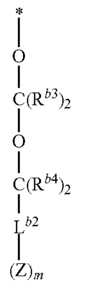

In Formulae (B1) and (B2), Z represents an aliphatic hydrocarbon group having a fluorine atom or an organosiloxane group.

22 Claims, No Drawings

(51) Int. Cl.

| | |
|---|---|
| ***C09J 201/04*** | (2006.01) |
| ***C09K 19/38*** | (2006.01) |
| ***C09K 19/54*** | (2006.01) |
| ***G02B 5/30*** | (2006.01) |
| ***G02F 1/1337*** | (2006.01) |
| ***H10H 20/851*** | (2025.01) |
| *C09K 19/04* | (2006.01) |
| *C09K 19/52* | (2006.01) |

(56) References Cited

U.S. PATENT DOCUMENTS

| | | | | |
|---|---|---|---|---|
| 6,046,367 | A | 4/2000 | Yang | |
| 11,319,393 | B2 | 5/2022 | Tamura et al. | |
| 2012/0309972 | A1 | 12/2012 | Ito et al. | |
| 2015/0321986 | A1 | 11/2015 | Bonrath et al. | |
| 2020/0079885 | A1* | 3/2020 | Tamura | C08F 20/30 |
| 2022/0179250 | A1 | 6/2022 | Iizumi et al. | |

FOREIGN PATENT DOCUMENTS

| | | | |
|---|---|---|---|
| JP | H08507529 | 8/1996 | |
| JP | 3204976 | 9/2001 | |
| JP | 2008115258 | 5/2008 | |
| JP | 2015537055 | 12/2015 | |
| JP | 2018124528 | 8/2018 | |
| WO | 2011105239 | 9/2011 | |
| WO | 2018216812 | 11/2018 | |
| WO | WO-2018216812 A1 * | 11/2018 | C09K 19/3491 |
| WO | 2021039803 | 3/2021 | |

OTHER PUBLICATIONS

"Office Action of China Counterpart Application", issued on Dec. 28, 2024, with English translation thereof, pp. 1-13.

Office Action of Japan Counterpart Application, with English translation thereof, issued on Feb. 6, 2024, pp. 1-8.

József Rábai et al., "Mixture Synthesis of Fluorous Ketals: Mitsunobu Reaction of Homologous 3-Perfluoroalkyl-propanols with Hexafluoroacetone Sesquihydrate and Collective Determination of Fluorophilicity Values", QSAR Comb. Sci,, vol. 25, Issue 8, Sep. 2006, pp. 761-765.

"Office Action of China Counterpart Application", issued on Jun. 25, 2025, with English translation thereof, p. 1-p. 9.

"International Search Report (Form PCT/ISA/210) of PCT/JP2021/025454", mailed on Oct. 5, 2021, with English translation thereof, pp. 1-5.

"Written Opinion of the International Searching Authority (Form PCT/ISA/237) of PCT/JP2021/025454", mailed on Oct. 5, 2021, with English translation thereof, pp. 1-9.

"Request for the Submission of an Opinion of Korea Counterpart Application", issued on Oct. 30, 2025, with English translation thereof, p. 1-p. 22.

* cited by examiner

BINDER COMPOSITION, COMPOUND, BINDER LAYER, OPTICAL LAMINATE, OPTICAL LAMINATE MANUFACTURING METHOD, AND IMAGE DISPLAY DEVICE

CROSS-REFERENCE TO RELATED APPLICATIONS

This application is a Continuation of PCT International Application No. PCT/JP2021/025454 filed on Jul. 6, 2021, which claims priority under 35 U.S.C. § 119(a) to Japanese Patent Application No. 2020-128049 filed on Jul. 29, 2020, Japanese Patent Application No. 2021-018078 filed on Feb. 8, 2021 and Japanese Patent Application No. 2021-027223 filed on Feb. 24, 2021. The above applications are hereby expressly incorporated by reference, in its entirety, into the present application.

BACKGROUND OF THE INVENTION

1. Field of the Invention

The present invention relates to a binder composition, a compound, a binder layer, an optical laminate, an optical laminate manufacturing method, and an image display device.

2. Description of the Related Art

In recent years, a polymer material has been used in various fields. Accordingly, in accordance with the respective fields, properties of the polymer as a matrix, and characteristics of a surface of a coating film formed by adding the polymer and characteristics of an interface of a laminated film in a case where the coating film is laminated are also important. For example, many semiconductor parts, optical members, liquid crystal-related members, and the like are manufactured by laminating the coating film. In order to improve wettability of a coating composition and smoothness of the surface of the coating film, or wettability in a case where an upper layer composition is applied onto the surface of the coating film, a silicone-based or fluorine-based surfactant may be added to the composition.

For example, JP2008-115258A discloses a composition containing a fluorine-containing polymer surfactant obtained by polymerizing a predetermined fluorine-containing urethane (meth)acrylate as an essential component of a polymerizable ethylenically unsaturated monomer ([Claim 1], [Claim 6], and [0070]).

In addition, WO2018/216812A discloses a binder composition which contains a photo-alignment polymer having a repeating unit having a fluorine atom or a silicon atom at a predetermined position, and a binder ([Claim 1] and [Claim 7]).

SUMMARY OF THE INVENTION

By the way, in a case where a fluorine-based surfactant or a silicone-based surfactant is used, coating properties of the composition are improved and film thickness unevenness by drying air during drying (hereinafter, also referred to as "air unevenness") can be suppressed; but since surface energy of the coating film is low, the surfactant tends to be unevenly distributed on the surface of the coating film. Since such a surface has high water and oil repellency, in a case where an attempt is made to produce a laminate film by further coating an upper layer, coating properties of a composition for forming the upper layer (hereinafter, also referred to as "upper layer coating properties") may be deteriorated.

In a case where the above-described composition disclosed in JP2008-115258A is studied from the viewpoint of air unevenness and upper layer coating properties, the present inventors have found that, although the effect of preventing air unevenness is excellent, there is room for improvement in the upper layer coating properties.

Similarly, in a case where the above-described composition disclosed in WO2018/216812A is studied, it is found that, although the effect of preventing air unevenness is excellent, the upper layer coating properties satisfy a required level in the related art, further improvement is necessary to satisfy the higher required level of recent years.

Therefore, an object of the present invention is to provide a binder composition in which air unevenness is suppressed and which has excellent upper layer coating properties after being formed as a layer, a compound, a binder layer, an optical laminate, an optical laminate manufacturing method, and an image display device.

As a result of intensive studies to achieve the above-described objects, the present inventors have found that blending a compound having a group represented by a predetermined structure can suppress the air unevenness and provide excellent upper layer coating properties after being formed as a layer, and completed the present invention.

That is, the present inventors have found that the above-described objects can be achieved with the following configuration.

[1] A binder composition comprising:

a binder; and a compound having a group represented by Formula (B1) or (B2) described later.

[2] The binder composition according to [1], further comprising:

a photo-acid generator.

[3] The binder composition according to [1] or [2], in which the compound is a compound further having a photo-aligned group.

[4] The binder composition according to any one of [1] to [3], in which the compound is a polymer having a repeating unit B including the group represented by Formula (B1) or (B2) described later.

[5] The binder composition according to [4], in which the repeating unit B is a repeating unit represented by Formula (1) or (2) described later.

[6] The binder composition according to [4] or [5], in which the compound is a copolymer having a repeating unit A including a photo-aligned group and the repeating unit B.

[7] The binder composition according to [6], in which the repeating unit A is a repeating unit represented by Formula (A) described later.

[8] The binder composition according to [6] or [7], in which the compound is a copolymer having a repeating unit C including a crosslinkable group, the repeating unit B, and the repeating unit A.

[9] The binder composition according to any one of [1] to [8], in which a weight-average molecular weight of the compound is 10000 to 500000.

[10] A compound comprising:

a group represented by Formula (B1) or (B2) described later.

[11] The compound according to [10], further comprising:

a group represented by Formula (P0) described later.

[12] The compound according to [10], in which the compound is a polymer having a repeating unit B including the group represented by Formula (B1) or (B2) described later.

[13] The compound according to [12], in which the repeating unit B is a repeating unit represented by Formula (1) or (2) described later.

[14] The compound according to [12] or [13], in which the compound is a copolymer having a repeating unit A including a photo-aligned group and the repeating unit B.

[15] The compound according to [14], in which the repeating unit A is a repeating unit represented by Formula (A) described later.

[16] The compound according to [14] or [15], in which the compound is a copolymer having a repeating unit C including a crosslinkable group, the repeating unit B, and the repeating unit A.

[17] The compound according to any one of [10] to [16], in which a weight-average molecular weight is 10000 to 500000.

[18] A binder layer formed of the binder composition according to any one of [1] to [9].

[19] An optical laminate comprising:

the binder layer according to [18]; and an optically anisotropic layer disposed on the binder layer.

[20] An optical laminate manufacturing method comprising:

a step of supplying at least one selected from the group consisting of light, heat, acid, and base to a coating film formed of the binder composition according to any one of [6] to [8], and then performing a photo-alignment treatment to form a binder layer; and a step of performing coating on the binder layer with a polymerizable liquid crystal composition including a polymerizable liquid crystal compound to form an optically anisotropic layer.

[21] An image display device comprising:

the binder layer according to [18]; or the optical laminate according to [19].

According to the present invention, it is possible to provide a binder composition in which air unevenness is suppressed and which has excellent upper layer coating properties after being formed as a layer, a compound, a binder layer, an optical laminate, an optical laminate manufacturing method, and an image display device.

DESCRIPTION OF THE PREFERRED EMBODIMENTS

Hereinafter, the present invention will be described in detail.

The following description of configuration requirements is based on typical embodiments of the present invention, but the present invention is not limited thereto.

In this specification, a numerical range expressed using "to" means a range including numerical values before and after "to" as a lower limit value and an upper limit value.

In addition, in this specification, for each component, one kind of substance corresponding to each component may be used alone, or two or more kinds thereof may be used in combination. Here, in a case where two or more types of substances are used in combination for each component, the content of the component refers to a total content of the substances used in combination unless otherwise specified.

In addition, in this specification, "(meth)acrylic" is a notation representing "acrylic" or "methacrylic".

In addition, the bonding direction of a divalent group (for example, —O—CO—) described in this specification is not particularly limited, and for example, in a case where $L^2$ in a "$L^1$-$L^2$-$L^3$" bond is —O—CO—, and a bonding position on the $L^1$ side is represented by *1 and a bonding position on the $L^3$ side is represented by *2, $L^2$ may be *1-O—CO—*2 or *1-CO—O—*2.

[Binder Composition]

A binder composition according to an embodiment of the present invention is a composition (hereinafter, also abbreviated as a "specific compound") which contains a binder and a compound having a group represented by Formula (B1) or (B2) described later (hereinafter, also abbreviated as a "specific cleavage group").

In the present invention, by blending the specific compound, air unevenness can be suppressed, and upper layer coating properties are improved after being formed as a layer.

Although the details thereof are not clear, the present inventors have presumed as follows.

First, in a case where the binder composition according to the embodiment of the present invention is applied to form a binder layer, it is considered that, since the specific compound having an aliphatic hydrocarbon group having a fluorine atom or an organosiloxane group is unevenly distributed on an air interface side of the binder, the air unevenness can be suppressed.

Thereafter, in a case where at least one selected from the group consisting of light, heat, acid, and base acts on the specific compound unevenly distributed on the air interface side, it is considered that, since a ketal structure included in the specific cleavage group is easily cleaved and the aliphatic hydrocarbon group having a fluorine atom or the organosiloxane group is eliminated, the upper layer coating properties are improved after being formed as a layer.

[Specific Compound]

The specific compound contained in the binder composition according to the embodiment of the present invention is a compound having a group represented by Formula (B1) or (B2).

In addition, from the reason that the ability to suppress air unevenness can be adjusted by controlling surface tension and the upper layer coating performance can be adjusted by controlling a cleavage speed of a cleavage part, the specific compound is preferably a compound having a group represented by Formula (B1).

(B1)

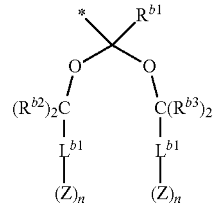

-continued (B2)

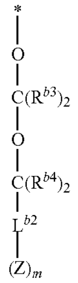

In Formulae (B1) and (B2), * represents a bonding position.

In addition, n represents an integer of 1 or more. However, a plurality of n's may be the same or different from each other.

In addition, m represents an integer of 2 or more.

In addition, $R^{b1}$ represents a hydrogen atom or a substituent.

In addition, $R^{b2}$, $R^{b3}$, and $R^{b4}$ each independently represent a hydrogen atom or a substituent. However, two $R^{b3}$ 's may be bonded to each other to form a ring, a plurality of $R^{b2}$'s may be the same or different from each other, a plurality of $R^{b3}$'s may be the same or different from each other, and a plurality of $R^{4}$'s may be the same or different from each other.

In addition, $L^{b1}$ represents an (n+1)-valent linking group. However, a plurality of $L^{b1}$'s may be the same or different from each other.

In addition, $L^{b2}$ represents an (m+1)-valent linking group.

In addition, Z represents an aliphatic hydrocarbon group having a fluorine atom or an organosiloxane group. However, the above-described aliphatic hydrocarbon group may have an oxygen atom, and a plurality of Z's may be the same or different from each other.

In Formula (B1), $R^{b1}$ represents a hydrogen atom or a substituent, and preferably represents a substituent.

The type of the substituent represented as one aspect of $R^{b1}$ is not particularly limited, and examples thereof include known substituents.

Examples of the substituent include monovalent aliphatic hydrocarbon groups which may have an oxygen atom and monovalent aromatic hydrocarbon groups which may have an oxygen atom, and specific examples thereof include an alkyl group, an alkenyl group, an alkynyl group, an aryl group, an alkoxy group, an aryloxy group, an acyl group, an acyloxy group, and a group obtained by combining these groups. The above-described substituent may be further substituted with a substituent.

Among these, as the substituent represented as one aspect of $R^{b1}$, an aliphatic hydrocarbon group having 1 to 18 carbon atoms is preferable, an alkyl group having 1 to 12 carbon atoms is more preferable, a linear alkyl group having 1 to 8 carbon atoms or a branched alkyl group having 3 to 8 carbon atoms is still more preferable, and a methyl group is particularly preferable.

In Formula (B1), $R^{b2}$ represents a hydrogen atom or a substituent. However, a plurality of $R^{b2}$'s may be the same or different from each other.

The type of the substituent represented as one aspect of $R^{b2}$ is not particularly limited, examples thereof include known substituents, specifically groups exemplified for the substituent represented as one aspect of $R^{b1}$ in Formula (B1) described above. Among these, an alkyl group having 1 to 12 carbon atoms is preferable, a linear alkyl group having 1 to 8 carbon atoms or a branched alkyl group having 3 to 8 carbon atoms is more preferable, and a methyl group is still more preferable.

In addition, $R^{b2}$ preferably represents a hydrogen atom.

In Formula (B1), $L^{b1}$ represents an (n+1)-valent linking group. However, a plurality of $L^{b1}$'s may be the same or different from each other.

From the reason that the ability to suppress air unevenness can be adjusted by controlling surface tension and the upper layer coating performance can be adjusted by controlling a cleavage speed of a cleavage part, the (n+1)-valent linking group is an (n+1)-valent hydrocarbon group having 1 to 24 carbon atoms, which may have a substituent, and is preferably a hydrocarbon group in which a part of carbon atoms constituting the hydrocarbon group may be substituted with a heteroatom, and more preferably an aliphatic hydrocarbon group which may contain an oxygen atom or a nitrogen atom and has 1 to 10 carbon atoms.

The number of carbon atoms included in the (n+1)-valent linking group is not particularly limited, but from the reason that the ability to suppress air unevenness can be adjusted by controlling surface tension and the upper layer coating performance can be adjusted by controlling a cleavage speed of a cleavage part, the number thereof is preferably 1 to 24 and more preferably 1 to 10.

As the (n+1)-valent linking group, a divalent to tetravalent linking group is preferable, a divalent or trivalent linking group is more preferable, and a divalent linking group is still more preferable.

Examples of the divalent linking group include a divalent hydrocarbon group which may have a substituent, a divalent heterocyclic group, —O—, —S—, —N(Q)-, —CO—, and a group obtained by combining these groups. Q represents a hydrogen atom or a substituent.

Examples of the divalent hydrocarbon group include divalent aliphatic hydrocarbon groups such as an alkylene group having 1 to 10 (preferably 1 to 5) carbon atoms, an alkenylene group having 1 to 10 carbon atoms, and an alkynylene group having 1 to 10 carbon atoms; and divalent aromatic hydrocarbon groups such as an arylene group.

Examples of the divalent heterocyclic group include divalent aromatic heterocyclic groups. Specific examples thereof include a pyridylene group (pyridine-diyl group), a pyridazine-diyl group, an imidazole-diyl group, thienylene (thiophene-diyl group), and a quinolylene group (quinoline-diyl group).

In addition, examples of the group obtained by combining the above-described groups include a group obtained by combining at least two selected from the group consisting of a divalent hydrocarbon group, a divalent heterocyclic group, —O—, —S—, —N(Q)—, and —CO—. Examples thereof include —O-divalent hydrocarbon group-, —(O-divalent hydrocarbon group)$_p$-O— (p represents an integer of 1 or more; and the upper limit thereof is not particularly limited, but is preferably 20 or less and more preferably 10 or less), and -divalent hydrocarbon group-O—CO—.

Among these divalent linking groups, a linear alkylene group having 1 to 10 carbon atoms, a branched alkylene group having 3 to 10 carbon atoms, a cyclic alkylene group having 3 to 10 carbon atoms, an arylene group having 6 to 12 carbon atoms, or —O— is preferable.

Examples of the substituent which may be included in the hydrocarbon group and the heterocyclic group and the substituent represented by Q include a halogen atom, an alkyl group, an alkoxy group, an aryl group, an aryloxy group, a cyano group, a carboxy group, an alkoxycarbonyl group, and a hydroxyl group.

Examples of the halogen atom include a fluorine atom, a chlorine atom, a bromine atom, and an iodine atom, and a fluorine atom or a chlorine atom is preferable.

As the alkyl group, for example, a linear alkyl group having 1 to 18 carbon atoms or a branched or cyclic alkyl group having 3 to 18 carbon atoms is preferable, a linear alkyl group having 1 to 4 carbon atoms is more preferable, and a methyl group or an ethyl group is still more preferable.

As the alkoxy group, for example, an alkoxy group having 1 to 18 carbon atoms is preferable, an alkoxy group having 1 to 4 carbon atoms is more preferable, and a methoxy group or an ethoxy group is still more preferable.

Examples of the aryl group include an aryl group having 6 to 12 carbon atoms, and examples thereof include a phenyl group, an α-methylphenyl group, and a naphthyl group.

Among these, a phenyl group is preferable.

Examples of the aryloxy group include a phenoxy group, a naphthoxy group, an imidazoyloxy group, a benzimidazoyloxy group, a pyridine-4-yloxy group, a pyrimidinyloxy group, a quinazolinyloxy group, a purinyloxy group, and a thiophen-3-yloxy group.

Examples of the alkoxycarbonyl group include a methoxycarbonyl group and an ethoxycarbonyl group.

In Formulae (B1), Z represents an aliphatic hydrocarbon group having a fluorine atom or an organosiloxane group. However, the above-described aliphatic hydrocarbon group may have an oxygen atom, and a plurality of Z's may be the same or different from each other.

Examples of the aliphatic hydrocarbon group having a fluorine atom, which is represented as one aspect of Z, include a fluorine atom-containing alkyl group, a group in which one or more of $—CH_2$-'s constituting a fluorine atom-containing alkyl group are substituted with —O—, and a fluorine atom-containing alkenyl group.

Here, the fluorine atom-containing alkyl group may be an alkyl group in which some of hydrogen atoms of $—CH_2$-'s constituting the alkyl group are substituted with fluorine atoms or a group having a substituent in which some of carbon atoms constituting an alkyl group contain fluorine atoms (for example, $—CF_3$), but a perfluoroalkyl group in which all hydrogen atoms of $—CH_2$-'s constituting an alkyl group are substituted with fluorine atoms is preferable, and $—(CF^2)_{fa}CF_3$ is more preferable. fa represents an integer of 0 to 12.

In addition, examples of the group in which one or more of $—CH_2$-'s constituting a fluorine atom-containing alkyl group are substituted with —O— include $—(CF_2)_{fb}OC(CF_3)_3$, $—CF_2CF_2O(CF_2CF_2O)_{fc}CF_2CF_2CF_3$, and $—CF(CF_3)OCF_2CF(CF_3)OCF_2CF_2CF_3$. fb represents an integer of 1 to 10, and fc represents an integer of 1 to 10.

In addition, examples of the fluorine atom-containing alkenyl group include $—C(CF_3)═C(CF(CF_3)_2)_2$.

The number of carbon atoms in the aliphatic hydrocarbon group having a fluorine atom is not particularly limited, but is preferably 1 to 30, more preferably 3 to 20, and still more preferably 3 to 10.

The number of fluorine atoms included in the aliphatic hydrocarbon group having a fluorine atom is not particularly limited, but is preferably 1 to 30, more preferably 5 to 25, and still more preferably 7 to 20.

Examples of the organosiloxane group represented as one aspect of Z include $—SiR^{30}R^{31}—OR^{32}$ and $—(SiR^{33}R^{34}—O—)_{sm}—R^{35}$. $R^{30}$ to $R^{35}$ each independently an alkyl group, an alicyclic hydrocarbon group, or an aromatic hydrocarbon group, which may have a substituent, and sm represents an integer of 1 to 100.

In Formula (B1), n represents an integer of 1 or more. Among these, from the viewpoint of synthetic suitability, an integer of 1 to 5 is preferable, an integer of 1 to 3 is more preferable, and 1 is still more preferable.

In Formula (B2), $R^{13}$ represents a hydrogen atom or a substituent. However, two $R^{b3}$'s may be bonded to each other to form a ring, and a plurality of $R^{b3}$ 's may be the same or different from each other.

The type of the substituent represented as one aspect of $R^{13}$ is not particularly limited, examples thereof include known substituents, specifically groups exemplified for the substituent represented as one aspect of $R^{b1}$ in Formula (B1) described above. Among these, an alkyl group having 1 to 12 carbon atoms is preferable, a linear alkyl group having 1 to 8 carbon atoms or a branched alkyl group having 3 to 8 carbon atoms is more preferable, and a methyl group is still more preferable.

In addition, as $R^{b3}$, it is preferable that two $R^{b3}$ 's are bonded to each other to form a ring, and it is more preferable that two $R^{b3}$'s are bonded to each other to form a cyclohexane ring.

In Formula (B2), $R^{b4}$ represents a hydrogen atom or a substituent. However, a plurality of R's may be the same or different from each other.

The type of the substituent represented as one aspect of $R^{b4}$ is not particularly limited, examples thereof include known substituents, specifically groups exemplified for the substituent represented as one aspect of $R^{b1}$ in Formula (B1) described above. Among these, an alkyl group having 1 to 12 carbon atoms is preferable, a linear alkyl group having 1 to 8 carbon atoms or a branched alkyl group having 3 to 8 carbon atoms is more preferable, and a methyl group is still more preferable.

In addition, $R^{b4}$ preferably represents a hydrogen atom.

In Formula (B2), $L^{b2}$ represents an (m+1)-valent linking group.

From the reason that the ability to suppress air unevenness can be adjusted by controlling surface tension and the upper layer coating performance can be adjusted by controlling a cleavage speed of a cleavage part, the (m+1)-valent linking group is an (m+1)-valent hydrocarbon group having 1 to 24 carbon atoms, which may have a substituent, and is preferably a hydrocarbon group in which a part of carbon atoms constituting the hydrocarbon group may be substituted with a heteroatom, and more preferably an aliphatic hydrocarbon group which may contain an oxygen atom or a nitrogen atom and has 1 to 10 carbon atoms.

The number of carbon atoms included in the (m+1)-valent linking group is not particularly limited, but from the reason that the ability to suppress air unevenness can be adjusted by controlling surface tension and the upper layer coating performance can be adjusted by controlling a cleavage speed of a cleavage part, the number thereof is preferably 1 to 24 and more preferably 1 to 10.

As the (m+1)-valent linking group, a trivalent or tetravalent linking group is preferable, and a tetravalent linking group is more preferable.

As the tetravalent linking group, a linking group represented by Formula (3) is preferable.

$$—C(R^{b5})_{3-b}(-L^{b3}-*)_b \quad (3)$$

In Formula (3), $R^{b5}$ represents an alkyl group, $L^{b3}$ represents a divalent linking group, * represents a bonding position with Z, and b represents an integer of 1 to 3.

Here, examples of the alkyl group represented by $R^b5$ include an alkyl group having 1 to 6 carbon atoms, and more specific examples thereof include a methyl group, an ethyl group, and an n-propyl group.

In addition, examples of the divalent linking group represented by $L^{b3}$ include the same group as those exemplified for the divalent linking group represented as one aspect of $L^{b1}$ in Formula (B1) described above.

In Formula (B2), Z represents an aliphatic hydrocarbon group having a fluorine atom or an organosiloxane group, which is the same as Z in Formula (B1) described above.

In Formula (B2), m represents an integer of 2 or more. Among these, from the viewpoint of synthetic suitability, an integer of 2 to 4 is preferable, and an integer of 2 or 3 is more preferable.

From the reason that alignment controllability can be imparted to a binder layer according to an embodiment of the present invention, which will be described later, it is preferable that the specific compound further has a photo-aligned group.

From the reason that thermal stability or chemical stability of a monomer having the photo-aligned group is good, the photo-aligned group is preferably a group which undergoes at least one of dimerization or isomerization by action of light.

Suitable specific examples of the group which is dimerized by the action of light include groups having a skeleton of at least one derivative selected from the group consisting of a cinnamic acid derivative, a coumarin derivative, a chalcone derivative, a maleimide derivative, and a benzophenone derivative.

On the other hand, suitable specific examples of the group which is isomerized by the action of light include groups having a skeleton of at least one compound selected from the group consisting of an azobenzene compound, a stilbene compound, a spiropyran compound, a cinnamic acid compound, and a hydrazono-β-ketoester compound.

Among such photo-aligned groups, a group having a skeleton of at least one derivative or compound selected from the group consisting of a cinnamic acid derivative, a coumarin derivative, a chalcone derivative, a maleimide derivative, an azobenzene compound, a stilbene compound, and a spiropyran compound is preferable, and among these, a group having a skeleton of a cinnamic acid derivative or an azobenzene compound is more preferable, and a group having a skeleton of a cinnamic acid derivative (hereinafter, also abbreviated as a "cinnamoyl group") is still more preferable.

In the present invention, the specific compound may be a monomer having a polymerizable group, but is preferably a polymer having a repeating unit.

<Repeating Unit B (specific cleavage group)>

From the reason that the ability to suppress air unevenness can be adjusted by controlling surface tension and the upper layer coating performance can be adjusted by controlling a cleavage speed of a cleavage part, the specific compound is preferably a polymer having a repeating unit B including the group represented by Formula (B1) or (B2) described above.

From the reason that production suitability is excellent, the above-described repeating unit B is preferably a repeating unit represented by Formula (1) or (2).

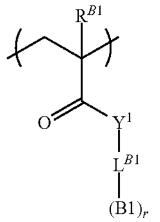

(1)

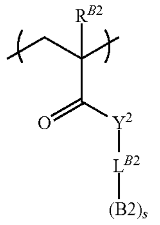

(2)

In Formulae (1) and (2), r and s each independently represent an integer of 1 or more.

In addition, $R^{B1}$ and $R^{B2}$ each independently represent a hydrogen atom or a substituent.

In addition, $Y^1$ and $Y^2$ each independently represent —O— or —$NR^Z$—. However, $R^Z$ represents a hydrogen atom or a substituent.

In addition, $L^{B1}$ represents an (r+1)-valent linking group.

In addition, $L^{B2}$ represents an (s+1)-valent linking group.

In addition, B1 represents the above-described group represented by Formula (B1). However, in a case where * in Formula (B1) represents a bonding position with $L^{B1}$ and r represents an integer of 2 or more, a plurality of B1's may be the same or different from each other.

In addition, B2 represents the above-described group represented by Formula (B2). However, in a case where * in Formula (B2) represents a bonding position with $L^{B2}$ and s represents an integer of 2 or more, a plurality of B2's may be the same or different from each other.

In Formula (1), $R^{B1}$ represents a hydrogen atom or a substituent.

The type of the substituent represented as one aspect of $R^{B1}$ is not particularly limited, examples thereof include known substituents, specifically groups exemplified for the substituent represented as one aspect of $R^{b1}$ in Formula (B1) described above. Among these, an alkyl group having 1 to 12 carbon atoms is preferable, a linear alkyl group having 1 to 8 carbon atoms or a branched alkyl group having 3 to 8 carbon atoms is more preferable, and a methyl group is still more preferable.

In addition, $R^{B1}$ preferably represents a hydrogen atom or a methyl group.

In Formula (1), $Y^1$'s each independently represent —O— or —$NR^Z$—. However, $R^Z$ represents a hydrogen atom or a substituent.

Here, the type of the substituent represented as one aspect of $R^Z$ is not particularly limited, examples thereof include known substituents, specifically groups exemplified for the substituent represented as one aspect of $R^{b1}$ in Formula (B1) described above. Among these, an alkyl group having 1 to 12 carbon atoms is preferable, a linear alkyl group having 1 to 8 carbon atoms or a branched alkyl group having 3 to 8 carbon atoms is more preferable, and a methyl group is still more preferable.

In addition, $Y^1$ preferably represents —O— or —NH—, and more preferably represents —O—.

In Formula (1), $L^{B1}$ represents an (r+1)-valent linking group.

From the reason that the ability to suppress air unevenness can be adjusted by controlling surface tension and the upper layer coating performance can be adjusted by controlling a cleavage speed of a cleavage part, the (r+1)-valent linking group is an (r+1)-valent hydrocarbon group having 1 to 24 carbon atoms, which may have a substituent, and is preferably a hydrocarbon group in which a part of carbon atoms constituting the hydrocarbon group may be substituted with a heteroatom, and more preferably an aliphatic hydrocarbon group which may contain an oxygen atom or a nitrogen atom and has 1 to 10 carbon atoms.

The number of carbon atoms included in the (r+1)-valent linking group is not particularly limited, but from the reason that the ability to suppress air unevenness can be adjusted by controlling surface tension and the upper layer coating performance can be adjusted by controlling a cleavage speed of a cleavage part, the number thereof is preferably 1 to 24 and more preferably 1 to 10.

As the (r+1)-valent linking group, a divalent or trivalent linking group is preferable, and a divalent linking group is more preferable.

Examples of the divalent linking group include the same group as those exemplified for the divalent linking group represented as one aspect of $L^{b1}$ in Formula (B1) described above.

In Formula (1), r represents an integer of 1 or more. Among these, from the viewpoint of synthetic suitability, an integer of 1 to 3 is preferable, an integer of 1 or 2 is more preferable, and 1 is still more preferable.

In Formula (2), $R^{B2}$ represents a hydrogen atom or a substituent.

The type of the substituent represented as one aspect of $R^{B2}$ is not particularly limited, examples thereof include known substituents, specifically groups exemplified for the substituent represented as one aspect of $R^{b1}$ in Formula (B1) described above. Among these, an alkyl group having 1 to 12 carbon atoms is preferable, a linear alkyl group having 1 to 8 carbon atoms or a branched alkyl group having 3 to 8 carbon atoms is more preferable, and a methyl group is still more preferable.

In addition, $R^{B2}$ preferably represents a hydrogen atom or a methyl group.

In Formula (2), $Y^2$ represents —O— or —$NR^Z$—. However, $R^Z$ represents a hydrogen atom or a substituent.

Here, the type of the substituent represented as one aspect of $R^Z$ is not particularly limited, examples thereof include known substituents, specifically groups exemplified for the substituent represented as one aspect of $R^{b1}$ in Formula (B1) described above. Among these, an alkyl group having 1 to 12 carbon atoms is preferable, a linear alkyl group having 1 to 8 carbon atoms or a branched alkyl group having 3 to 8 carbon atoms is more preferable, and a methyl group is still more preferable.

In addition, $Y^2$ preferably represents —O— or —NH—, and more preferably represents —O—.

In Formula (2), $L^{B2}$ represents an (s+1)-valent linking group.

From the reason that the ability to suppress air unevenness can be adjusted by controlling surface tension and the upper layer coating performance can be adjusted by controlling a cleavage speed of a cleavage part, the (s+1)-valent linking group is an (s+1)-valent hydrocarbon group having 1 to 24 carbon atoms, which may have a substituent, and is preferably a hydrocarbon group in which a part of carbon atoms constituting the hydrocarbon group may be substituted with a heteroatom, and more preferably an aliphatic hydrocarbon group which may contain an oxygen atom or a nitrogen atom and has 1 to 10 carbon atoms.

The number of carbon atoms included in the (s+1)-valent linking group is not particularly limited, but from the reason that the ability to suppress air unevenness can be adjusted by controlling surface tension and the upper layer coating performance can be adjusted by controlling a cleavage speed of a cleavage part, the number thereof is preferably 1 to 24 and more preferably 1 to 10.

The (s+1)-valent linking group is preferably a divalent linking group.

Examples of the divalent linking group include the same group as those exemplified for the divalent linking group represented as one aspect of $L^{b1}$ in Formula (B1) described above.

In Formula (2), s represents an integer of 1 or more. Among these, from the viewpoint of synthetic suitability, an integer of 1 or 2 is preferable, and 1 is more preferable.

Specific examples of the above-described repeating unit B including the group represented by Formula (B1) include repeating units represented by Formulae B-1 to B-22, and specific examples of the above-described repeating unit B including the group represented by Formula (B2) include repeating units represented by Formulae B-23 and B-24.

B-1

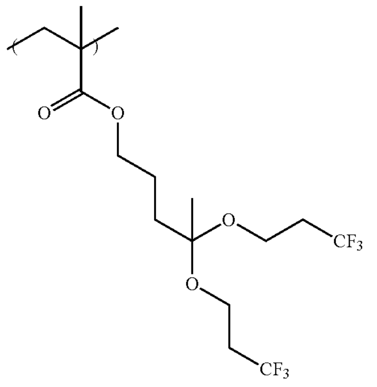

B-2

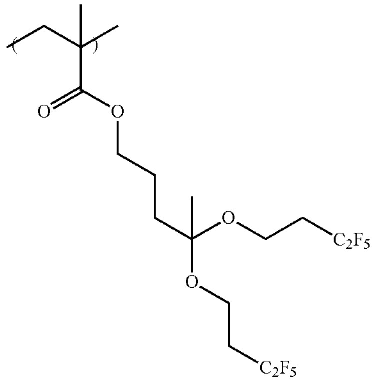

-continued
B-3
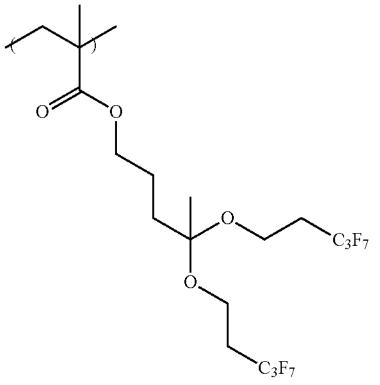
B-4
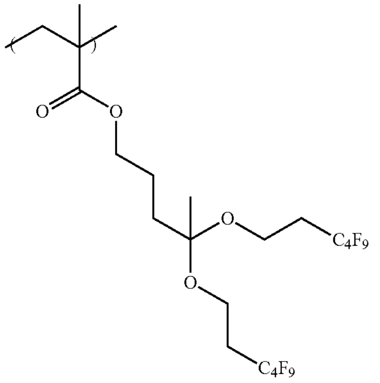
B-5
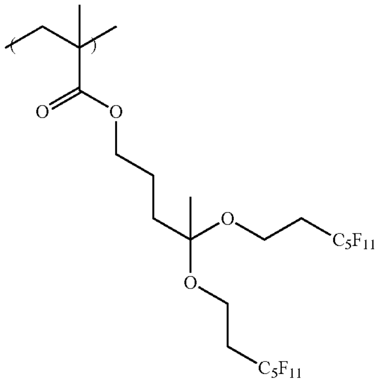
B-6
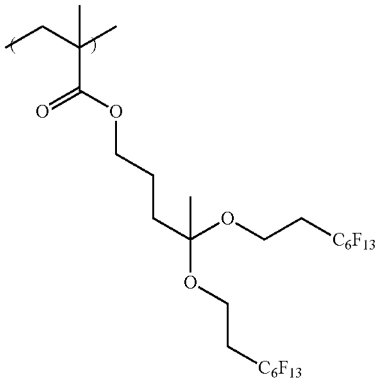
-continued
B-7
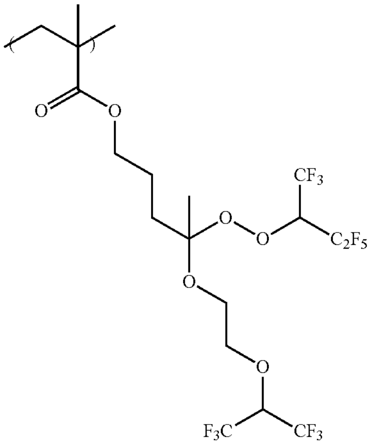
B-8
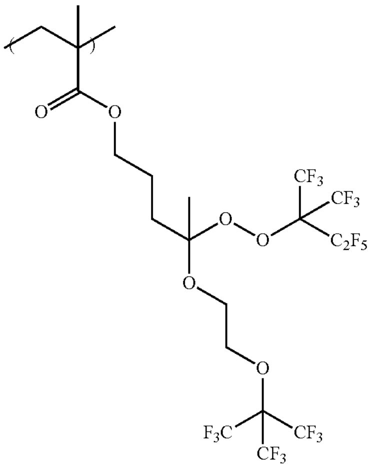
B-9
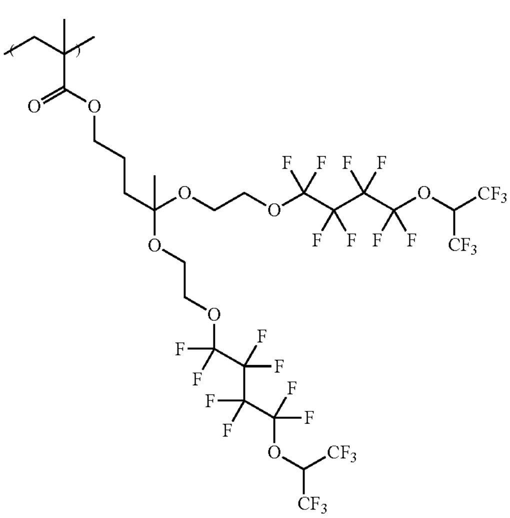

-continued
B-10
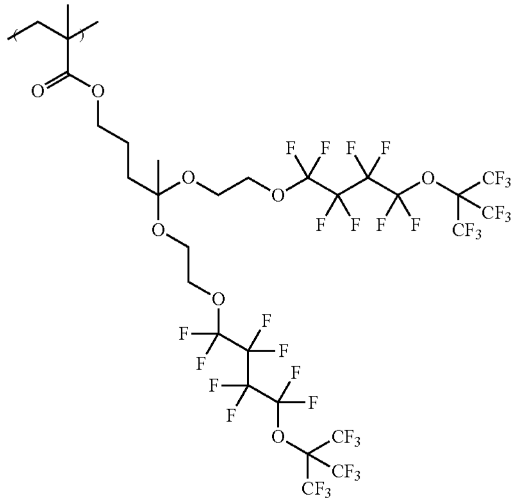
B-11
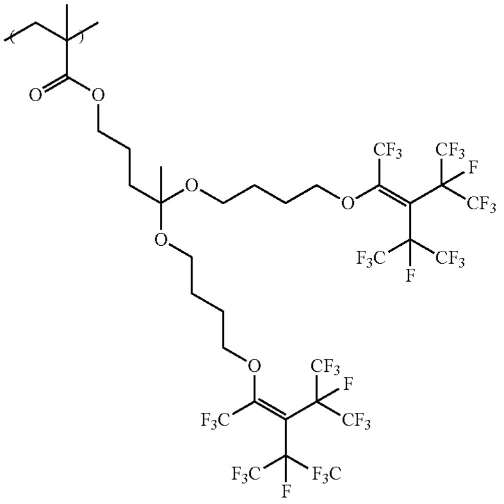
B-12
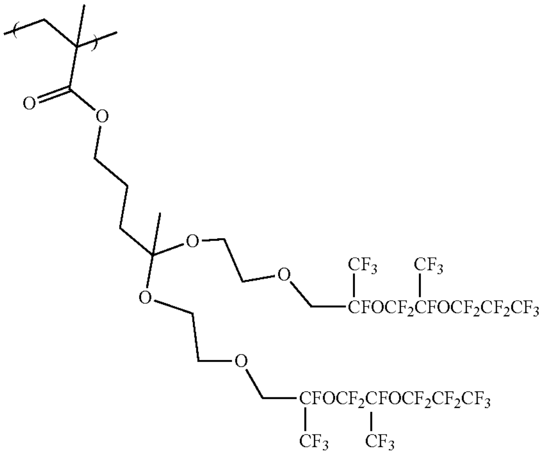
-continued
B-13
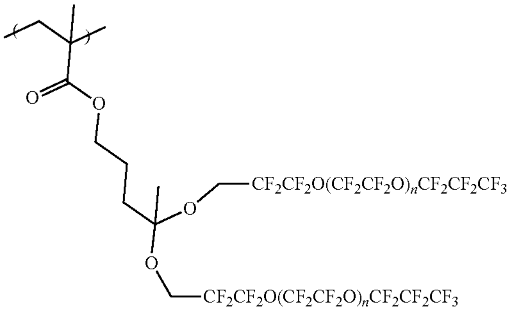
B-14
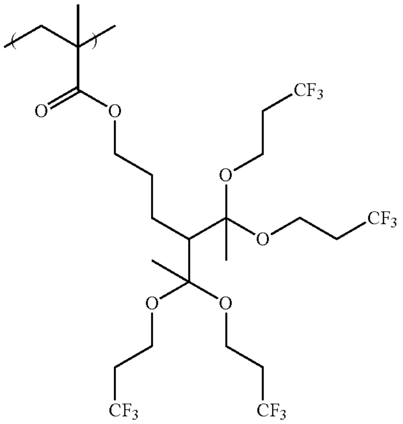
B-15
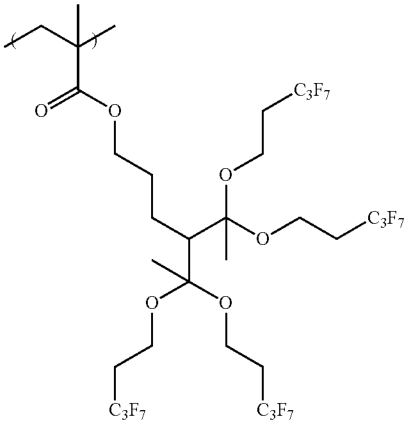
B-16
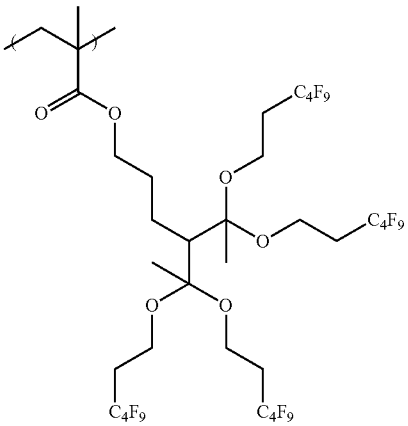

-continued
B-17
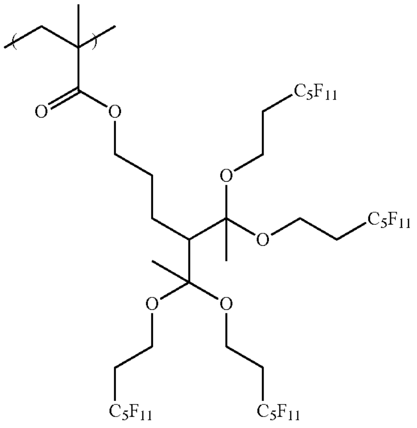
B-18
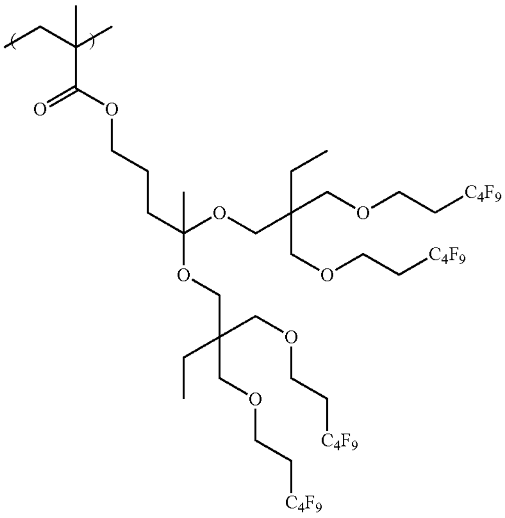
B-19
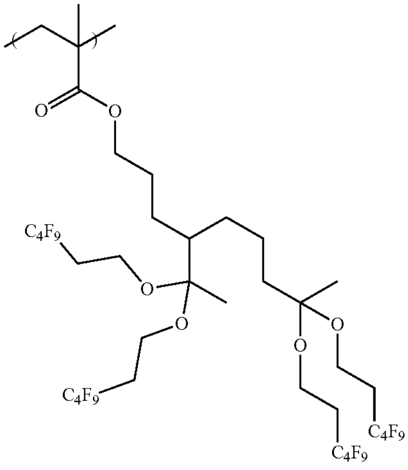
-continued
B-20
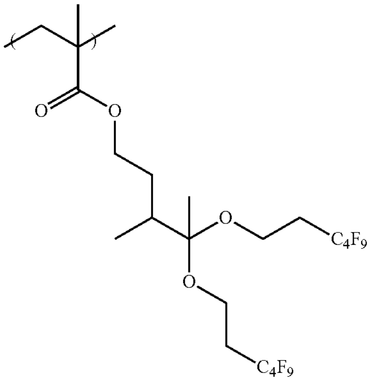
B-21
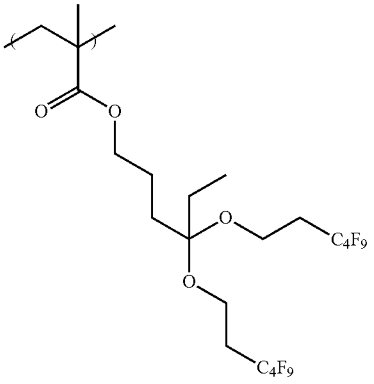
B-22
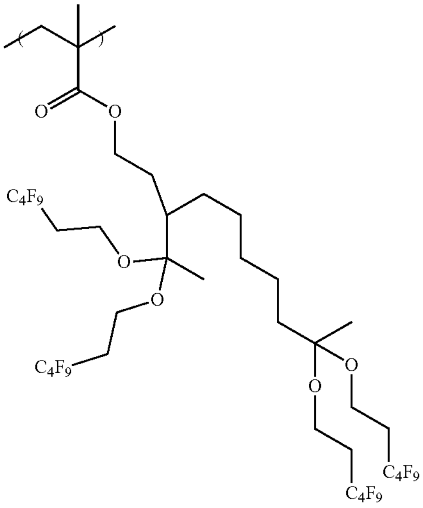

-continued

B-23

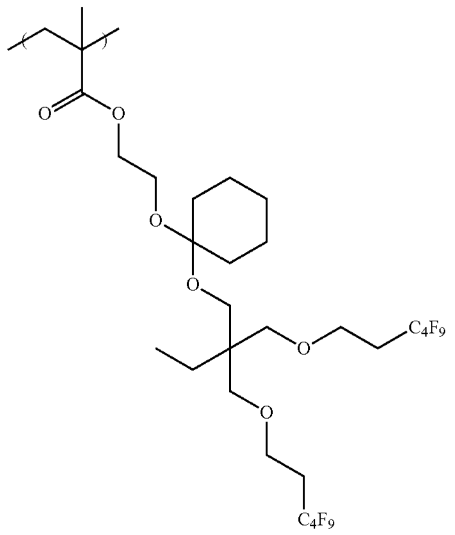

B-24

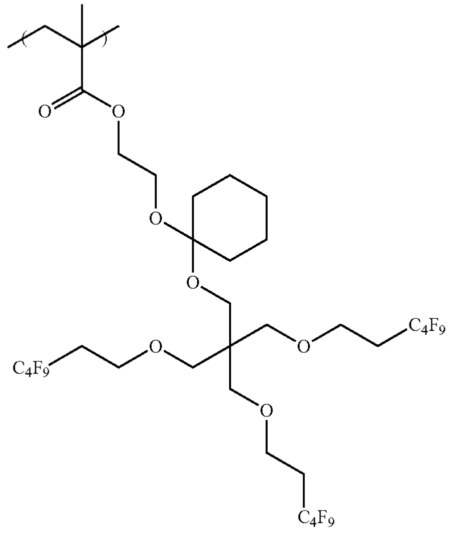

A content of the repeating unit B in the specific compound is not particularly limited, but from the reason that the effect of suppressing air unevenness is improved, the content thereof is preferably 15 to 75 mass % and more preferably 20 to 50 mass % with respect to all repeating units of the specific compound (polymer). 25 to 45 mass % is still more preferable.

<Repeating Unit a (Photo-Aligned Group)>

From the reason that, in a case of forming an optically anisotropic layer using a liquid crystal compound as the upper layer, the liquid crystal compound can be aligned, the specific compound is preferably a copolymer having a repeating unit A including a photo-aligned group and the above-described repeating unit B.

Here, examples of the photo-aligned group include the same as those described above as the photo-aligned group which may be included in the specific compound.

A structure of a main chain of the above-described repeating unit A is not particularly limited, and examples thereof include known structures. For example, a skeleton selected from the group consisting of a (meth)acrylic skeleton, a styrene-based skeleton, a siloxane-based skeleton, a cycloolefin-based skeleton, a methylpentene-based skeleton, an amide-based skeleton, and an aromatic ester-based skeleton is preferable.

Among these, a skeleton selected from the group consisting of a (meth)acrylic skeleton, a siloxane-based skeleton, and a cycloolefin-based skeleton is more preferable, and a (meth)acrylic skeleton is still more preferable.

From the reason that aligning properties of an optically anisotropic layer formed of a liquid crystal compound as the upper layer (hereinafter, abbreviated as "liquid crystal alignment properties") is good, the repeating unit A including a photo-aligned group is preferably a repeating unit represented by Formula (A).

(A)

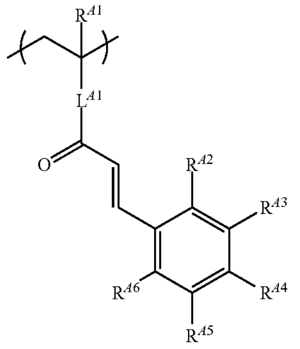

In Formula (A), $R^{A1}$ represents a hydrogen atom or a substituent.

In addition, $L^{A1}$ represents a single bond or a divalent linking group.

$R^{A2}$, $R^{A3}$, $R^{A4}$, $R^{A5}$, and $R^{A6}$ each independently represent a hydrogen atom or a substituent. Two adjacent groups of $R^{A2}$, $R^{A3}$, $R^{A4}$, $R^{A5}$, and $R^{A6}$ may be bonded to each other to form a ring.

In Formula (A), $R^{A1}$ represents a hydrogen atom or a substituent.

The type of the substituent represented as one aspect of $R^{A}1$ is not particularly limited, examples thereof include known substituents, specifically groups exemplified for the substituent represented as one aspect of $R^{b1}$ in Formula (B1) described above. Among these, an alkyl group having 1 to 12 carbon atoms is preferable, a linear alkyl group having 1 to 8 carbon atoms or a branched alkyl group having 3 to 8 carbon atoms is more preferable, and a methyl group is still more preferable.

In Formula (A), $L^{A1}$ represents a single bond or a divalent linking group.

Examples of the divalent linking group represented as one aspect of $L^{A1}$ include the same group as those exemplified for the divalent linking group represented as one aspect of $L^{b1}$ in Formula (B1) described above.

Among these, as the divalent linking group represented as one aspect of $L^{A1}$, from the reason that the liquid crystal alignment properties are further improved, a linear alkylene group having 1 to 10 carbon atoms, which may have a substituent, a branched or cyclic alkylene group having 3 to 10 carbon atoms, an arylene group having 6 to 12 carbon atoms, which may have a substituent, or a divalent linking group formed by combining at least two or more groups selected from the group consisting of —O—, —CO—, and —N(Q)- is preferable. Q represents a hydrogen atom or a substituent.

The definition of each group is the same as the definition of each group described in the divalent linking group represented by $L^{b1}$ above.

In Formula (A), $R^{A2}$, $R^{A3}$, $R^{A4}$, $R^{A5}$, and $R^{A6}$ each independently represent a hydrogen atom or a substituent. The type of the above-described substituent is not particularly limited, examples thereof include known substituents, specifically groups exemplified for the substituent represented as one aspect of $R^{b1}$ in Formula (B1) described above.

Two adjacent groups of $R^{A2}$, $R^{A3}$, $R^{A4}$, $R^{A5}$, and $R^{A6}$ may be bonded to each other to form a ring.

From the reason that the liquid crystal alignment properties are further improved, the substituents represented by $R^{A2}$, $R^{A3}$, $R^{A4}$, $R^{A5}$, and $R^{A6}$ each independently preferably represent a halogen atom, a linear alkyl group having 1 to 20 carbon atoms, a branched or cyclic alkyl group having 3 to 20 carbon atoms, a linear halogenated alkyl group having 1 to 20 carbon atoms, an alkoxy group having 1 to 20 carbon atoms, an aryl group having 6 to 20 carbon atoms, an aryloxy group having 6 to 20 carbon atoms, a hydroxy group, a cyano group, an amino group, or a group represented by Formula (4). The above-described substituent may include a linking group represented by $-(CH_2)_{na}-$ or $-O-(CH_2)_{na}-$. na represents an integer of 1 to 10.

(4)

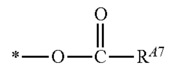

Here, in Formula (4), * represents a bonding position.

$R^{A7}$ represents an alkyl group having 1 to 20 carbon atoms.

Examples of the halogen atom include a fluorine atom, a chlorine atom, a bromine atom, and an iodine atom, and a fluorine atom or a chlorine atom is preferable.

As the linear alkyl group, an alkyl group having 1 to 6 carbon atoms is preferable, and examples thereof include a methyl group, an ethyl group, and an n-propyl group.

As the branched alkyl group, an alkyl group having 3 to 6 carbon atoms is preferable, and examples thereof include an isopropyl group and a tert-butyl group.

As the cyclic alkyl group, an alkyl group having 3 to 6 carbon atoms is preferable, and examples thereof include a cyclopropyl group, a cyclopentyl group, and a cyclohexyl group.

As the linear halogenated alkyl group having 1 to 20 carbon atoms, a fluoroalkyl group having 1 to 4 carbon atoms is preferable, and examples thereof include a trifluoromethyl group, a perfluoroethyl group, a perfluoropropyl group, a perfluorobutyl group, a 2,2,3,3,4,4,5,5-octafluoropentyl group, and a 2,2,3,3,4,4,5,5,6,6,7,7-dodecafluoroheptyl group.

Among these, from the viewpoint of improving both liquid crystal alignment properties and upper layer coating properties, a 2,2,3,3,4,4,5,5-octafluoropentyl group or a 2,2,3,3,4,4,5,5,6,6,7,7-dodecafluoroheptyl group is preferable.

As the alkoxy group having 1 to 20 carbon atoms, an alkoxy group having 1 to 18 carbon atoms is preferable, an alkoxy group having 3 to 18 carbon atoms is more preferable, and an alkoxy group having 6 to 18 carbon atoms is still more preferable. Examples thereof include a methoxy group, an ethoxy group, an n-butoxy group, a methoxyethoxy group, an n-hexyloxy group, an n-octyloxy group, an n-decyloxy group, an n-dodecyloxy group, and an n-tetradecyloxy group.

As the aryl group having 6 to 20 carbon atoms, an aryl group having 6 to 12 carbon atoms is preferable, and examples thereof include a phenyl group, an α-methylphenyl group, and a naphthyl group.

As the aryloxy group having 6 to 20 carbon atoms, an aryloxy group having 6 to 12 carbon atoms is preferable, and examples thereof include a phenyloxy group and a 2-naphthyloxy group.

Examples of the amino group include a primary amino group ($-NH_2$); secondary amino groups such as a methylamino group; and tertiary amino groups such as a dimethylamino group, a diethylamino group, a dibenzylamino group, and a group in which a nitrogen atom in a nitrogen-containing heterocyclic compound (for example, pyrrolidine, piperidine, piperazine, and the like) is used as a bonding site.

From the viewpoint that the photo-aligned group easily interacts with the liquid crystal compound and the liquid crystal alignment properties are further improved, it is preferable that, among $R^{A2}$, $R^{A3}$, $R^{A4}$, $R^{A5}$, and $R^{A6}$ in Formula (A), at least $R^{A4}$ represents the above-described substituent (preferably, the alkoxy group or halogenated alkyl group having 1 to 20 carbon atoms); and from the reason that linearity of the obtained specific compound is improved, the photo-aligned group easily interacts with the liquid crystal compound, and the liquid crystal alignment properties are further improved, it is more preferable that all of $R^{A2}$, $R^{A3}$, $R^{A5}$, and $R^{A6}$ represent a hydrogen atom.

Specific examples of the repeating unit A including a photo-aligned group include repeating units represented by Formulae A-1 to A-30.

A-1

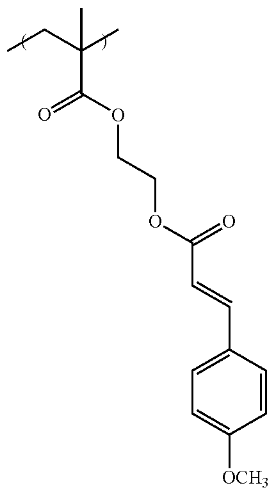

-continued
A-2
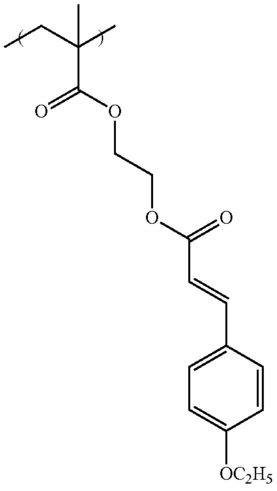
A-3
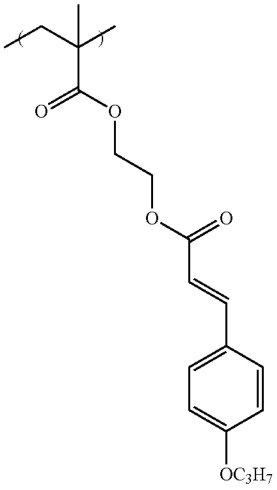
A-4
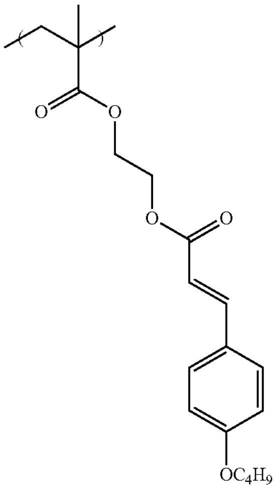
-continued
A-5
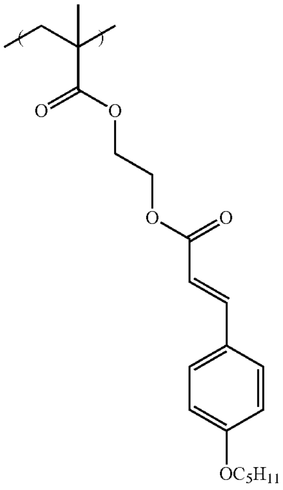
A-6
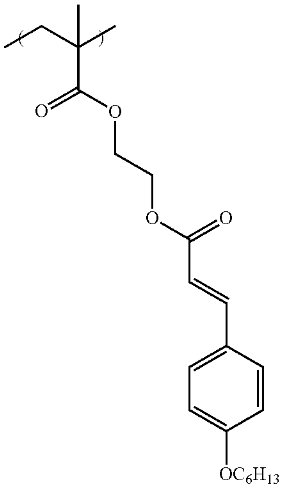
A-7
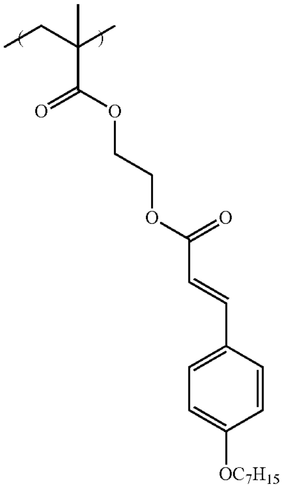

-continued
A-8
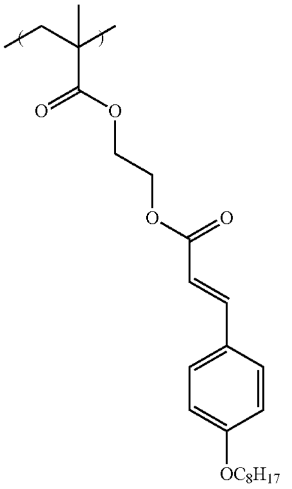
A-9
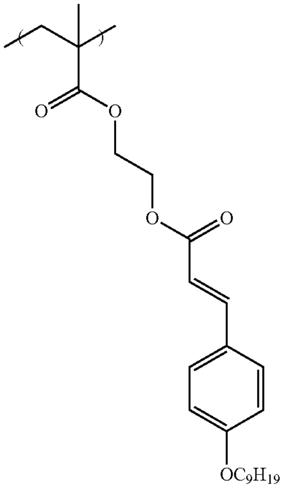
A-10
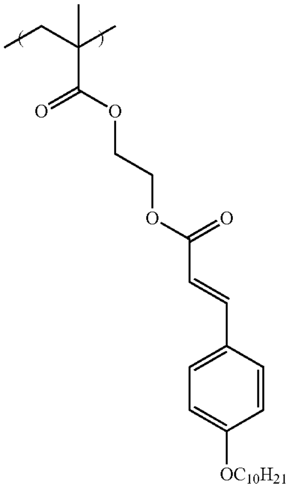
-continued
A-11
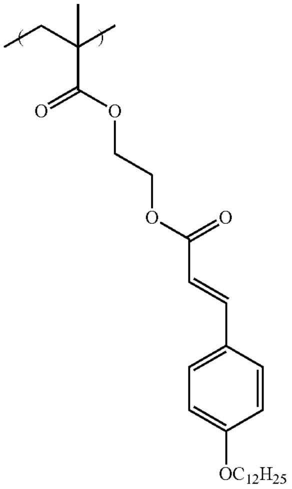
A-12
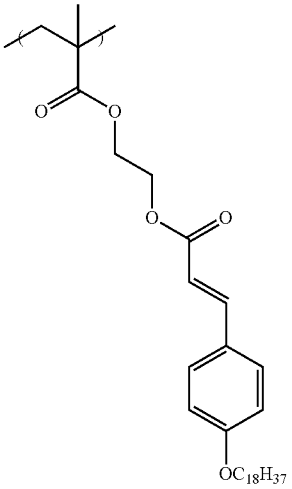
A-13
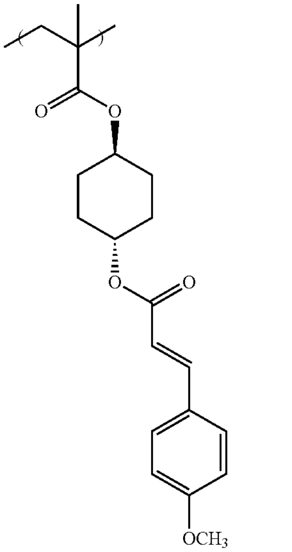

-continued
A-14
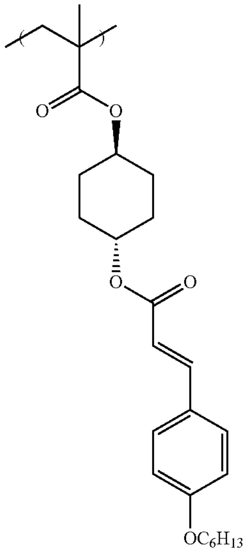
A-15
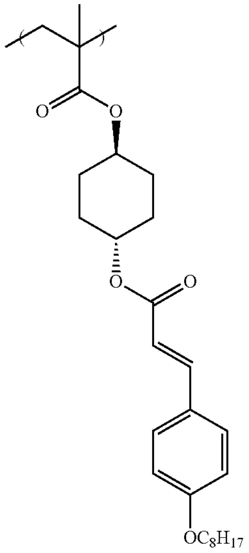
A-16
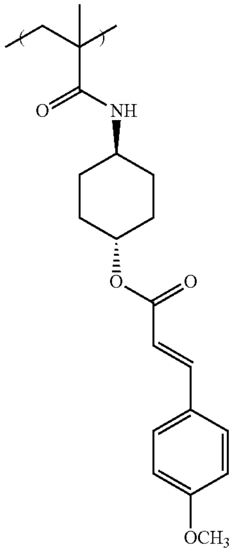
-continued
A-17
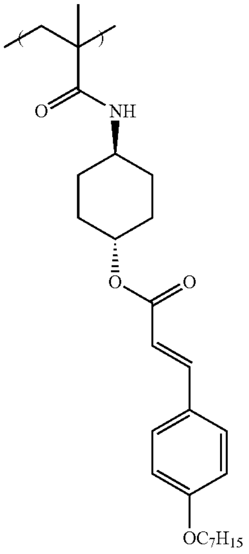
A-18
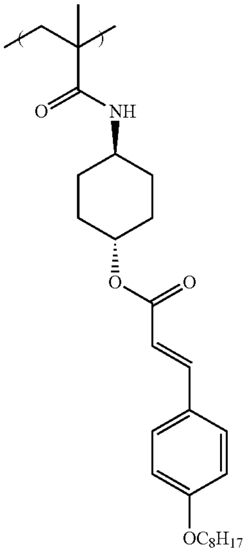
A-19
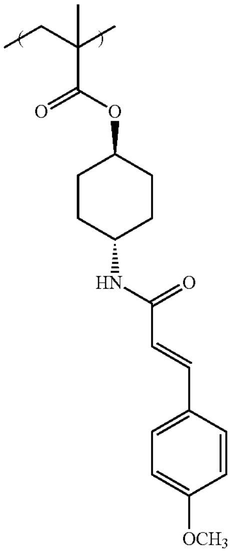

-continued
A-20
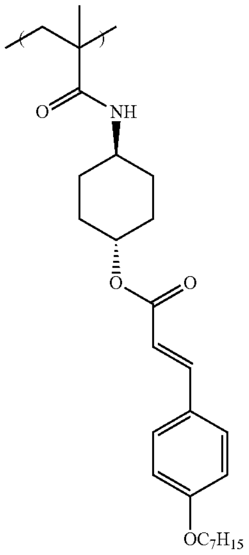
A-21
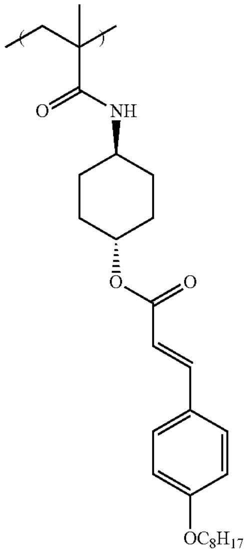
A-22
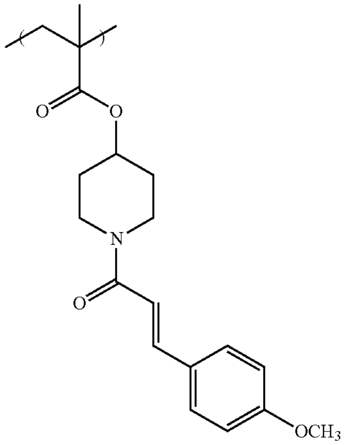
-continued
A-23
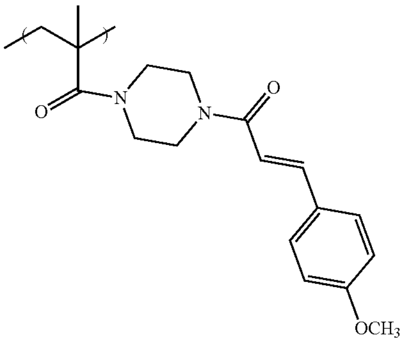
A-24
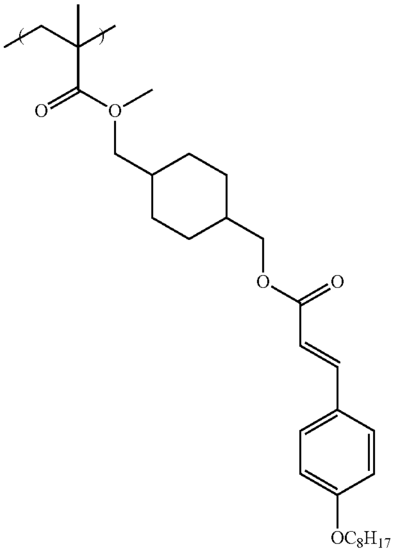
A-25
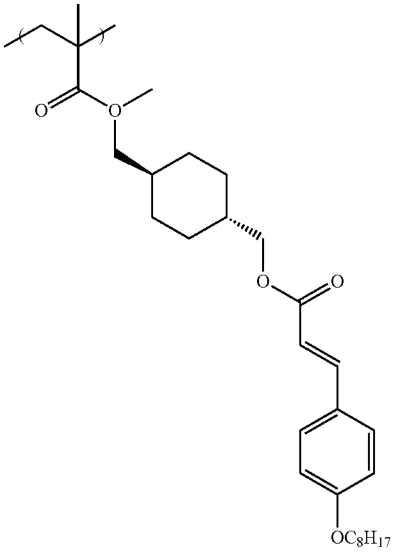

-continued

A-26

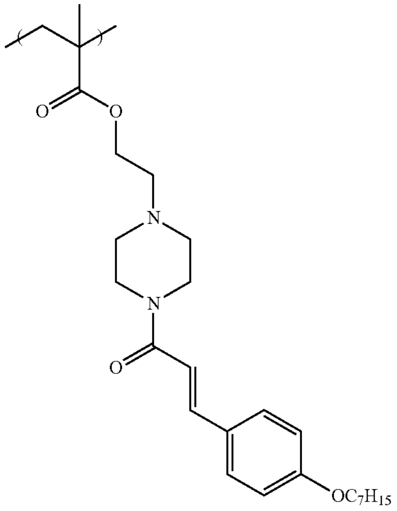

A-27

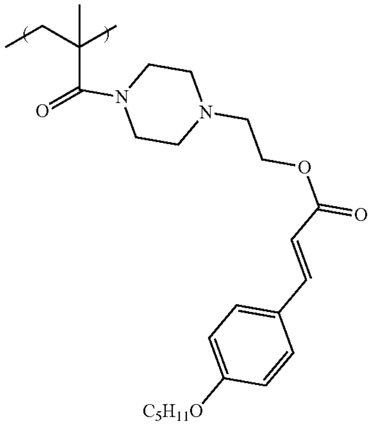

A-28

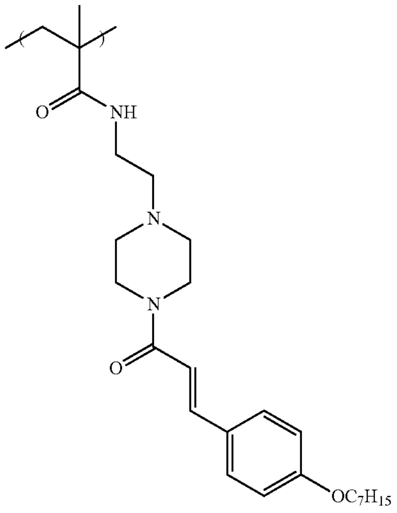

-continued

A-29

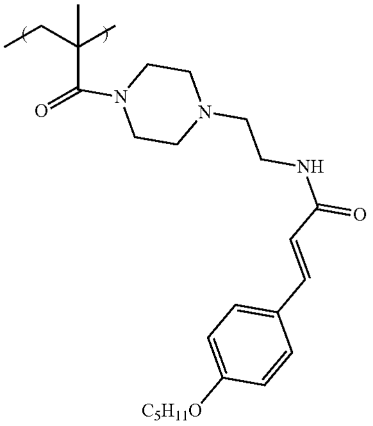

A-30

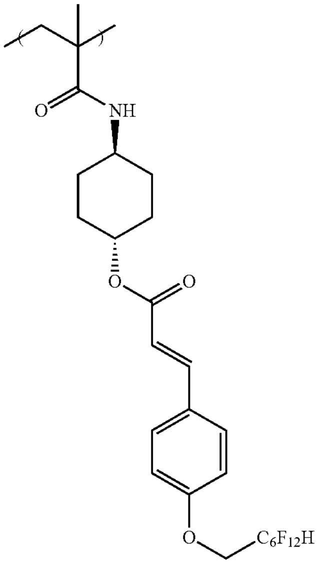

A content of the repeating unit A in the specific compound is not particularly limited, but from the reason that the liquid crystal alignment properties are further improved, the content thereof is preferably 5 to 50 mass % and more preferably 10 to 40 mass % with respect to all repeating units of the specific compound (polymer).

<Repeating Unit C (crosslinkable group)>

From the reason that the liquid crystal alignment properties are further improved by the effect of suppressing alignment relaxation due to improvement of solvent resistance, the specific compound is preferably a copolymer having a repeating unit C including a crosslinkable group, the above-described repeating unit B, and the above-described repeating unit A.

The type of the crosslinkable group is not particularly limited, and examples thereof include known crosslinkable groups. Among these, from the viewpoint of excellent adhesiveness to the upper layer disposed on a binder layer, a cationically polymerizable group or a radically polymerizable group is preferable.

Examples of the cationically polymerizable group include an epoxy group, an epoxycyclohexyl group, and an oxetanyl group.

Examples of the radically polymerizable group include an acryloyl group, a methacryloyl group, a vinyl group, a styryl group, and an allyl group.

A structure of a main chain of the repeating unit C including a crosslinkable group is not particularly limited, and examples thereof include known structures. For example, a skeleton selected from the group consisting of a (meth)acrylic skeleton, a styrene-based skeleton, a siloxane-based skeleton, a cycloolefin-based skeleton, a methylpentene-based skeleton, an amide-based skeleton, and an aromatic ester-based skeleton is preferable.

Among these, a skeleton selected from the group consisting of a (meth)acrylic skeleton, a siloxane-based skeleton, and a cycloolefin-based skeleton is more preferable, and a (meth)acrylic skeleton is still more preferable.

From the reason that the liquid crystal alignment properties are further improved, the repeating unit C including a crosslinkable group is preferably a repeating unit represented by Formula (C).

(C)

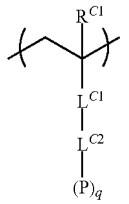

In Formula (C), $R^{C1}$ represents a hydrogen atom or a substituent.

In addition, $L^{C1}$ represents a single bond or a divalent linking group.

In addition, $L^{C2}$ represents a (q+1)-valent linking group.

In addition, P represents a crosslinkable group.

In addition, q represents an integer of 1 or more, in which in a case of being an integer of 2 or more, a plurality of P's may be the same or different from each other.

In Formula (C), $R^{C1}$ represents a hydrogen atom or a substituent.

The type of the substituent represented as one aspect of $R^{C1}$ is not particularly limited, examples thereof include known substituents, specifically groups exemplified for the substituent represented as one aspect of $R^{b1}$ in Formula (B1) described above. Among these, an alkyl group having 1 to 12 carbon atoms is preferable, a linear alkyl group having 1 to 8 carbon atoms or a branched alkyl group having 3 to 8 carbon atoms is more preferable, and a methyl group is still more preferable.

In addition, $R^{C1}$ preferably represents a hydrogen atom or a methyl group.

In Formula (C), $L^{C1}$ represents a single bond or a divalent linking group.

Examples of the divalent linking group represented as one aspect of $L^{C1}$ include the same group as those exemplified for the divalent linking group represented as one aspect of $L^{b1}$ in Formula (B1) described above.

Among these, as the divalent linking group represented as one aspect of $L^{C1}$, from the reason that the liquid crystal alignment properties are further improved, a linear alkylene group having 1 to 10 carbon atoms, which may have a substituent, a branched or cyclic alkylene group having 3 to 10 carbon atoms, an arylene group having 6 to 12 carbon atoms, which may have a substituent, or a divalent linking group formed by combining at least two or more groups selected from the group consisting of —O—, —CO—, and —N(Q)- is preferable. Q represents a hydrogen atom or a substituent.

The definition of each group is the same as the definition of each group described in the divalent linking group represented by $L^{b1}$ above.

$L^{C2}$ represents a (q+1)-valent linking group.

Here, from the reason that the liquid crystal alignment properties are further improved, the (q+1)-valent linking group is a (q+1)-valent hydrocarbon group having 1 to 24 carbon atoms, which may have a substituent, and is preferably a hydrocarbon group in which a part of carbon atoms constituting the hydrocarbon group may be substituted with a heteroatom, and more preferably an aliphatic hydrocarbon group which may contain an oxygen atom or a nitrogen atom and has 1 to 10 carbon atoms.

The number of carbon atoms included in the (q+1)-valent linking group is not particularly limited, but from the reason that the liquid crystal alignment properties are further improved, the number thereof is preferably 1 to 24 and more preferably 1 to 10.

The (q+1)-valent linking group is preferably a divalent linking group. Examples of the divalent linking group include the same group as those exemplified for the divalent linking group represented as one aspect of $L^{b1}$ in Formula (B1) described above.

P represents a crosslinkable group. The definition of the crosslinkable group is as described above.

q represents an integer of 1 or more. In the above range, from the reason that the liquid crystal alignment properties are further improved, an integer of 1 to 5 is preferable, an integer of 1 to 3 is more preferable, and 1 is still more preferable.

Specific examples of the repeating unit C including a crosslinkable group include repeating units represented by Formulae C-1 to C-8.

C-1

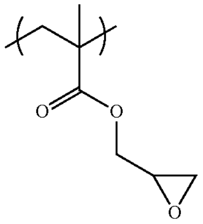

C-2

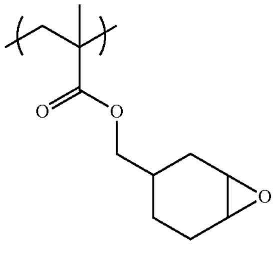

C-3

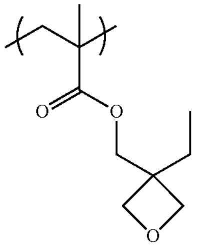

-continued

C-4

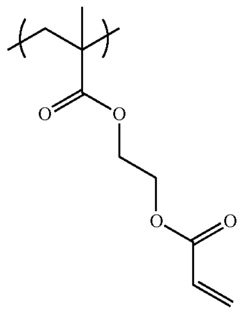

C-5

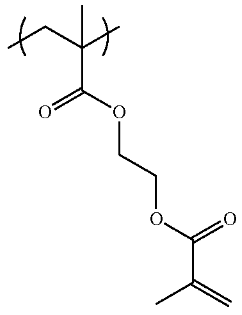

C-6

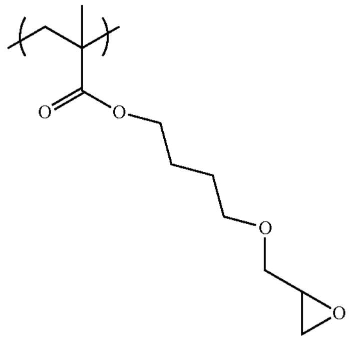

C-7

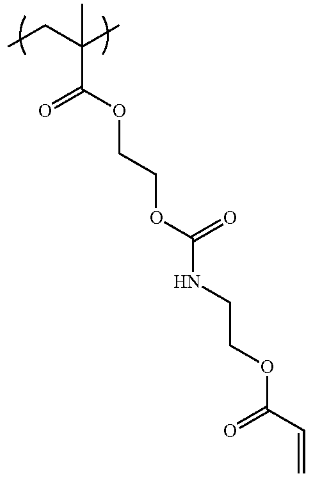

-continued

C-8

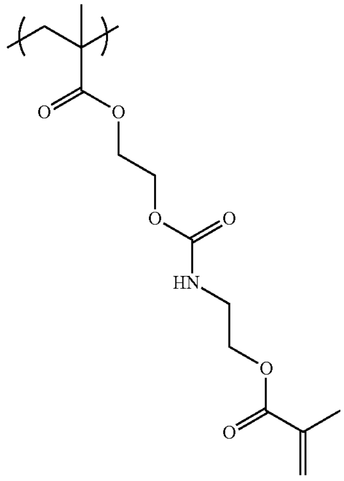

A content of any repeating unit C in the specific compound is not particularly limited, but from the reason that the liquid crystal alignment properties are further improved, the content thereof is preferably 10 to 60 mass % and more preferably 10 to 40 mass % with respect to all repeating units of the specific compound (polymer).

The polymer which is a suitable aspect of the specific compound may have a repeating unit other than the above-described repeating units.

Examples of a monomer (radically polymerizable monomer) forming a repeating unit other than the above-described repeating units include an acrylic acid ester compound, a methacrylic acid ester compound, a maleimide compound, an acrylamide compound, acrylonitrile, maleic acid anhydride, a styrene compound, and a vinyl compound.

A method for synthesizing the polymer which is a suitable aspect of the specific compound is not particularly limited, and examples thereof include a known method such as a batch polymerization method and a dropping method.

As a specific example of the batch polymerization method, the polymer can be synthesized by a method in which a monomer forming the above-described repeating unit B, a monomer forming the above-described repeating unit A, a monomer forming the above-described repeating unit C, and a monomer forming any other repeating unit are mixed, and the mixture is heated in an organic solvent using a radical polymerization initiator, thereby carrying out a batch polymerization. This synthesis method is very simple to operate because all the reagents are placed in a flask and heated.

In addition, specific examples of the dropping method include methods in which a part or all of monomer components consisting of a monomer forming the above-described repeating unit B, a monomer forming the above-described repeating unit A, a monomer forming the above-described repeating unit C, and a monomer forming any other repeating unit are mixed with an organic solvent, the mixture is heated in advance at a predetermined temperature (preferably approximately 60° C. to 100° C.), and a polymerization is carried out while dropping a radical polymerization initiator, or a radical polymerization initiator and the remaining monomer components (limited to a case where a part of the monomer components is used first) thereto.

Here, among the dropping methods, from the viewpoint of production stability, the method of post-dropping only the radical polymerization initiator (hereinafter, also abbreviated as a "dropping method A") is superior to the batch polymerization method.

In addition, among the dropping methods, in the method of post-dropping the radical polymerization initiator and the remaining monomer components (hereinafter, also abbreviated as a "dropping method B"), by changing a charging ratio of the monomers in the flask and the dropping liquid, it is possible to control an introduction rate of the monomers with different reactivity.

Specific examples of the organic solvent include solvents described later. In the present invention, as the organic solvent for the polymerization, from the viewpoint of appropriately controlling decomposition of the repeating unit B, it is preferable to use aromatic hydrocarbons, and it is more preferable to use toluene.

A weight-average molecular weight (Mw) of the specific compound is not particularly limited, but from the reason that the liquid crystal alignment properties are further improved, the weight-average molecular weight thereof is preferably 10000 to 500000, more preferably 10000 to 300000, and still more preferably 30000 to 150000.

Here, in the present invention, the weight-average molecular weight and the number-average molecular weight are values measured by gel permeation chromatography (GPC) under the following conditions.

Solvent (eluant): Tetrahydrofuran (THF)

Device Name: TOSOH HLC-8320GPC

Column: Three items of TOSOH TSKgel Super HZM-H (4.6 mm×15 cm) are connected and used.

Column Temperature: 40° C.

Sample Concentration: 0.1 mass %

Flow Rate: 1.0 ml/min

Calibration Curve: A calibration curve made by 7 samples of TSK standard polystyrene manufactured by TOSOH Corporation, Mw of which is 2800000 to 1050 (Mw/Mn=1.03 to 1.06), is used.

[Binder]

The type of the binder included in the binder composition according to the embodiment of the present invention is not particularly limited. The binder itself may be a resin (hereinafter, also referred to as a "resin binder") which is formed only of a resin having no polymerization reactivity and simply dried and solidified, or a polymerizable compound.

<Resin Binder>

Examples of the resin binder include an epoxy resin, a diallyl phthalate resin, a silicone resin, a phenol resin, an unsaturated polyester resin, a polyimide resin, a polyurethane resin, a melamine resin, an urea resin, an ionomer resin, an ethylene ethyl acrylate resin, an acrylonitrile acrylate styrene copolymer resin, an acrylonitrile styrene resin, an acrylonitrile chloride polyethylene styrene copolymer resin, an ethylene-vinyl acetate resin, an ethylene vinyl alcohol copolymer resin, an acrylonitrile butadiene styrene copolymer resin, a vinyl chloride resin, a chlorinated polyethylene resin, a polyvinylidene chloride resin, a cellulose acetate resin, a fluororesin, a polyoxymethylene resin, a polyamide resin, a polyarylate resin, a thermoplastic polyurethane elastomer, a polyether ether ketone resin, a polyether sulfone resin, polyethylene, polypropylene, a polycarbonate resin, polystyrene, a polystyrene maleic acid copolymer resin, a polystyrene acrylic acid copolymer resin, a polyphenylene ether resin, a polyphenylene sulfide resin, a polybutadiene resin, a polybutylene terephthalate resin, an acrylic resin, a methacrylic resin, a methylpentene resin, a polylactic acid, a polybutylene succinate resin, a butyral resin, a formal resin, polyvinyl alcohol, polyvinylpyrrolidone, ethyl cellulose, carboxymethyl cellulose, gelatin, and a copolymer resin thereof.

<Polymerizable Compound>

Examples of the polymerizable compound include an epoxy-based monomer, a (meth)acrylic monomer, and an oxetanyl-based monomer, and an epoxy-based monomer or a (meth)acrylic monomer is preferable.

In addition, a polymerizable liquid crystal compound or a urethane acrylate monomer may be used as the polymerizable compound.

Examples of an epoxy group-containing monomer which is the epoxy-based monomer include a bisphenol A epoxy resin, a bisphenol F epoxy resin, a brominated bisphenol A epoxy resin, a bisphenol S epoxy resin, a diphenyl ether epoxy resin, a hydroquinone epoxy resin, a naphthalene epoxy resin, a biphenyl epoxy resin, a fluorene epoxy resin, a phenol novolac epoxy resin, an orthocresol novolac epoxy resin, a trishydroxyphenylmethane epoxy resin, a trifunctional epoxy resin, a tetraphenylolethane epoxy resin, a dicyclopentadiene phenol epoxy resin, a hydrogenated bisphenol A epoxy resin, a bisphenol A nucleus-containing polyol epoxy resin, a polypropylene glycol epoxy resin, a glycidyl ester epoxy resin, a glycidylamine epoxy resin, a glyoxal epoxy resin, an alicyclic epoxy resin, and a heterocyclic epoxy resin.

Examples of an acrylic monomer and a methacrylic monomer, which are the (meth)acrylic monomer, include trifunctional monomers such as trimethylolpropane triacrylate, trimethylolpropane propylene oxide (PO)-modified triacrylate, trimethylolpropane ethylene oxide (EO)-modified triacrylate, trimethylolpropane trimethacrylate, and pentaerythritol triacrylate. In addition, examples thereof further include tetrafunctional or higher-functional monomers such as pentaerythritol tetraacrylate, pentaerythritol tetramethacrylate, dipentaerythritol pentaacrylate, dipentaerythritol pentamethacrylate, dipentaerythritol hexaacrylate, and dipentaerythritol hexamethacrylate.

The polymerizable liquid crystal compound is not particularly limited, and examples thereof include a compound in which any one of homeotropic alignment, homogeneous alignment, hybrid alignment, or cholesteric alignment can be performed.

Here, in general, liquid crystal compounds can be classified into a rod-like type and a disk-like type according to the shape thereof. Furthermore, each type includes a low-molecular-type and a high-molecular-type. The term high molecular generally refers to a compound having a degree of polymerization of 100 or more (Polymer Physics-Phase Transition Dynamics, written by Masao Doi, p. 2, published by Iwanami Shoten, 1992). In the present invention, any liquid crystal compound can be used, and a rod-like liquid crystal compound or a discotic liquid crystal compound (disk-like liquid crystal compound) is preferable. In addition, a liquid crystal compound which is a monomer or has a relatively low molecular weight with a degree of polymerization of less than 100 is preferable.

In addition, examples of the polymerizable group of the polymerizable liquid crystal compound include an acryloyl group, a methacryloyl group, an epoxy group, and a vinyl group.

By polymerizing such a polymerizable liquid crystal compound, the alignment of the liquid crystal compound can be immobilized. After immobilizing the liquid crystal compound by polymerization, it is no longer necessary to exhibit liquid crystallinity.

As the rod-like liquid crystal compound, for example, compounds described in claim 1 of JP1999-513019A (JP-H11-513019A) or paragraphs [0026] to [0098] of JP2005-289980A are preferable, and as the discotic liquid crystal compound, for example, compounds described in paragraphs [0020] to [0067] of JP2007-108732A or paragraphs [0013] to [0108] of JP2010-244038A are preferable.

A liquid crystal compound having reverse wavelength dispersibility can be used as the above-described polymerizable liquid crystal compound.

Here, in this specification, the liquid crystal compound having "reverse wavelength dispersibility" refers to the fact that in the measurement of an in-plane retardation (Re) value at a specific wavelength (visible light range) of a retardation film produced using the liquid crystal compound, as the measurement wavelength increases, the Re value is the same or increased.

The liquid crystal compound having reverse wavelength dispersibility is not particularly limited as long as a film having reverse wavelength dispersibility can be formed as described above, and examples thereof include compounds represented by Formula (I) described in JP2008-297210A (particularly, compounds described in paragraphs [0034] to [0039]), compounds represented by Formula (1) described in JP2010-084032A (particularly, compounds described in paragraphs [0067] to [0073]), and compounds represented by Formula (1) described in JP2016-081035A (particularly, compounds described in paragraphs [0043] to [0055]).

Examples thereof further include compounds described in paragraphs [0027] to [0100] of JP2011-006360A, paragraphs [0028] to [0125] of JP2011-006361A, paragraphs [0034] to [0298] of JP2012-207765A, paragraphs [0016] to [0345] of JP2012-077055A, paragraphs [0017] to [0072] of WO12/141245A, paragraphs [0021] to [0088] of WO12/147904A, and paragraphs [0028] to [0115] of WO14/147904A.

A state in which the liquid crystal compound is aligned (alignment state) is not particularly limited, and examples thereof include a known alignment state. Examples of the alignment state include a homogeneous alignment and a homeotropic alignment. In a case where the liquid crystal compound is a rod-like liquid crystal compound, more specific examples of the alignment state include a nematic alignment (state of forming a nematic phase), a smectic alignment (state of forming a smectic phase), a cholesteric alignment (state of forming a cholesteric phase), and a hybrid alignment. In a case where the liquid crystal compound is a discotic liquid crystal compound, examples of the alignment state include a nematic alignment, a columnar alignment (state of forming a columnar phase), and a cholesteric alignment.

[Photo-Acid Generator]

The binder composition according to the embodiment of the present invention preferably includes a photo-acid generator.

The photo-acid generator is not particularly limited, and is preferably a compound which is sensitive to actinic rays having a wavelength of 300 nm or more, preferably 300 to 450 nm, and generates an acid. A photo-acid generator which is not directly sensitive to actinic rays having a wavelength of 300 nm or more can also be preferably used in combination with a sensitizer as long as it is a compound which is sensitive to actinic rays having a wavelength of 300 nm or more and generates an acid by being used in combination with the sensitizer.

The photo-acid generator is preferably a photo-acid generator which generates an acid with a pKa of 4 or less, more preferably a photo-acid generator which generates an acid with a pKa of 3 or less, and even more preferably a photo-acid generator which generates an acid with a pKa of 2 or less. In the present invention, the pKa basically refers to a pKa in water at 25° C. With a compound which cannot be measured in water, the pKa refers to a pKa measured after changing to a solvent suitable for the measurement. Specifically, the pKa described in a chemical handbook or the like can be referred to. The acid with a pKa of 3 or less is preferably a sulfonic acid or a phosphonic acid, and more preferably a sulfonic acid.

Examples of the photo-acid generator include an onium salt compound, trichloromethyl-s-triazines, a sulfonium salt, an iodonium salt, quaternary ammonium salts, a diazomethane compound, an imidosulfonate compound, and an oxime sulfonate compound. Among these, an onium salt compound, an imidosulfonate compound, or an oxime sulfonate compound is preferable, and an onium salt compound or an oxime sulfonate compound is particularly preferable. The photo-acid generators can be used alone or in combination of two or more types thereof.

The binder composition according to the embodiment of the present invention may include a component other than the specific compound, the binder, and the photo-acid generator described above.

[Polymerization Initiator]

In a case where the polymerizable compound is used as the binder, the binder composition according to the embodiment of the present invention preferably includes a polymerization initiator.

The polymerization initiator is not particularly limited, and examples thereof include a thermal polymerization initiator and a photopolymerization initiator depending on the method of a polymerization reaction.

The polymerization initiator is preferably a photopolymerization initiator capable of initiating a polymerization reaction by ultraviolet irradiation.

Examples of the photopolymerization initiator include an α-carbonyl compound, acyloin ether, an α-hydrocarbon-substituted aromatic acyloin compound, a polynuclear quinone compound, a combination of a triarylimidazole dimer and p-aminophenyl ketone, an acridine and phenazine compound, an oxadiazole compound, and an acylphosphine oxide compound.

[Solvent]

From the viewpoint of workability for forming a binder layer, the binder composition according to the embodiment of the present invention preferably includes a solvent.

Examples of the solvent include ketones (for example, acetone, 2-butanone, methyl isobutyl ketone, cyclopentanone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide).

The solvents may be used alone or in combination of two or more kinds thereof.

[Compound]

A compound according to an embodiment of the present invention is a compound having the above-described group represented by Formula (B1) or (B2), that is, the above-described specific compound.

The compound according to the embodiment of the present invention may be a compound having a group represented by Formula (P0), or a compound having a group represented by Formula (P1).

$$P^1—L^1—* \quad (P0)$$

$$R^1{}_2C{=}CR^2—L^1—* \quad (P1)$$

In Formulae (P0) and (P1), * represents a bonding position with * in Formula (B1) or (B2) described above.

In addition, in Formula (P0), $P^1$ represents a polymerizable group.

In addition, in Formula (P1), $R^1$ and $R^2$ each independently represent a hydrogen atom or a substituent. However, a plurality of R's may be the same or different from each other.

In addition, in Formulae (P0) and (P1), $L^1$ represents a divalent linking group.

In Formula (P0), $P^1$ represents a polymerizable group.

As the polymerizable group, a cationically polymerizable group or a radically polymerizable group is preferable, and a radically polymerizable group is more preferable.

Examples of the cationically polymerizable group include an epoxy group, an epoxycyclohexyl group, and an oxetanyl group.

Examples of the radically polymerizable group include a methacryloyl group, an acryloyl group, a methacrylicamide group, an acrylamide group, a vinyl group, a styryl group, and an allyl group. Among these, a methacryloyl group or an acryloyl group is preferable.

In Formula (P1), $R^1$ and $R^2$ each independently represent a hydrogen atom or a substituent.

The type of the substituent represented as one aspect of $R^1$ and $R^2$ is not particularly limited, examples thereof include known substituents, specifically groups exemplified for the substituent represented as one aspect of $R^{b1}$ in Formula (B1) described above. Among these, an alkyl group having 1 to 12 carbon atoms is preferable, a linear alkyl group having 1 to 8 carbon atoms or a branched alkyl group having 3 to 8 carbon atoms is more preferable, and a methyl group is still more preferable.

In addition, $R^1$ and $R^2$ are preferably a hydrogen atom or a methyl group.

In Formulae (P0) and (P1), $L^1$ represents a divalent linking group.

Examples of the divalent linking group include the same group as those exemplified for the divalent linking group represented as one aspect of $L^{b1}$ in Formula (B1) described above.

In addition, a portion represented by "$R_2{}^1C{=}CR^2$—" in Formula (P1) and a portion of $L^1$ may form a polymerizable group. Examples of such a polymerizable group include a methacryloyl group, an acryloyl group, a methacrylicamide group, and an acrylamide group, and among these, a methacryloyl group or an acryloyl group is preferable.

Among the compounds according to the embodiment of the present invention, specific examples of the compound having the above-described group represented by Formulae (P0) and (P1) include compounds represented by Formulae mB-1 to mB-23. In the formulae of the following specific examples, Me represents a methyl group.

mB-1

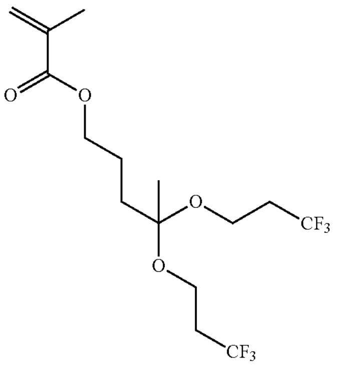

mB-2

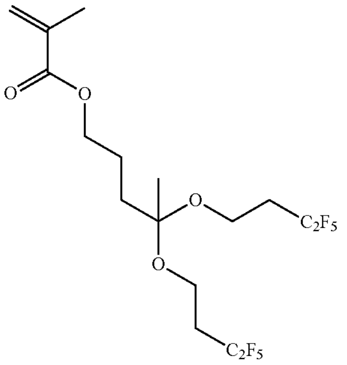

mB-3

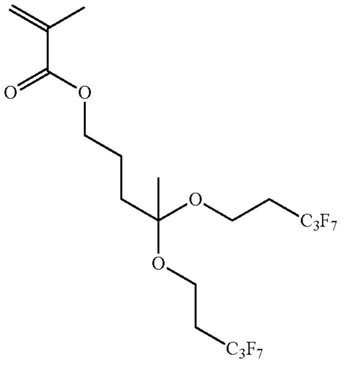

mB-4

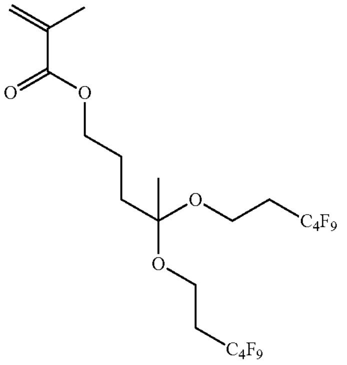

-continued
mB-5
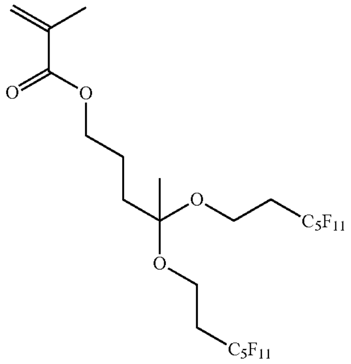
mB-6
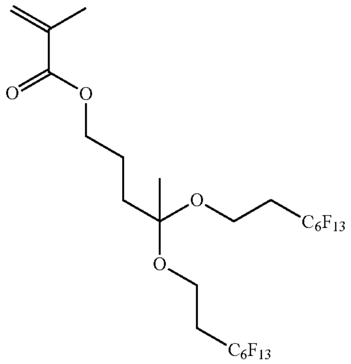
mB-7
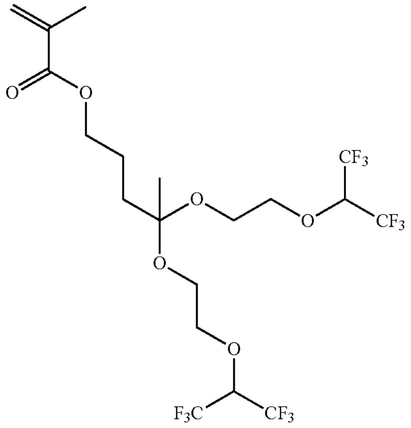
mB-8
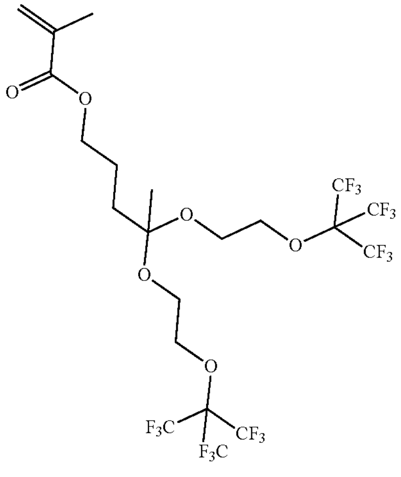
-continued
mB-9
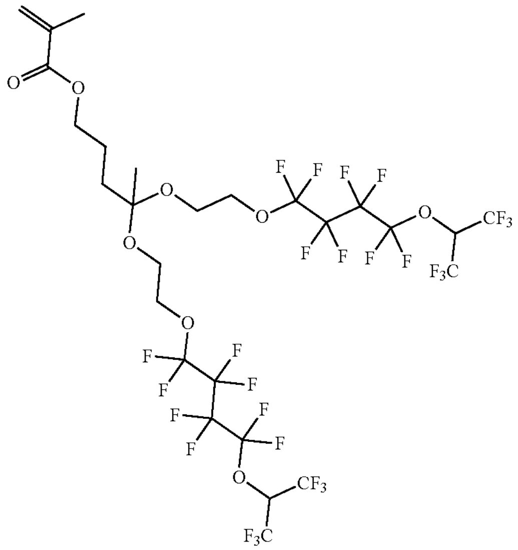
mB-10
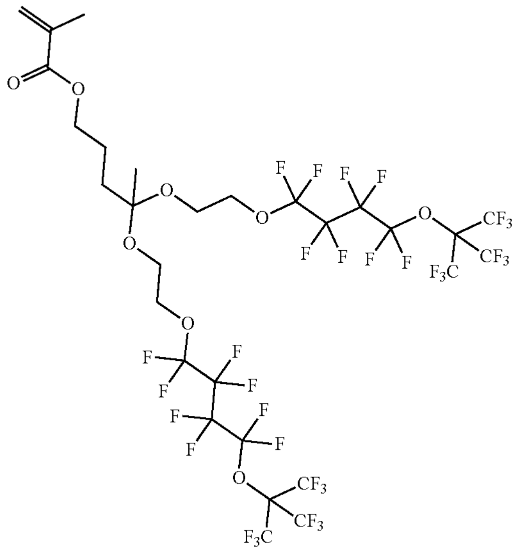

-continued
mB-11
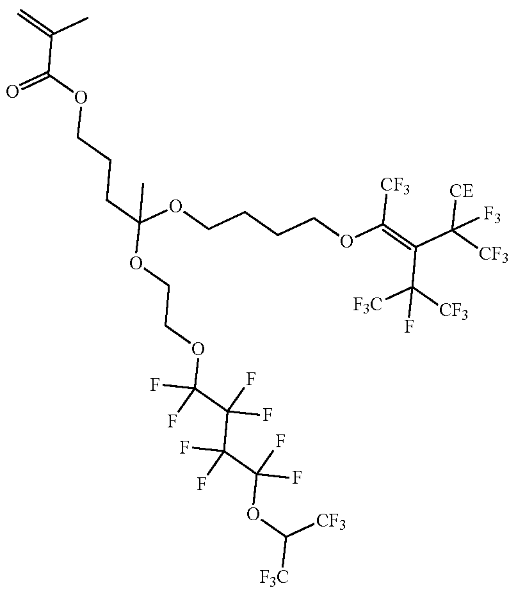
mB-12
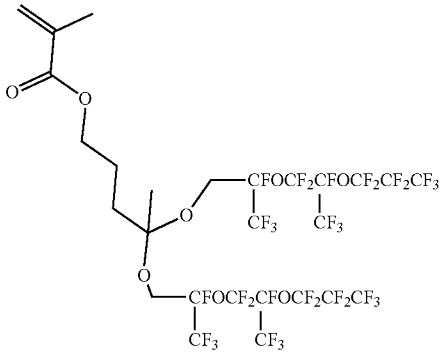
mB-13
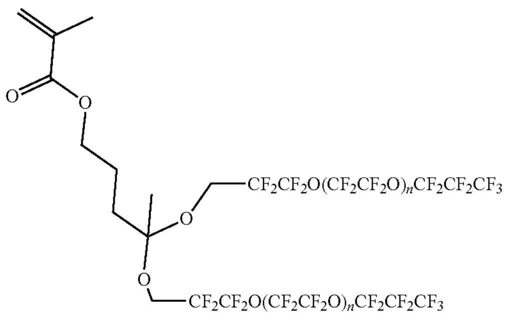
-continued
mB-14
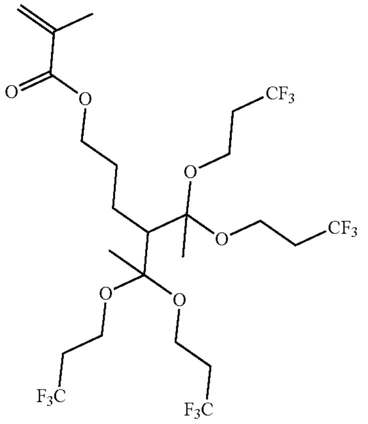
mB-15
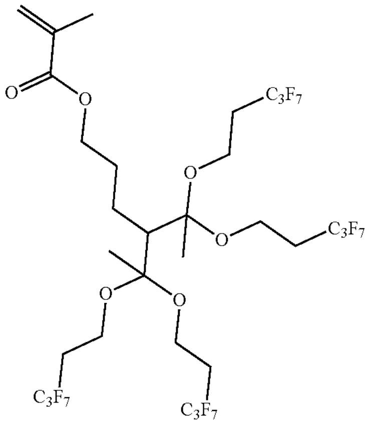
mB-16
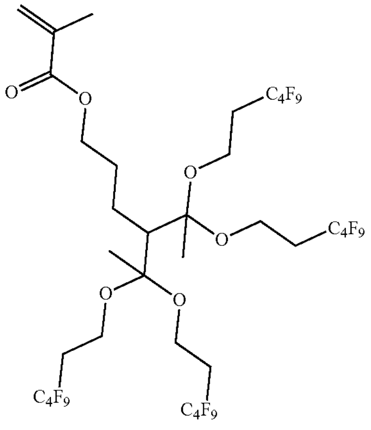

-continued
mB-17
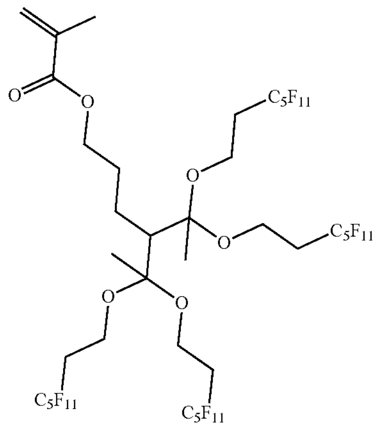
mB-18
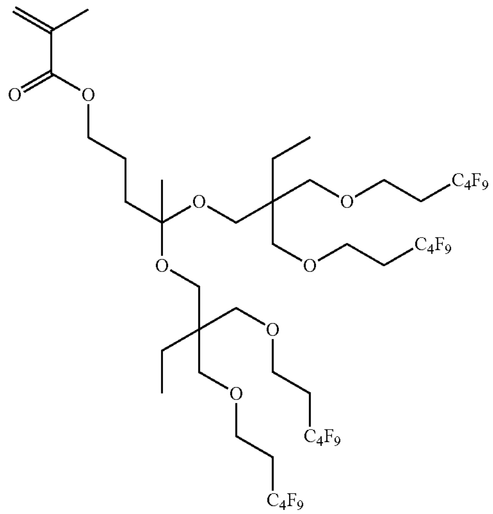
mB-19
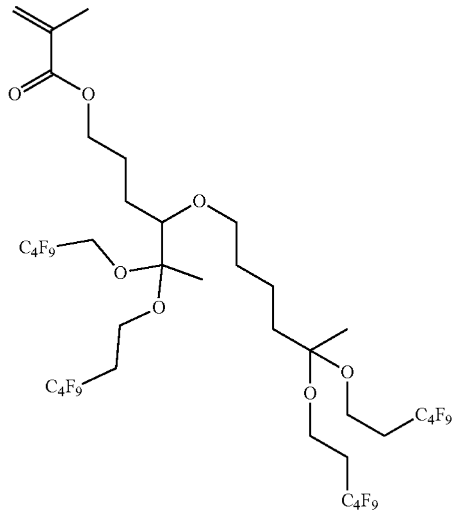
-continued
mB-20
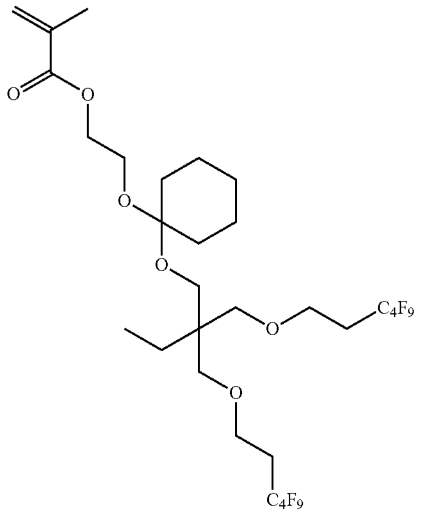
mB-21
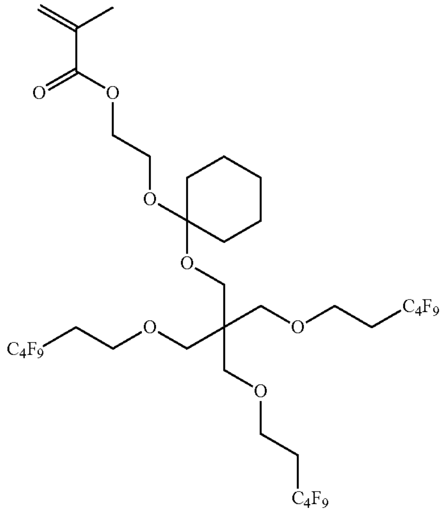
mB-22
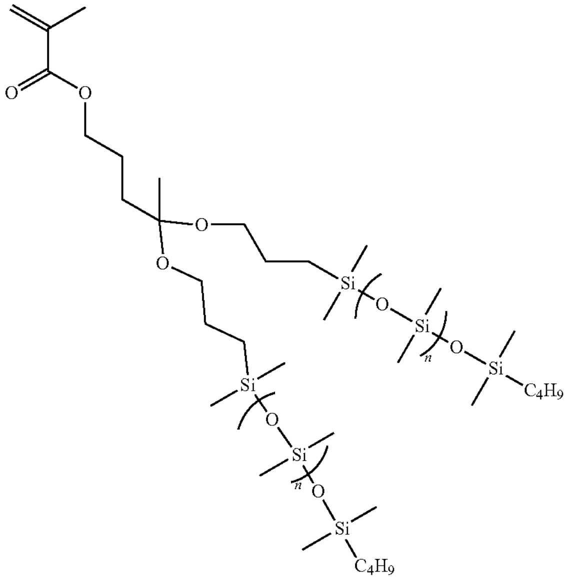

-continued mB-23

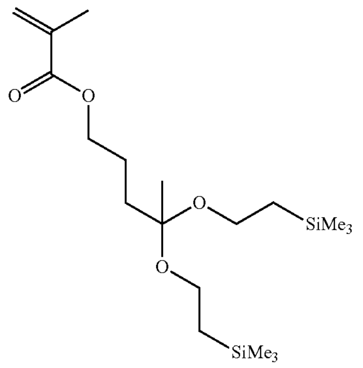

[Binder Layer]

A binder layer according to the embodiment of the present invention is formed of the above-described binder composition according to the embodiment of the present invention. More specifically, the binder layer is a layer obtained by supplying at least one selected from the group consisting of light, heat, acid, and base (hereinafter, abbreviated as "acid and the like" in the present paragraph) to a coating film formed of the binder composition, so that a ketal structure included in the specific cleavage group is cleaved to eliminate the aliphatic hydrocarbon group having a fluorine atom or the organosiloxane group.

In addition, in a case where the specific compound included in the above-described binder composition according to the embodiment of the present invention has a photo-aligned group, the binder layer according to the embodiment of the present invention is a layer having alignment controllability on a surface thereof. More specifically, the binder layer is a layer formed by supplying acid and the like to the coating film of the binder composition, and then performing a photo-alignment treatment. The expression "having alignment controllability" means having a function of aligning the liquid crystal compound disposed on the binder layer in a predetermined direction. In addition, in a case where the binder layer includes the above-described polymerizable liquid crystal compound, the expression "having alignment controllability" may mean having a function of aligning the polymerizable liquid crystal compound included in the binder layer in a predetermined direction.

In addition, in a case where the above-described binder composition according to the embodiment of the present invention contains a photo-acid generator, the supply of acid and the like to the coating film of the binder composition may be an aspect in which the acid is generated from the photo-acid generator in the coating film.

That is, in a case where the specific compound included in the above-described binder composition according to the embodiment of the present invention has a photo-aligned group and the above-described binder composition according to the embodiment of the present invention contains a photo-acid generator, the method of forming the binder layer preferably includes a step of generating an acid from the photo-acid generator in a coating film formed of the above-described binder composition, and then performing a photo-alignment treatment on the coating film to form a binder layer (Step 1).

In a case where the binder composition includes a polymerizable compound, it is preferable that, in Step 1, a curing treatment is performed on the coating film formed of the above-described binder composition, a treatment for generating an acid from the photo-acid generator in the coating film (hereinafter, also simply referred to as an "acid generation treatment") is performed, and then a photo-alignment treatment is performed to form a binder layer.

As will be described later, the curing treatment and the acid generation treatment may be performed simultaneously.

Hereinafter, the method of performing the above-described curing treatment will be described in detail.

The method of forming a coating film of the binder composition is not particularly limited, and examples thereof include a method including performing coating on a support with the binder composition and optionally performing a drying treatment.

The support will be described in detail later.

In addition, an alignment layer may be disposed on the support.

The method of performing coating with the binder composition is not particularly limited, and examples of the coating method include a spin coating method, an air knife coating method, a curtain coating method, a roller coating method, a wire bar coating method, a gravure coating method, and a die coating method.

Next, a curing treatment and a treatment for generating an acid from the photo-acid generator in the coating film (hereinafter, also referred to as an "acid generation treatment") are performed on the coating film of the binder composition.

Examples of the curing treatment include a light irradiation treatment and a heating treatment.

The conditions of the curing treatment are not particularly limited, and ultraviolet rays are preferably used in polymerization by light irradiation. An irradiation amount is preferably 10 $mJ/cm^2$ to 50 $J/cm^2$, more preferably 20 $mJ/cm^2$ to 5 $J/cm^2$, still more preferably 30 $mJ/cm^2$ to 3 $J/cm^2$, and particularly preferably 50 to 1000 $mJ/cm^2$. In order to promote the polymerization reaction, the treatment may be performed under heating conditions.

The treatment for generating an acid from the photo-acid generator in the coating film is a treatment for generating an acid by irradiation with light to which the photo-acid generator included in the binder composition is exposed. By performing the treatment, cleavage at the cleavage group proceeds, and the group containing a fluorine atom or a silicon atom is eliminated.

The light irradiation treatment performed in the above-described treatment may be a treatment in which the photo-acid generator is exposed to light, and examples thereof include an ultraviolet irradiation method. As a light source, a lamp emitting ultraviolet rays, such as a high-pressure mercury lamp and a metal halide lamp, can be used. In addition, an irradiation amount is preferably 10 $mJ/cm^2$ to 50 $J/cm^2$, more preferably 20 $mJ/cm^2$ to 5 $J/cm^2$, still more preferably 30 $mJ/cm^2$ to 3 $J/cm^2$, and particularly preferably 50 to 1000 $mJ/cm^2$.

Regarding the curing treatment and the acid generation treatment described above, the acid generation treatment may be performed after the curing treatment, or the curing treatment and the acid generation treatment may be performed simultaneously. In particular, in a case where the photo-acid generator and the polymerization initiator in the binder composition are exposed to light having the same wavelength, from the viewpoint of productivity, it is preferable that the curing treatment and the acid generation treatment are performed simultaneously.

The method for the photo-alignment treatment to be performed on the coating film of the binder composition formed as described above (including a cured film of the binder composition subjected to the curing treatment) is not particularly limited, and examples thereof include known methods.

Examples of the photo-alignment treatment include a method of irradiating the coating film of the binder composition (including the cured film of the binder composition subjected to the curing treatment) with polarized light or irradiating the surface of the coating film with unpolarized light from an oblique direction.

In the photo-alignment treatment, the polarized light to be irradiated is not particularly limited. Examples thereof include linearly polarized light, circularly polarized light, and elliptically polarized light, and linearly polarized light is preferable.

In addition, the "oblique direction" in which irradiation with unpolarized light is performed is not particularly limited as long as it is a direction inclined at a polar angle θ (0°<θ <90°) with respect to a normal direction of the surface of the coating film. θ can be appropriately selected according to the purpose, and is preferably 20° to 80°.

A wavelength of the polarized light or the unpolarized light is not particularly limited as long as the light is light to which the photo-aligned group is exposed. Examples thereof include ultraviolet rays, near-ultraviolet rays, and visible rays, and near-ultraviolet rays of 250 to 450 nm are preferable.

In addition, examples of a light source for the irradiation with polarized light or unpolarized light include a xenon lamp, a high-pressure mercury lamp, an ultra-high pressure mercury lamp, and a metal halide lamp. By using an interference filter, a color filter, or the like with respect to ultraviolet rays or visible rays obtained from the light source, the wavelength range of the irradiation can be restricted. In addition, linearly polarized light can be obtained by using a polarization filter or a polarization prism with respect to the light from the light source.

An integrated quantity of the polarized light or the unpolarized light is not particularly limited, but is preferably 1 to 300 mJ/cm$^2$ and more preferably 5 to 100 mJ/cm$^2$.

An illuminance of the polarized light or the unpolarized light is not particularly limited, but is preferably 0.1 to 300 mW/cm$^2$ and more preferably 1 to 100 mW/cm$^2$.

The aspect in which the curing treatment and the acid generation treatment are performed before the photo-alignment treatment has been described, but the present invention is not limited to this aspect. The curing treatment and the acid generation treatment may be performed at the same time as the photo-alignment treatment, or the curing treatment and the acid generation treatment may be performed after the photo-alignment treatment. In particular, in a case where the alignment of the binder layer is controlled by the photo-alignment treatment, it is preferable that the binder composition is applied, and then the binder layer is produced by the following process.

That is, it is preferable that the binder layer is produced by a process in which the specific compound in the coating film obtained by using the binder composition is crosslinked by a crosslinking treatment, the coating film is subjected to the photo-alignment treatment and the curing treatment in this order, and then the acid generation treatment is performed to produce a binder layer.

Here, examples of the crosslinking treatment include a light irradiation treatment and a heating treatment. For example, in a case where the crosslinkable group of the specific compound used reacts by the action of acid, examples of the crosslinking treatment include an acid generation treatment.

In addition, as the crosslinking treatment, from the viewpoint of productivity and ease of reaction of the crosslinkable group, an acid generation treatment is preferable. The crosslinking treatment and the acid generation treatment may be performed at the same time, and in this case, it is preferable that the crosslinking treatment and the acid generation treatment are performed at the same time, and then the photo-alignment treatment and the curing treatment are performed in this order.

A thickness of the binder layer is not particularly limited, but from the reason that the upper layer coating properties are further improved, the thickness thereof is preferably 0.1 to 10 m and more preferably 0.3 to 3 μm.

[Optical Laminate]

An optical laminate according to the embodiment of the present invention has the binder layer according to the embodiment of the present invention and an optically anisotropic layer provided on the binder layer.

A suitable aspect of the optical laminate according to the embodiment of the present invention is that the optically anisotropic layer provided on the binder layer is formed of a polymerizable liquid crystal composition including a polymerizable liquid crystal compound, and the binder layer and the optically anisotropic layer are laminated adjacent to each other.

In addition, the optical laminate according to the embodiment of the present invention preferably has a support which supports the binder layer. The support may be peeled off after forming the optical laminate.

Hereinafter, suitable aspects of the optical laminate according to the embodiment of the present invention will be described in detail.

[Support]

Examples of the support include a glass substrate and a polymer film.

Examples of a material of the polymer film include cellulose-based polymers; acrylic polymers having an acrylic acid ester polymer such as polymethyl methacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer; polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

A thickness of the support is not particularly limited, but is preferably 5 to 200 μm, more preferably 10 to 100 μm, and still more preferably 20 to 90 μm.

[Binder Layer]

The binder layer is the above-described binder layer according to the embodiment of the present invention.

[Optically Anisotropic Layer]

The optically anisotropic layer is preferably formed of a polymerizable liquid crystal composition including a polymerizable liquid crystal compound.

Here, examples of the polymerizable liquid crystal composition for forming the optically anisotropic layer include a composition obtained by blending the polymerizable liquid crystal compound, the polymerization initiator, the solvent, and the like described as optional components in the binder composition according to the embodiment of the present invention.

A thickness of the optically anisotropic layer is not particularly limited, and is preferably 0.1 to 10 μm and more preferably 0.5 to 5 μm.

[Optical Laminate Manufacturing Method]

An optical laminate manufacturing method according to the embodiment of the present invention is a method of producing a suitable aspect of the above-described optical laminate according to the embodiment of the present invention, and includes a step of supplying at least one selected from the group consisting of light, heat, acid, and base to a coating film formed of the composition in which a copolymer having the above-described repeating unit A and the above-described repeating unit B is blended as the specific compound in the binder composition according to the embodiment of the present invention, and then subjecting the coating film to a photo-alignment treatment to form a binder layer (Step 1), and a step of performing coating on the binder layer with a polymerizable liquid crystal composition including a polymerizable liquid crystal compound to form an optically anisotropic layer (Step 2).

[Step 1]

Step 1 is a step of generating an acid from the photo-acid generator in a coating film formed of the binder composition, and then performing a photo-alignment treatment on the coating film to form a binder layer.

The procedure of Step 1 is as described above.

[Step 2]

Step 2 is a step of performing coating on the binder layer with a polymerizable liquid crystal composition including a polymerizable liquid crystal compound to form an optically anisotropic layer.

The method of performing coating with the polymerizable liquid crystal composition is not particularly limited, and examples thereof include the coating method exemplified in Step 1.

Examples of the method of forming the optically anisotropic layer include a method in which a coating film of the polymerizable liquid crystal composition is subjected to a heating treatment and then subjected to a curing treatment. The polymerizable liquid crystal compound can be aligned by the above-described heating treatment.

In the above description, the heating treatment and the curing treatment are separately performed. However, a method in which the curing treatment is performed under heating conditions may also be carried out.

In a case where the polymerizable liquid crystal compound is aligned without performing the heating treatment depending on the type of the polymerizable liquid crystal compound, the heating treatment may not be performed.

After being heated, the coating film may be optionally cooled before the curing treatment described later.

The conditions of the heating treatment are not particularly limited, and the temperature may be adjusted so that the polymerizable liquid crystal compound is aligned. Usually, the heating temperature is preferably 30° C. to 100° C. and more preferably 50° C. to 80° C. The heating time is preferably 0.5 to 20 minutes, and more preferably 1 to 5 minutes.

The method for the curing treatment is not particularly limited. Examples thereof include a light irradiation treatment and a heating treatment, and a light irradiation treatment is preferable. Ultraviolet rays are preferable as light in the light irradiation treatment.

The conditions for a case where the light irradiation is performed are not particularly limited, and an irradiation amount is preferably 10 $mJ/cm^2$ to 50 $J/cm^2$, more preferably 20 $mJ/cm^2$ to 5 $J/cm^2$, and still more preferably 30 $mJ/cm^2$ to 3 $J/cm^2$.

In order to promote the polymerization reaction, the treatment may be performed under heating conditions.

[Image Display Device]

An image display device according to the embodiment of the present invention is an image display device having the optically anisotropic layer according to the present invention or the optical laminate according to the embodiment of the present invention.

The display element which is used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, the image display device according to the embodiment of the present invention is preferably a liquid crystal display device using a liquid crystal cell as a display element or an organic EL display device using an organic EL display panel as a display element.

[Liquid Crystal Display Device]

A liquid crystal display device as an example of the image display device according to the embodiment of the present invention has the optically anisotropic layer according to the present invention or the optical laminate according to the embodiment of the present invention described above, and a liquid crystal cell.

The liquid crystal cell which is used in the liquid crystal display device is preferably a vertical alignment (VA) mode, an optically compensated bend (OCB) mode, an in-plane-switching (IPS) mode, a fringe-field-switching (FFS) mode, or a twisted nematic (TN) mode, but is not limited thereto.

As the liquid crystal display device which is an example of the image display device according to the embodiment of the present invention, for example, it is preferable to have a polarizer, the optical laminate according to the embodiment of the present invention, and a liquid crystal cell in this order from a viewing side.

[Organic EL Display Device]

Suitable examples of the organic EL display device as an example of the image display device according to the embodiment of the present invention include a device having an aspect in which it has a polarizer, the optically anisotropic layer according to the present invention or the optical laminate according to the embodiment of the present invention, and an organic EL display panel in this order from the viewing side.

<Polarizer>

The above-described polarizer is not particularly limited as long as it is a member having a function of converting light into specific linearly polarized light. An absorption-type polarizer or a reflective-type polarizer which has been known can be used.

Examples of the absorption-type polarizer include an iodine-based polarizer, a dye-based polarizer using a dichroic dye, and a polyene-based polarizer. The iodine-based polarizer and the dye-based polarizer include a coating-type polarizer and a stretching-type polarizer, and any of these is applicable.

Examples of the method of obtaining a polarizer by performing stretching and dyeing in a state in which a laminate film is obtained by forming a polyvinyl alcohol layer on a base material include JP5048120B, JP5143918B, JP4691205B, JP4751481B, and JP4751486B.

Examples of the reflective-type polarizer include a polarizer obtained by laminating thin films having different birefringences, a wire grid-type polarizer, and a polarizer obtained by combining a cholesteric liquid crystal having a selective reflection range and a ¼ wavelength plate.

Among these, from the viewpoint of more excellent adhesiveness, a polarizer including a polyvinyl alcohol-based resin (a polymer including —$CH_2$—CHOH— as a repeating unit; in particular, at least one selected from the group consisting of a polyvinyl alcohol and an ethylene-vinyl alcohol copolymer) is preferable.

A thickness of the polarizer is not particularly limited, and is preferably 3 to 60 μm, more preferably 5 to 30 μm, and still more preferably 5 to 15 μm.

<Organic EL Display Panel>

The organic EL display panel is a member in which a light emitting layer or a plurality of organic compound thin films including a light emitting layer is formed between a pair of electrodes of an anode and a cathode. In addition to the light emitting layer, a hole injection layer, a hole transport layer, an electron injection layer, an electron transport layer, a protective layer, and the like may be provided, and each of these layers may have a different function. Various materials can be used to form the respective layers.

EXAMPLES

Hereinafter, the present invention will be more specifically described with examples. Materials, used amounts, ratios, treatment contents, and treatment procedures shown in the following examples are able to be suitably changed unless the changes cause deviance from the gist of the invention. Therefore, the range of the present invention will not be restrictively interpreted by the following examples.

Example A

[Synthesis of Monomer mB-4]

A monomer mB-4 represented by Formula mB-4 was synthesized according to the following scheme.

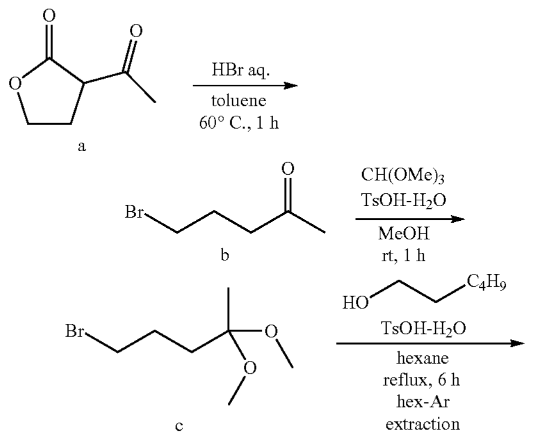

a b c

-continued

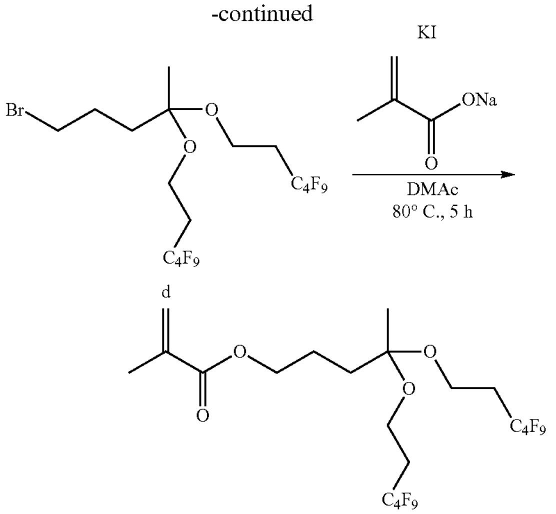

d mB-4

<Synthesis of b>

200 g of 2-acetylbutyrolactone (compound represented by Formula a in the above-described scheme), 320 g of a hydrogen bromide aqueous solution (48%), and 300 mL of toluene were weighed into a 2000 mL eggplant flask and stirred at 60° C. for 1 hour. The reaction solution was cooled to room temperature and transferred to a separating funnel, and 100 mL of hexane was added thereto. Separation washing was performed with 100 mL of saturated sodium hydrogen carbonate water including 10 g of sodium thiosulfate and 100 mL of saturated saline, and then the obtained organic layer was dried over anhydrous magnesium sulfate and concentrated to obtain 260.0 g of a compound b (compound represented by Formula b in the above-described scheme) as a brown liquid.

<Synthesis of c>

256 g of the compound b, 165.6 g of trimethyl formate, 9 g of p-toluenesulfonic acid monohydrate, and 400 mL of methanol were weighed into a 2000 mL eggplant flask and stirred at room temperature for 1 hour. 15 mL of diisopropylethylamine was added thereto, and the solvent was distilled off using an evaporator. 500 mL of hexane and 50 mL of ethyl acetate were added thereto, the reaction solution was transferred to a separating funnel, separation washing was performed twice with 500 mL of saturated sodium hydrogen carbonate aqueous solution, and then the obtained organic layer was dried over anhydrous magnesium sulfate and concentrated to obtain 248.0 g of a compound c (compound represented by Formula c in the above-described scheme) as a brown liquid.

<Synthesis of d>

50 g of the compound c, 0.45 g of p-toluenesulfonic acid monohydrate, 172.5 g of 1H,1H,2H,2H-perfluorohexan-1-ol, and 100 mL of hexane were weighed into a 500 mL eggplant flask, a Dean-Stark was attached thereto at 77° C., and the mixture was stirred for 6 hours to obtain a reaction solution.

Next, 1 mL of diisopropylethylamine was added to the reaction solution, and the solvent was distilled off using an evaporator to obtain a concentrated solution. The concentrated solution was transferred to a separating funnel, 700 mL of hexane and 400 mL of acetonitrile were added thereto, and then the hexane layer was separated and concentrated with an evaporator to obtain 73.0 g of a compound d (compound represented by Formula d in the above-described scheme) as a brown liquid.

<Synthesis of Monomer mB-4>

50 g of the compound d, 50 mg of dibutylhydroxytoluene (BHT), 1.23 g of potassium iodide, 12 g of sodium methacrylate, and 50 mL of N,N-dimethylacetamide were weighed into a 300 mL eggplant flask and stirred at 80° C. for 5 hours. The reaction solution was cooled to room temperature, 200 mL of water was added, the mixture was stirred for 5 minutes and transferred to a separating funnel, and 200 mL of hexane and 20 mL of ethyl acetate were added thereto. The separating funnel was shaken, and the aqueous layer was removed. A saturated sodium chloride aqueous solution was added thereto, and the mixture was washed separately. The obtained organic layer was dried over anhydrous sodium sulfate and concentrated, and column chromatography was performed to obtain 41 g of a monomer mB-4.

The following monomer mB-4 corresponds to a monomer forming a repeating unit represented by Formula B-4.

mB-4

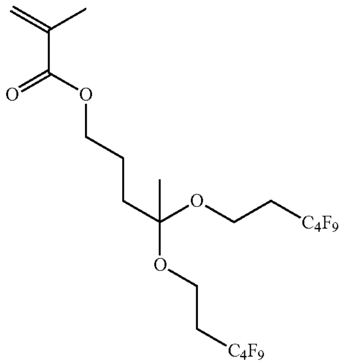

B-4

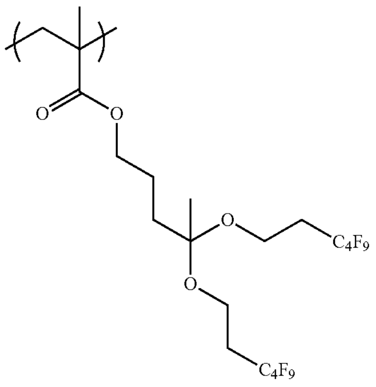

Monomers other than the above were synthesized by referring to the above-described synthesis method and a known method (for example, the method described in WO2018/216812A).

Structures of repeating units used in Examples described later correspond to the specific examples of the repeating units described above, and structures of repeating units used in Comparative Examples described later and monomers forming the repeating units are as follows.

mB0-1

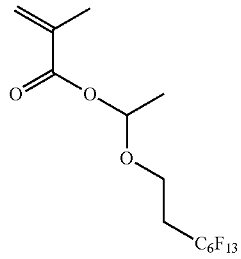

B0-1

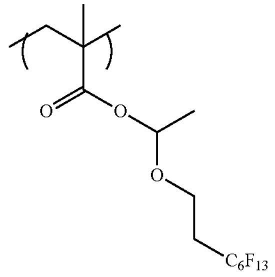

mB0-2

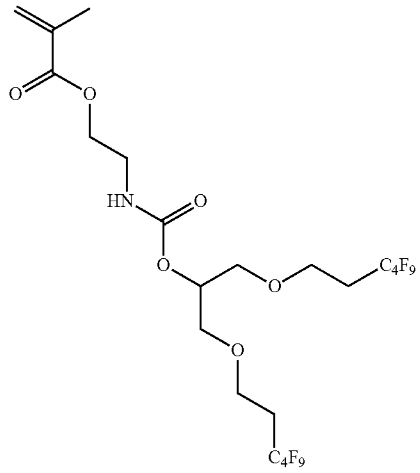

B0-2

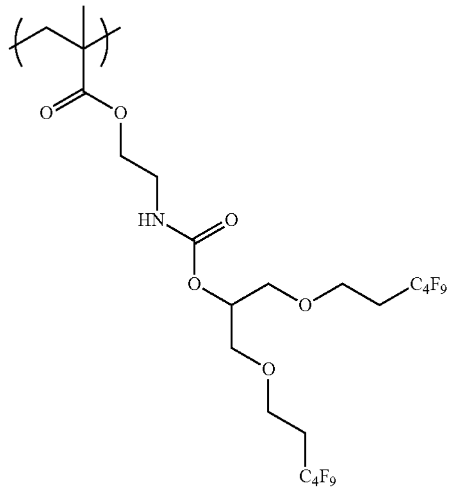

Example 1 (Synthesis of Polymer P-1)

2-butanone (23 parts by mass) as a solvent, the following monomer mA-18 (2.65 parts by mass), the following monomer mB-4 (3.65 parts by mass), the following monomer mC-4Cl (3.70 parts by mass), and 2,2'-azobis(isobutyronitrile) (0.081 parts by mass) as a polymerization initiator were put into a flask equipped with a cooling pipe, a thermometer, and a stirrer, and the mixture was stirred for 7 hours while maintaining a reflux state with water bath heating and flowing nitrogen through the flask at 15 mL/min.

mA-18

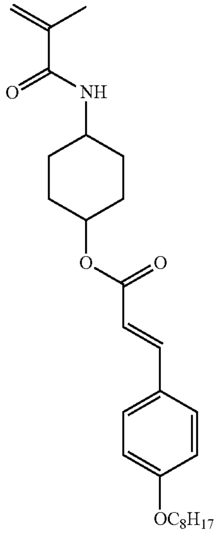

mB-4

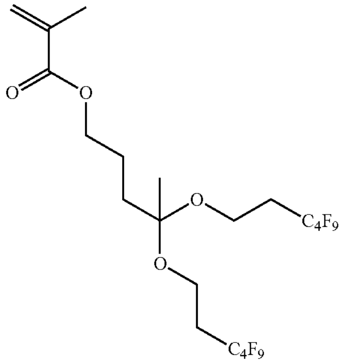

mC-4Cl

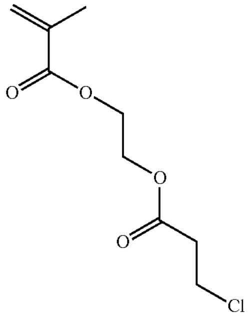

After completion of the reaction, the mixture was allowed to cool to room temperature. The obtained polymer solution was poured into a large excess of methanol to precipitate the polymer, and the collected precipitate was separated by filtering and washed with a large amount of methanol. Next, the resultant was vacuum-dried at 40° C. for 6 hours to obtain the following polymer P-1c having a repeating unit A-18, a repeating unit B-4, and a repeating unit C-4Cl.

P-1c

A-18

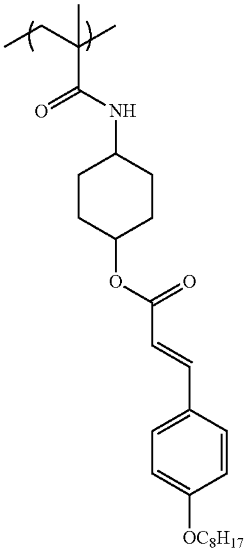

B-4

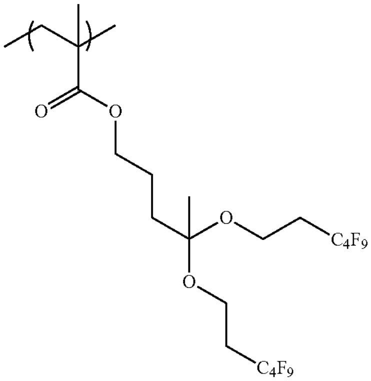

C-4Cl

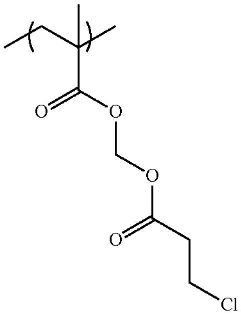

Subsequently, the copolymer P-1c (3.3 parts by mass), 4-methoxyphenol (0.016 parts by mass), triethylamine (3.75 parts by mass), and dimethylacetamide (4.95 parts by mass) were put into a flask equipped with a cooling pipe, a thermometer, and a stirrer, and the mixture was stirred at 60° C. for 4 hours with water bath heating. After completion of the reaction, the mixture was allowed to cool to room temperature. The obtained reaction solution was poured into a large excess of methanol/water (⅓) to precipitate the polymer, and the collected precipitate was separated by filtering and washed with a large amount of methanol/water (⅓). Next, the resultant was blast-dried at 40° C. for 12 hours to obtain the following polymer P-1.

P-1

A-18

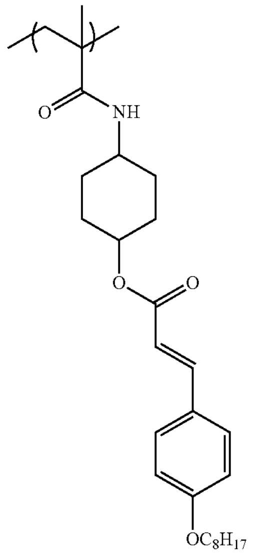

B-4

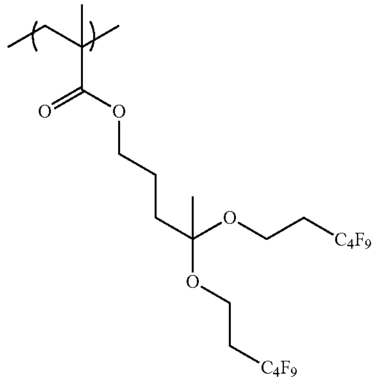

C-4

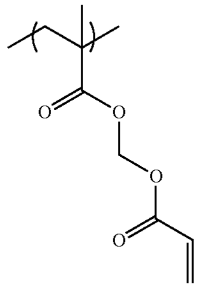

Examples 2 to 7 and Comparative Examples 1 and 2 (Synthesis of Polymer)

Polymers P-2 to P-7, H-1, and H-2 were synthesized in the same manner as the polymer P-1 synthesized in Example 1, except that monomers forming repeating units described in Table 1 below were used instead of the various monomers used in Example 1, and contents described in Table 1 below were blended.

Structures of the polymers P-1 to P-7, H-1, and H-2 synthesized in Examples 1 to 7 and Comparative Examples 1 and 2 are shown below.

Polymer P-1

(in the following formula, a to c are a:b:c=25:40:35, and indicate the content of each repeating unit with respect to all repeating units in the polymer)

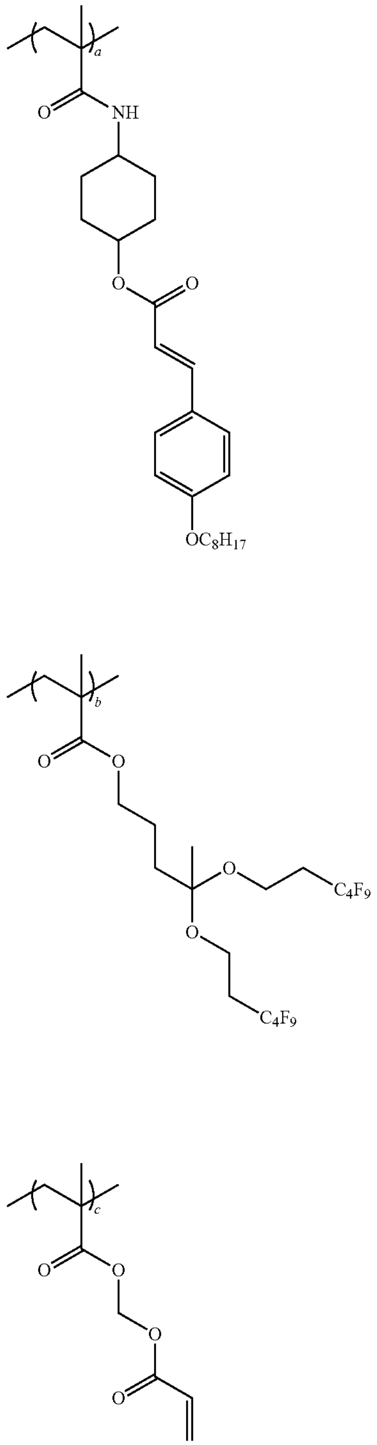

Polymer P-2

(in the following formula, a to c are a:b:c=25:35:40, and indicate the content of each repeating unit with respect to all repeating units in the polymer)

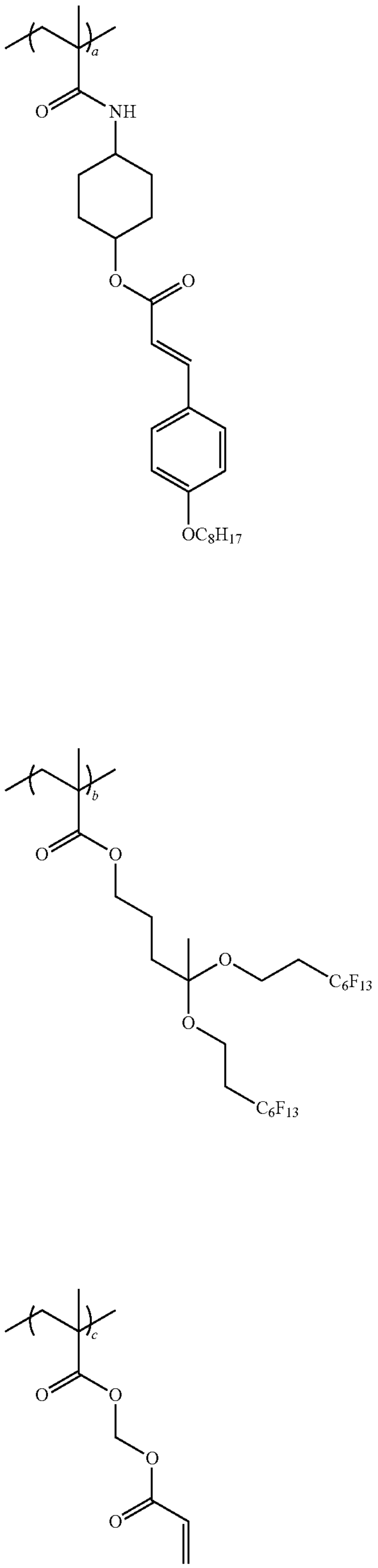
Polymer P-3
(in the following formula, a to c are a:b:c=25:35:40, and indicate the content of each repeating unit with respect to all repeating units in the polymer)
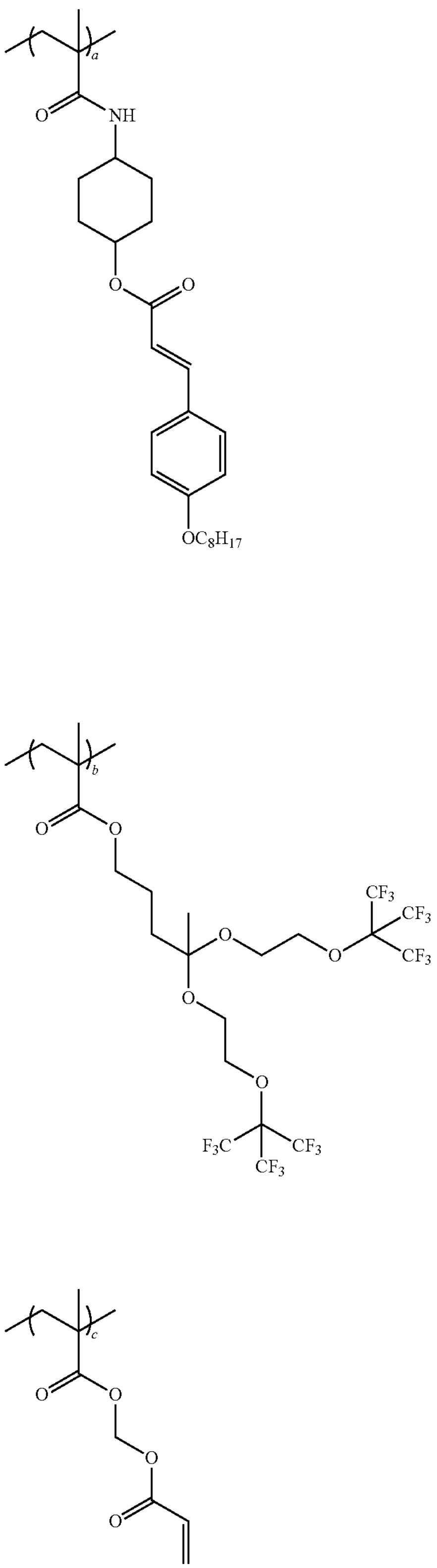
Polymer P-4
(in the following formula, a to c are a:b:c=25:30:45, and indicate the content of each repeating unit with respect to all repeating units in the polymer)

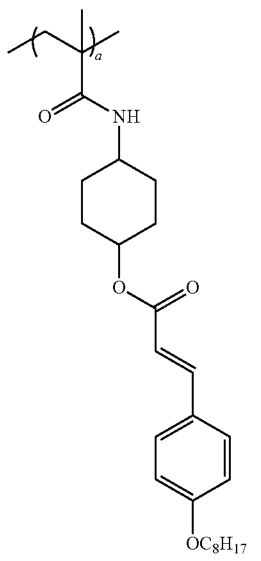
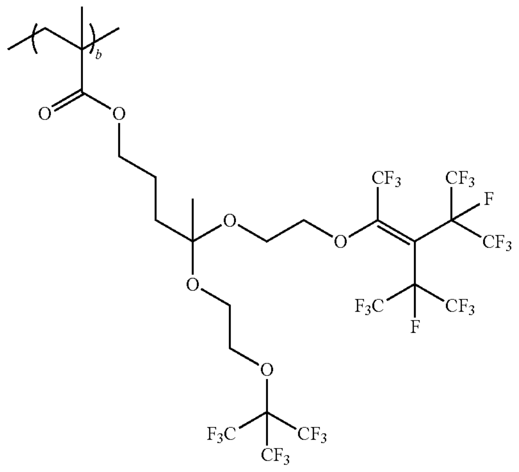
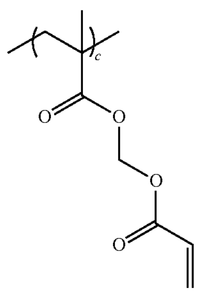
Polymer P-5
(in the following formula, a to c are a:b:c=25:30:45, and indicate the content of each repeating unit with respect to all repeating units in the polymer)
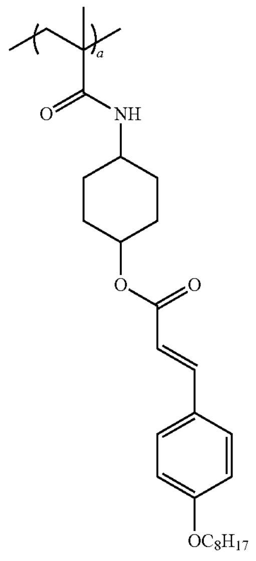
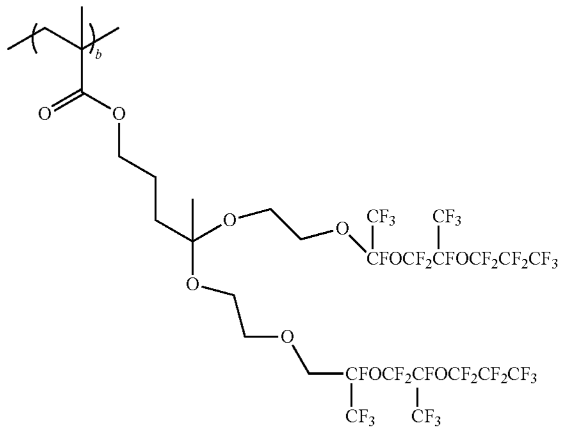
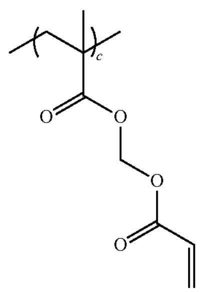
Polymer P-6
(in the following formula, a to c are a:b:c=15:40:45, and indicate the content of each repeating unit with respect to all repeating units in the polymer)

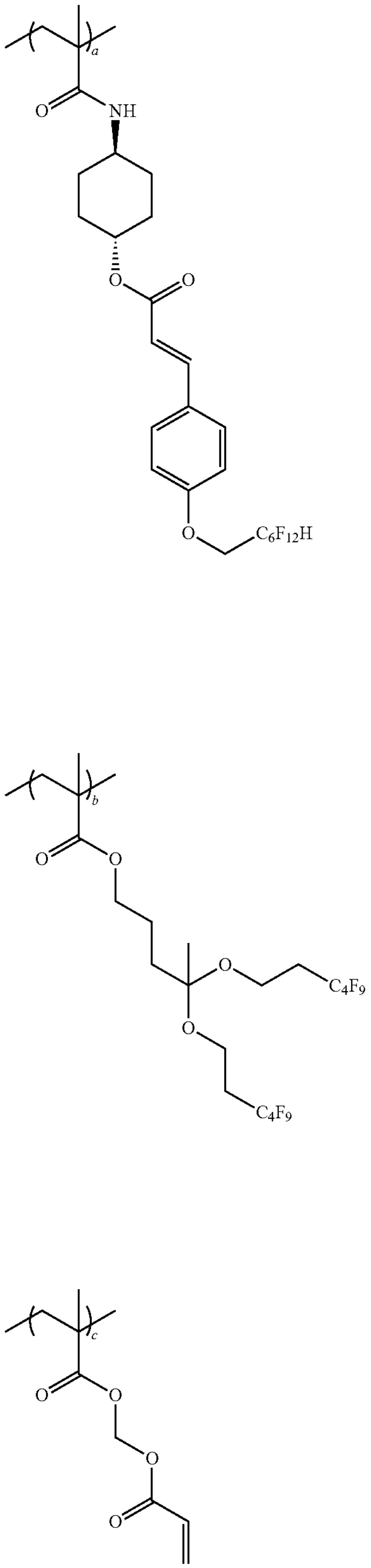
Polymer P-7
(in the following formula, a to c are a:b:c=26:20:54, and indicate the content of each repeating unit with respect to all repeating units in the polymer)
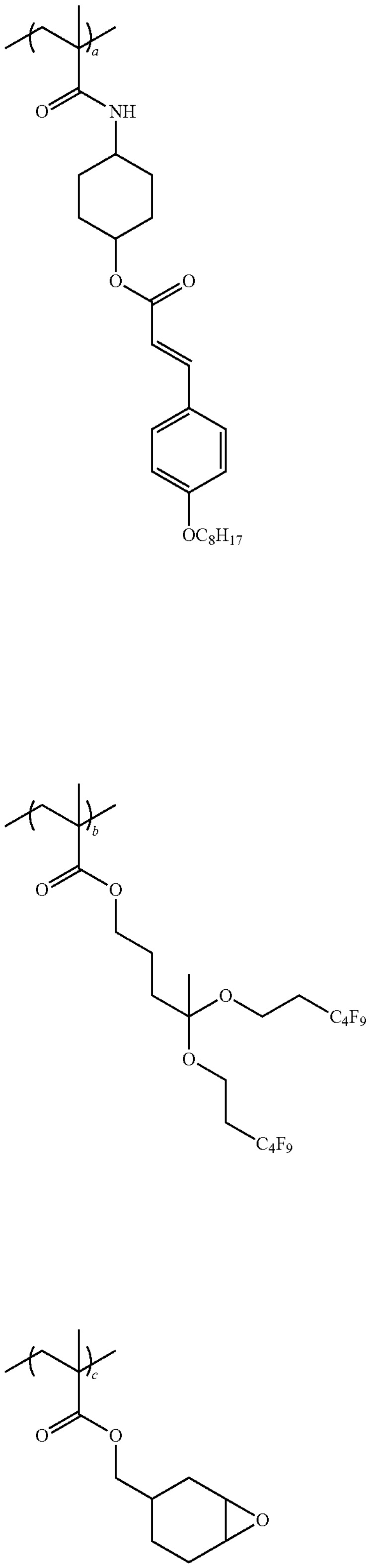
Polymer H-1
(in the following formula, a to c are a:b:c=50:30:20, and indicate the content of each repeating unit with respect to all repeating units in the polymer)

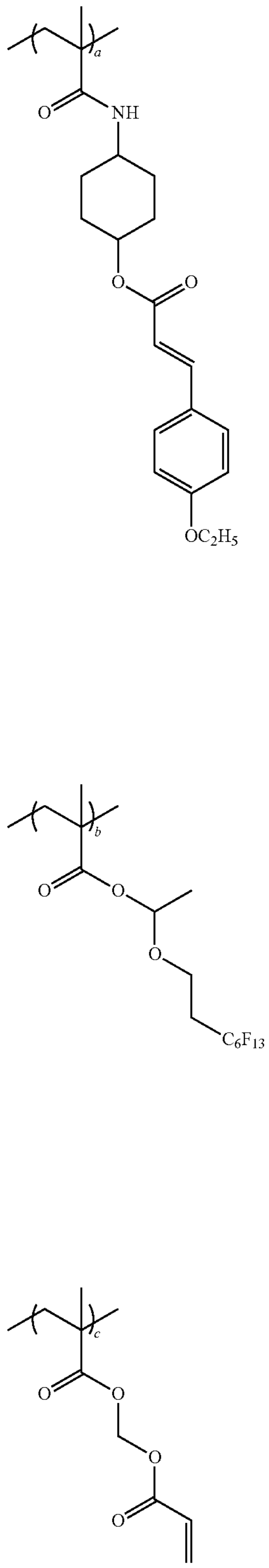

Polymer H-2

(in the following formula, a to c are a:b:c=25:40:35, and indicate the content of each repeating unit with respect to all repeating units in the polymer)

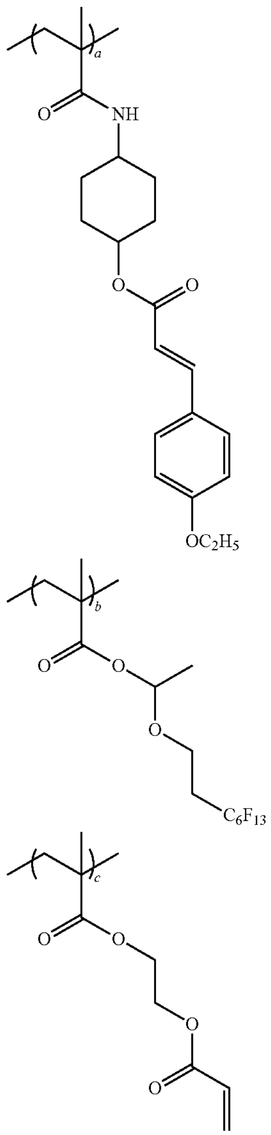

Weight-average molecular weights of the polymers P-1 to P-7, H-1, and H-2 synthesized in Examples 1 to 7 and Comparative Examples 1 and 2 were measured by the method described above. The results are shown in Table 1.

Example 1 (Production of Optical Laminate)

As a support, a cellulose acylate film (ZRD40, manufactured by FUJIFILM Corporation) was prepared. As a composition for forming a binder layer, the following rod-like liquid crystal compound A (83 parts by mass), the following rod-like liquid crystal compound C (15 parts by mass), the following rod-like liquid crystal compound D (2 parts by mass), urethane acrylate (EBECRYL1290, manufactured by DAICEL-ALLNEX LTD.) (4 parts by mass), a photopolymerization initiator (IRGACURE OXE 01, manufactured by BASF) (4.0 parts by mass), the following photo-acid generator B (3.0 parts by mass), the following hydrophilic polymer A (2.0 parts by mass), and the above-described polymer P-1 (2.0 parts by mass) were dissolved in methyl isobutyl ketone (669 parts by mass) to prepare a composition for forming a binder layer.

The solution for forming a binder layer prepared above was applied onto the above-described support with a wire bar of #3.0. The obtained coating film was heated at 60° C. for 2 minutes and cooled to 40° C., and while purging with nitrogen so that the atmosphere had an oxygen concentration of 1.0 volume % or less, ultraviolet rays were irradiated at an irradiation amount of 500 mJ/$cm^2$ using a 365 nm UV-LED. Thereafter, the obtained film was annealed at 110° C. for 1 minute to form a binder layer. A thickness of the binder layer was 0.5 μm.

Rod-like liquid crystal compound A

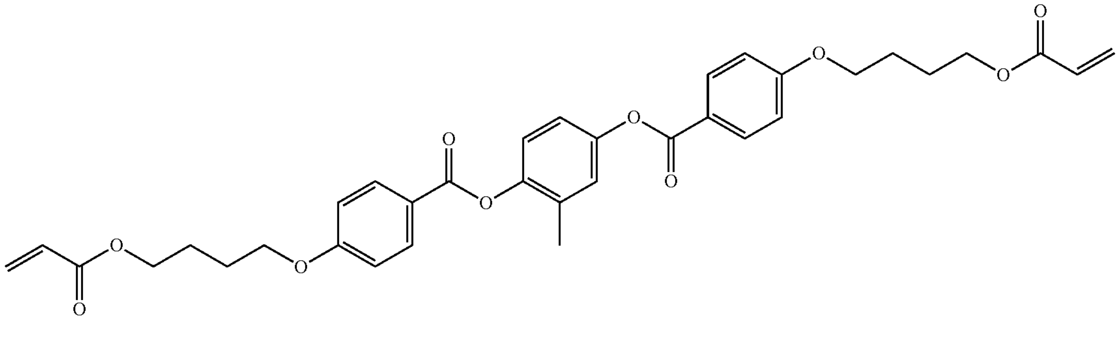

Rod-like liquid crystal compound C

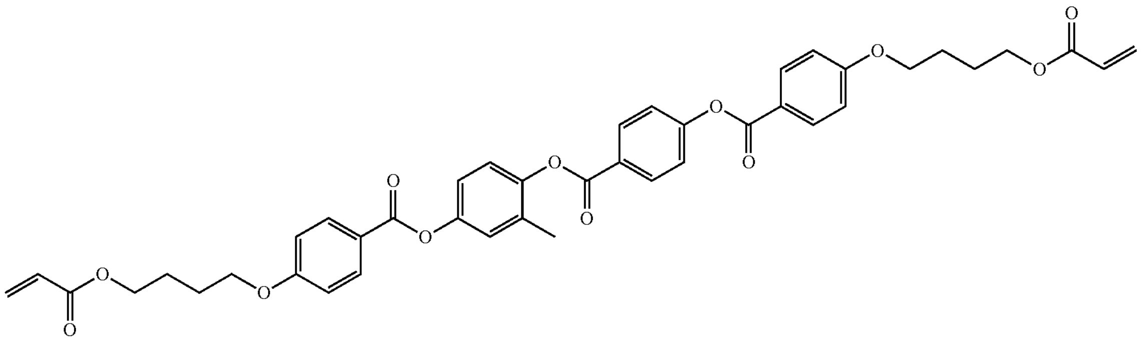

Rod-like liquid crystal compound D

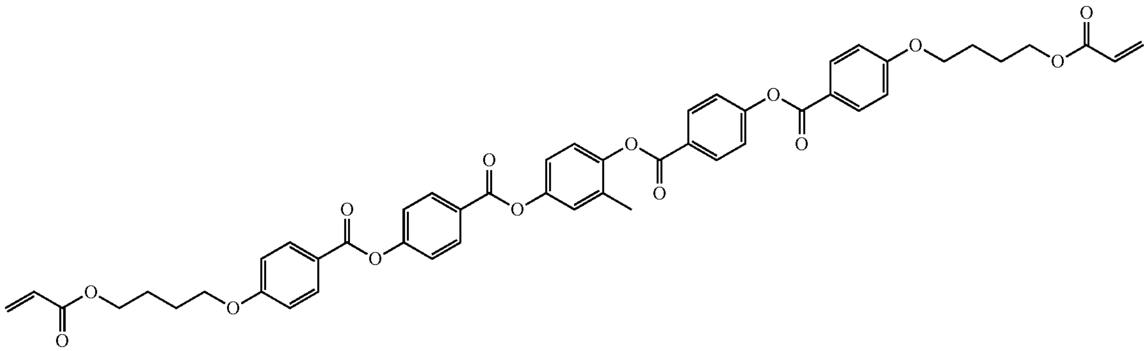

Photo-acid Generator B

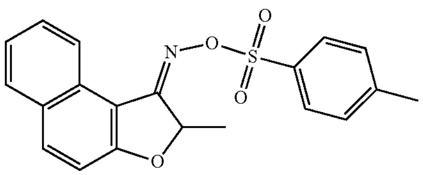

Hydrophilic Polymer A

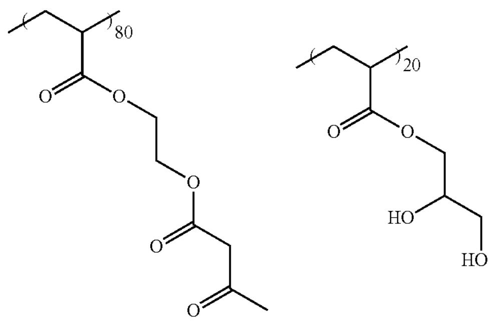

[Irradiating Step (Impartment of Alignment Function)]

The obtained binder layer was irradiated with UV light (ultra-high pressure mercury lamp; UL750; manufactured by HOYA CANDEO OPTRONICS CORPORATION) passing through a wire grid type polarizer at room temperature with 7.9 $mJ/cm^2$ (wavelength: 313 nm) to impart an alignment function.

[Formation of Optically Anisotropic Layer]

The following polymerizable liquid crystal compound A (65 parts by mass), the following polymerizable liquid crystal compound B (35 parts by mass), a photopolymerization initiator (IRGACURE 907, manufactured by BASF) (3 parts by mass), a sensitizer (KAYACURE DETX, manufactured by Nippon Kayaku Co., Ltd.), (1 part by mass), and the following horizontal alignment agent (0.09 parts by mass) were dissolved in methyl ethyl ketone (193 parts by mass) to prepare a solution for forming an optically anisotropic layer.

The above-described solution for forming an optically anisotropic layer was applied onto the above-described binder layer with a wire bar coater of #7, the obtained coating film was heated at 60° C. for 2 minutes, and while maintaining the temperature at 60° C. and purging with nitrogen so that the atmosphere had an oxygen concentration of 1.0 volume % or less, using an air-cooled metal halide lamp (manufactured by Eye Graphics Co., Ltd.) of 160 W/cm, an optically anisotropic layer (thickness: 2.5 m) was formed by irradiating with ultraviolet rays at an irradiation amount of 300 $mJ/cm^2$ to produce an optical laminate.

Examples 2 to 6 and Comparative Examples 1 and 2 (Production of Optical Laminate)

Optical laminates were produced in the same manner as in Example 1, except the polymers P-2 to P-6, H-1, and H-2 were used instead of the polymer P-1.

Example 7 (Production of Optical Laminate)

[Formation of Binder Layer]

A composition 2 for forming a binder layer having the following composition was prepared.

| | |
|---|---|
| The following liquid crystal compound R1 | 42.00 parts by mass |
| The following liquid crystal compound R2 | 42.00 parts by mass |
| The following polymerizable compound A1 | 12.00 parts by mass |
| The following polymerizable compound A2 | 4.00 parts by mass |
| The following photopolymerization initiator S1 | 0.50 parts by mass |
| SAN-AID SI-B3A | 3.00 parts by mass |
| DIPEA (KOEI CHEMICAL CO., LTD.) | 0.15 parts by mass |
| The above-described polymer P-7 | 0.23 parts by mass |
| Hisolve MTEM (manufactured by TOHO Chemical Industry Co., Ltd.) | 2.00 parts by mass |
| NK Ester A-200 (manufactured by Shin-Nakamura Chemical Co., Ltd.) | 1.00 parts by mass |
| Methyl isobutyl ketone | 300.00 parts by mass |

A group adjacent to the acryloyloxy group of the following liquid crystal compounds R1 and R2 represents a propylene group (group in which the methyl group is substituted with an ethylene group), and the following liquid crystal compounds R1 and R2 represent a mixture of regioisomers with different positions of methyl groups.

Horizontal alignment agent

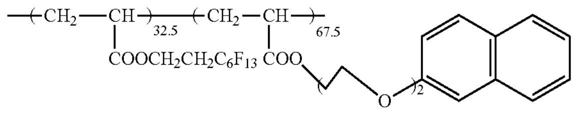

Polymerizable liquid crystal compound A

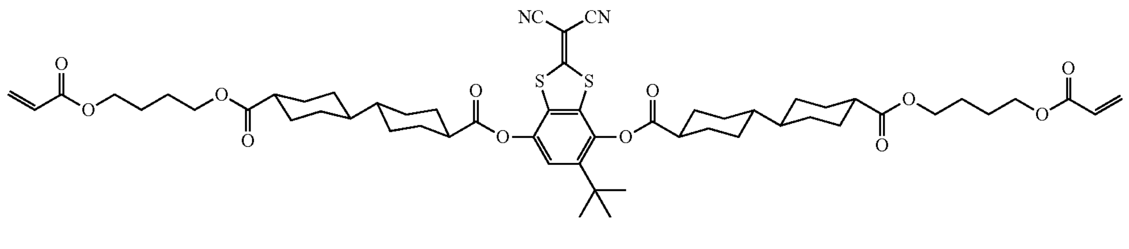

Polymerizable liquid crystal compound B

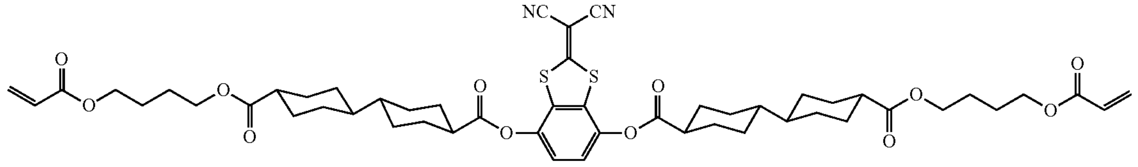

Liquid Crystal Compound R1

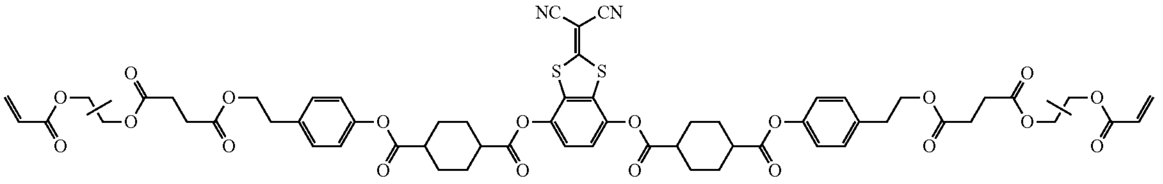

Liquid Crystal Compound R2

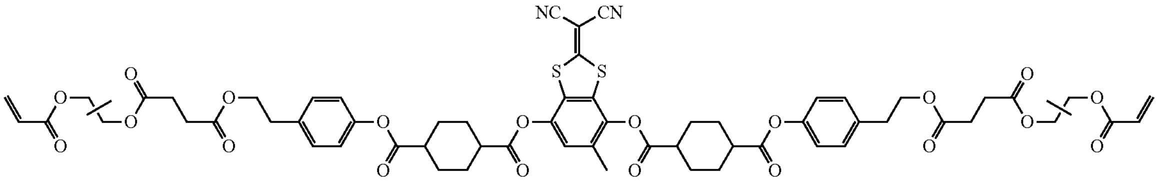

Polymerizable Compound A1

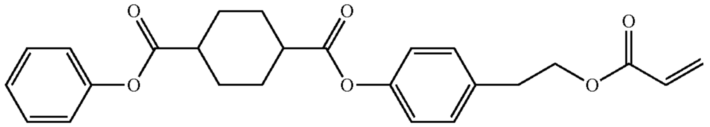

Polymerizable Compound A2

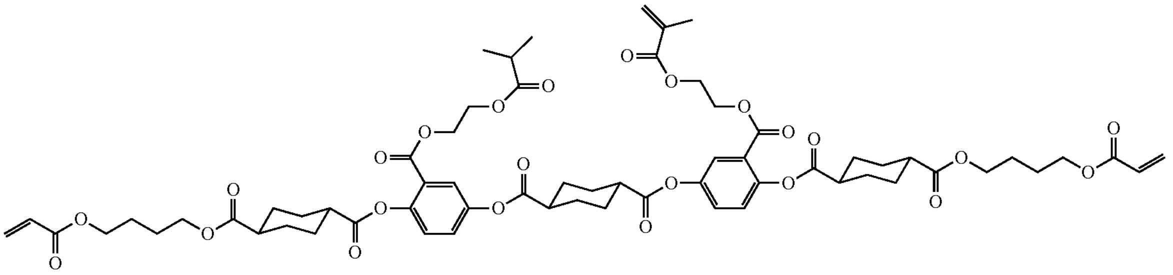

Photopolymerization Initiator S1

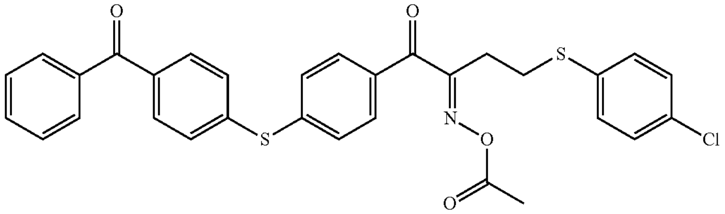

The above-described composition 2 for forming a binder layer was applied onto a cellulose acylate film (TG40UL, manufactured by FUJIFILM Corporation) with a wire bar coater of #7, and annealed at 120° C. for 1 minute to crosslink the polymer P-7. By this annealing, a cleavage group included in the repeating unit represented by the content a in the above formula was cleaved, and the cross-linking by the repeating unit represented by the content c occurred.

Thereafter, the temperature was lowered to room temperature, and a photo-alignment treatment was performed by irradiating with UV light (ultra-high pressure mercury lamp; UL750; manufactured by HOYA CANDEO OPTRONICS CORPORATION) passing through a wire grid type polarizer with 7.9 $mJ/cm^2$ (wavelength: 313 nm).

Thereafter, for alignment aging of the binder layer, after annealing again at 120° C. for 1 minute, the temperature was lowered to 60° C., and while maintaining the temperature at 60° C. and purging with nitrogen so that the atmosphere had an oxygen concentration of 100 ppm or less, ultraviolet rays were irradiated at an irradiation amount of 200 $mJ/cm^2$ using a 365 nm UV-LED to produce a binder layer 2 (thickness: 2.5 μm).

[Formation of Optically Anisotropic Layer]

A composition 2 for forming an optically anisotropic layer prepared with the following composition was applied onto the binder layer with a wire bar coater of #4.

Next, in order to dry the solvent of the composition and align and age the liquid crystal compound, the film was heated for 90 seconds with hot air at 70° C. Under a nitrogen purge, ultraviolet irradiation (300 $mJ/cm^2$) was performed at an oxygen concentration of 0.1% at 40° C. to immobilize the alignment of the liquid crystal compound, and an optically anisotropic layer 2 (thickness: 1.5 μm) was formed on the binder layer to produce an optical laminate.

Composition 2 For Forming Optically Anisotropic Layer

| | |
|---|---|
| The above-described liquid crystal compound R1 | 10.0 parts by mass |
| The above-described liquid crystal compound R2 | 54.0 parts by mass |

-continued

| | |
|---|---|
| The following liquid crystal compound R3 | 28.0 parts by mass |
| The above-described polymerizable compound A2 | 8.0 parts by mass |
| The following compound B1 | 4.5 parts by mass |
| A-600 (Shin-Nakamura Chemical Co., Ltd.) | 12.0 parts by mass |
| The above-described photopolymerization initiator S1 | 3.0 parts by mass |
| The following leveling agent P2 | 0.16 parts by mass |
| The following leveling agent P3 | 0.20 parts by mass |
| Methyl ethyl ketone | 225.0 parts by mass |
| Methanol | 12.5 parts by mass |
| Isopropanol | 12.5 parts by mass |

Liquid Crystal Compound R3

Mixture of the following liquid crystal compounds (RA), (RB), and (RC) at 83:15:2 (mass ratio) (Me represents a methyl group)

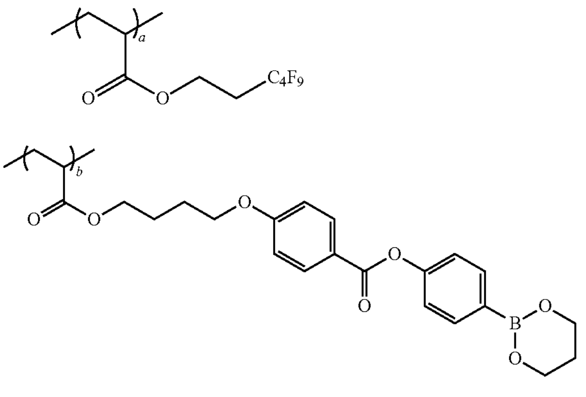

(RA)

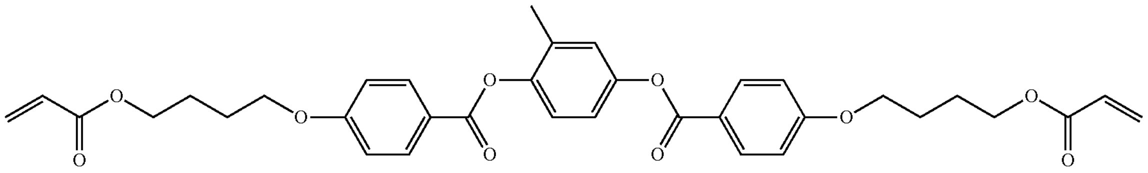

(RB)

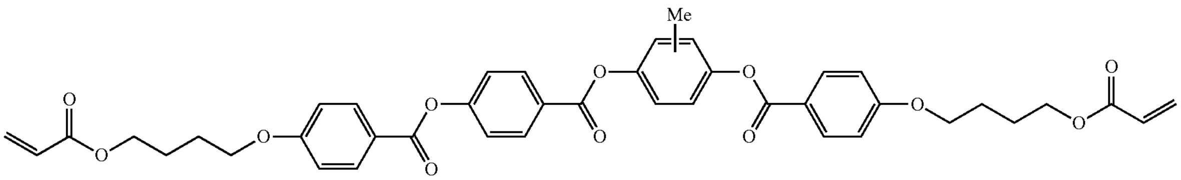

(RC)

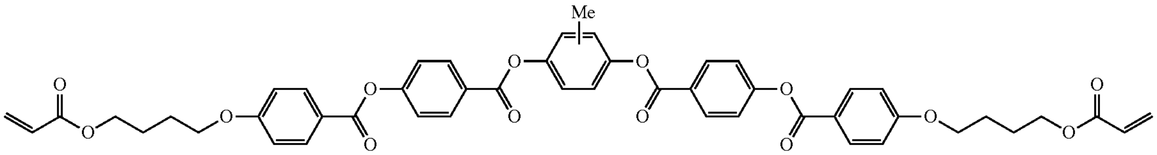

Compound B1

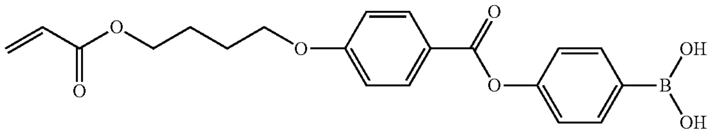

Leveling Agent P2 (weight-average molecular weight: 15000; numerical value in the following formula is mass %)

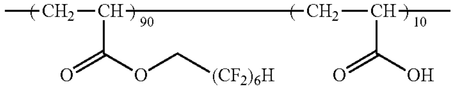

Leveling Agent P3 (weight-average molecular weight: 11,200)

(in the following formula, a to d are a:b:c:d=56:10:29:5, and indicates the content (mol %) of each repeating unit with respect to all repeating units in the polymer)

-continued

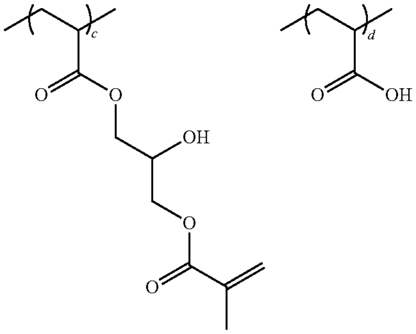

Example 8 (Production of Optical Laminate)

An optical laminate having an optically anisotropic layer formed on a binder layer was produced in the same manner as in Example 7, except that the liquid crystal compounds R1 and R2 in the composition 2 for forming a binder layer and the composition 2 for forming an optically anisotropic layer were changed to the following liquid crystal compound Z1, the polymerizable compounds A1 and A2 in the composition 2 for forming a binder layer were changed to the following polymerizable compound A3, and the polymerizable compound A2 in the composition 2 for forming an optically anisotropic layer was changed to the following polymerizable compound A3.

-continued

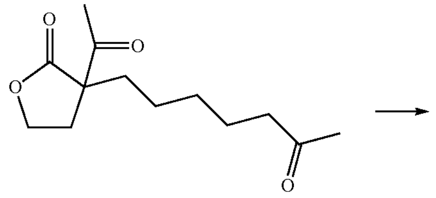

mB-19b

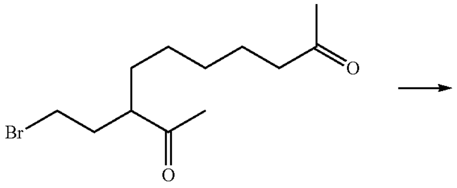

mB-19c

Liquid Crystal Compound Z1

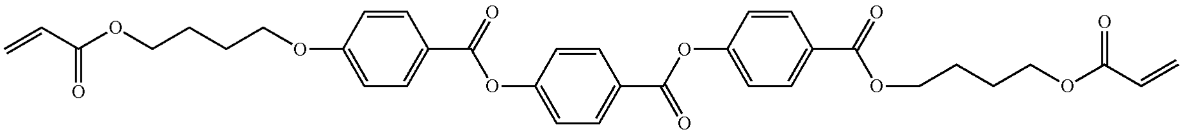

Polymerizable Compound A3

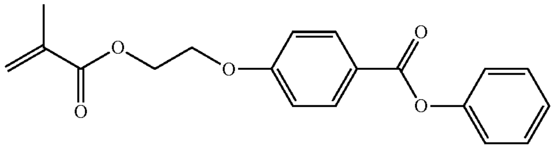

Example 9

[Synthesis of Polymer P-8]

A polymer P-8 was synthesized in the same manner as the polymer P-1 synthesized in Example 1, except that monomers forming repeating units described in Table 1 below were used instead of the various monomers used in Example 1, and contents described in Table 1 below were blended.

[Production of Optical Laminate]

An optical laminate was produced in the same manner as in Example 1, except the polymer P-8 was used instead of the polymer P-1.

Example 10

[Synthesis of Monomer mB-19]

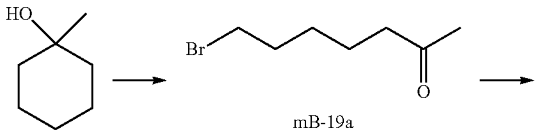

mB-19a

-continued

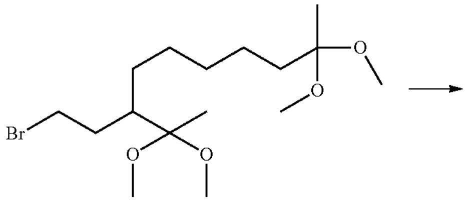

mB-19d

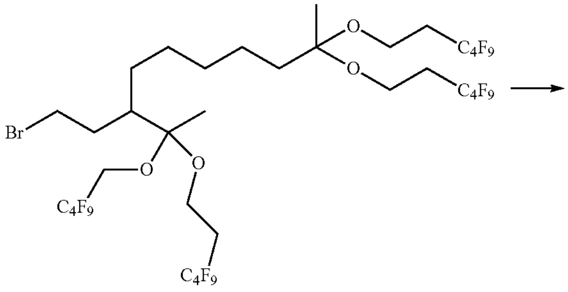

mB-19e

-continued

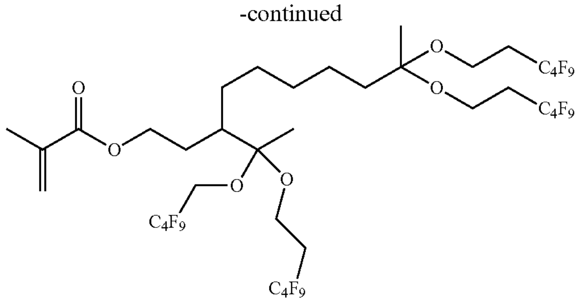

mB-19

<Synthesis of mB-19a>

50 g of 1-methylcyclohexanol, 91 g of potassium carbonate, and 150 mL of chloroform were weighed into a 500 mL three-neck eggplant flask, and while stirring in an ice bath, 91 g of bromine diluted with 70 mL of chloroform was added dropwise thereto over 80 minutes. After completion of the dropwise addition, the reaction solution was stirred in a water bath for 2 hours, and 100 mL of saturated sodium thiosulfate water was added thereto to terminate the reaction. Subsequently, the aqueous layer was removed, and the obtained organic layer was dried over anhydrous magnesium sulfate and concentrated to obtain 83 g of mB-19a in the above-described scheme as a colorless liquid (yield: 99%).

<Synthesis of mB-19b>

2 g of 2-acetylbutyrolactone, 4.4 g of mB-19a, 1.7 g of potassium carbonate, and 10 mL of dimethylformamide were weighed into a 100 mL three-neck eggplant flask and stirred at 80° C. for 6 hours. After allowing the mixture to cool to room temperature, 50 mL of water was added thereto to terminate the reaction. Subsequently, 20 mL of hexane was added thereto, the aqueous layer was removed, and the obtained organic layer was dried over anhydrous magnesium sulfate, concentrated, and purified with a silica gel column to obtain 7 g of mB-19b in the above-described scheme as a colorless liquid.

<Synthesis of mB-19c>

7 g of mB-19b, 10 g of toluene, and 4 g of hydrobromic acid aqueous solution were weighed into a 50 mL one-neck eggplant flask and stirred at 70° C. for 2 hours. After allowing the mixture to cool to room temperature, 50 mL of water was added thereto to terminate the reaction. Subsequently, 20 mL of hexane was added thereto, the aqueous layer was removed, and the obtained organic layer was dried over anhydrous magnesium sulfate, concentrated, and purified with a silica gel column to obtain 0.9 g of mB-19c in the above-described scheme as a colorless liquid (yield: 20%).

<Synthesis of mB-19d>

0.9 g of mB-19c, 0.83 g of trimethyl orthogeate, 19 mg of p-toluenesulfonic acid monohydrate, and 3 mL of methanol were weighed into a 50 mL one-neck eggplant flask and stirred at room temperature for 1 hour. After allowing the mixture to cool to room temperature, 1 mL of diisopropylethylamine was added thereto to terminate the reaction. Subsequently, 30 mL of saturated aqueous sodium bicarbonate was added thereto, 20 mL of hexane was added thereto, the aqueous layer was removed, and the obtained organic layer was dried over anhydrous magnesium sulfate and concentrated to obtain 1.2 g of mB-19d in the above-described scheme as a colorless liquid (yield: 100%).

<Synthesis Step of mB-19e>

15 g of mB-19d, 75 g of 2-(perfluorobutyl)ethanol (Unimatec), 189 mg of (+)-10-camphorsulfonic acid, and 100 mL of hexane were weighed into a 300 mL three-neck eggplant flask, and the mixture was heated at 72° C. for 30 minutes while flowing nitrogen at 30 mL/min and stirring. Subsequently, the external temperature was raised to 77° C., hexane was added dropwise thereto at a flow rate of 1.7 mL/min for 5 hours using a dropping pump, and the reaction solution was stirred for 1 hour after completion of the dropwise addition. All the solvent volatilized during the reaction was distilled off using a Dean-Stark tube. 2 mL of diisopropylethylamine was added thereto to terminate the reaction, the mixture was cooled to room temperature, diluted with 500 mL of hexane, and separately washed twice with 300 mL of acetonitrile/water/triethylamine (5/1/0.005), and the obtained organic layer was dried over anhydrous magnesium sulfate, concentrated, and purified with a silica gel column to obtain 12 g of mB-19e in the above-described scheme as a colorless liquid (yield: 18%).

<Synthesis of mB-19>

12 g of mB-19e, 1.2 g of sodium methacrylate (MCC Unitech), 122 mg of potassium iodide, 12 mg of dibutylhydroxytoluene, and 7 mL of dimethylacetamide were weighed into a 2000 mL three-neck eggplant flask and heated at 85° C. for 8 hours while stirring. After cooling to room temperature, the reaction solution was diluted with 100 mL of hexane and separately washed with 150 mL of ion exchange water, the obtained organic layer was dried over anhydrous magnesium sulfate, concentrated, and purified with a silica gel column to obtain 8.4 g of mB-19 in the above-described scheme as a colorless liquid (yield: 80%).

[Synthesis of Polymer P-9]

<Preparation of Flask Reaction Container>

Toluene (55.6 parts by mass) as a solvent, the following monomer mA-18 (10.0 parts by mass), the following monomer mB-19 (4.67 parts by mass), and the following monomer mC-4Cl (9.17 parts by mass) were put into a flask equipped with a cooling pipe, a thermometer, and a stirrer, and the mixture was heated to 70° C. with water bath heating while flowing nitrogen through the flask at 30 mL/min.

<Preparation of Dropping Liquid (Measuring Cylinder)>

The monomer mB-19 (2.33 parts by mass), the following monomer mC-4Cl (13.83 parts by mass), toluene (32.4 parts by mass) as a solvent, and 2,2'-azobis(isobutyronitrile) (0.668 parts by mass) as a polymerization initiator were added and dissolved in a measuring cylinder to prepare a dropping liquid.

Next, the prepared dropping liquid was added dropwise to the above-described flask reaction container over 120 minutes, and then the mixture was stirred while maintaining a reflux state (70° C.) for 5 hours.

mA-18

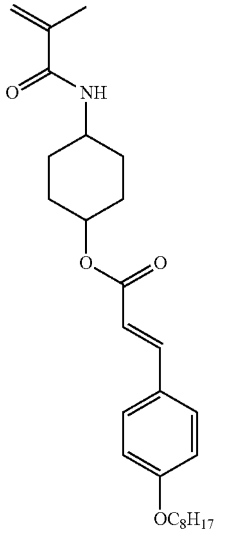

mB-19

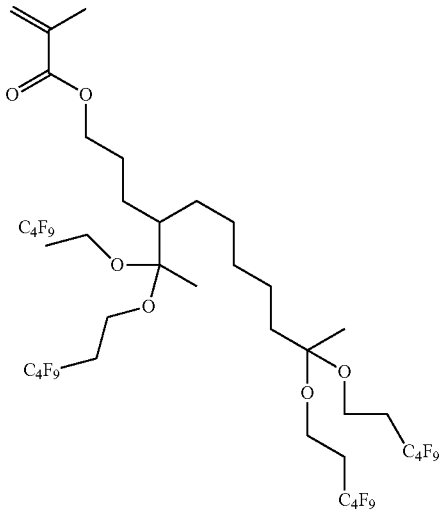

mC-4Cl

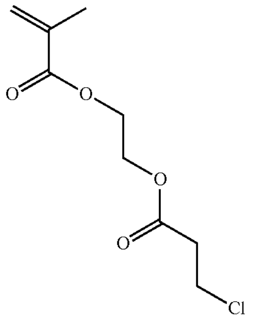

After completion of the reaction, the mixture was allowed to cool to room temperature, and acetone (8 parts by mass) was added to the obtained polymer solution to prepare a polymerization solution A. Approximately ⅓ amount of the polymerization solution A was poured into heptane (1200 mL) having an internal temperature of 20° C. over 15 to 20 minutes, the internal temperature was lowered to 0° C. to 5° C., and the remaining polymerization solution A (approximately ⅔) was added dropwise thereto over 30 to 40 minutes. Furthermore, after stirring at an internal temperature of 5° C. for 10 minutes, the precipitated polymer was separated by filtration, washed with heptane (200 mL) cooled to 5° C. or lower, and vacuum-dried at 40° C. for 6 hours to obtain a copolymer P-9c having the following repeating unit A-18, repeating unit B-19, and repeating unit C-4Cl.

P-9c

A-18

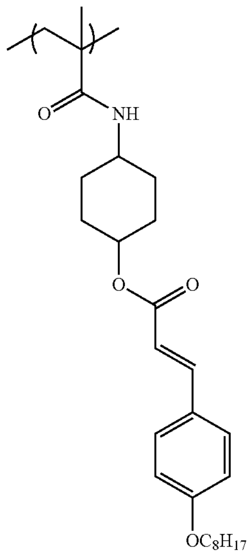

B-19

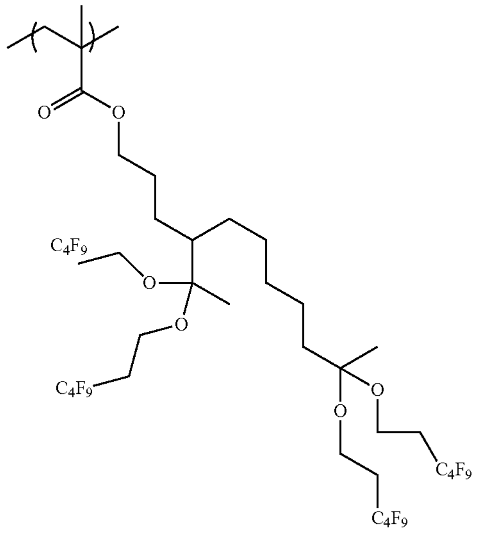

C-4Cl

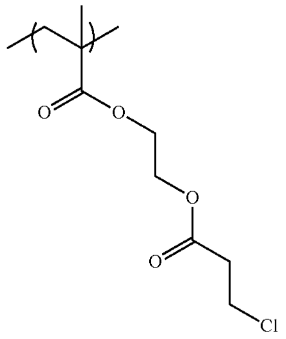

<Synthesis of Polymer P-9>

Subsequently, 4-methoxyphenol (0.013 parts by mass) and dimethylacetamide (9.25 parts by mass) were poured into a flask equipped with a cooling pipe, a thermometer, and a stirrer, the mixture was heated to 40° C. to 45° C. with water bath heating, and the copolymer P-9c (6.5 parts by mass) was added thereto in three portions (dissolution was confirmed in each portion). Furthermore, the internal temperature was raised to 60° C., triethylamine (5.72 parts by mass) was added dropwise thereto over 10 to 15 minutes, and the mixture was stirred for 2 hours.

After completion of the reaction, the mixture was allowed to cool to room temperature (30° C. or lower), acetone (9.75 parts by mass) was added thereto, the precipitated triethylamine hydrochloride was filtered off, a filter cake on Nutsche was spray-washed with acetone (6.50 parts by mass), and the obtained filtrate was poured into methanol/water (volume ratio: 3/2, 280 mL) cooled to 5° C. or lower over 15 to 30 minutes to precipitate a polymer. Thereafter, the collected precipitate was filtered and washed with water (150 mL) cooled to 5° C. or lower.

The obtained crude crystals were poured into methanol/water (volume ratio: 7/3, 280 mL) having an internal temperature of 15° C. to 19° C. and stirred for 60 minutes (hereinafter, this operation is also abbreviated as "reslurry" in this paragraph), and the collected precipitate was filtered and washed with water (100 mL) cooled to 5° C. or lower. Further, the above-described reslurry was repeated.

Subsequently, the obtained crude crystals were poured into methanol/water (volume ratio: 7/3, 280 mL) having an internal temperature of 15° C. to 19° C. and stirred for 60 minutes, and the collected precipitate was filtered and washed with methanol/water (volume ratio: 7/3, 100 mL) cooled to 5° C. or lower. The obtained polymer was vacuum-dried at 40° C. for 6 hours to obtain a polymer P-9 represented by the following formula.

P-9

A-18

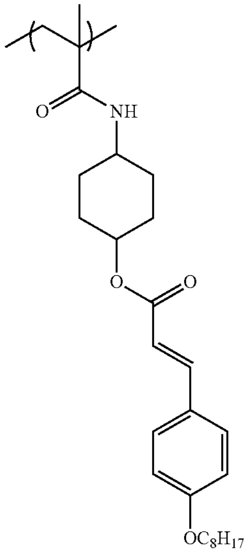

-continued

B-19

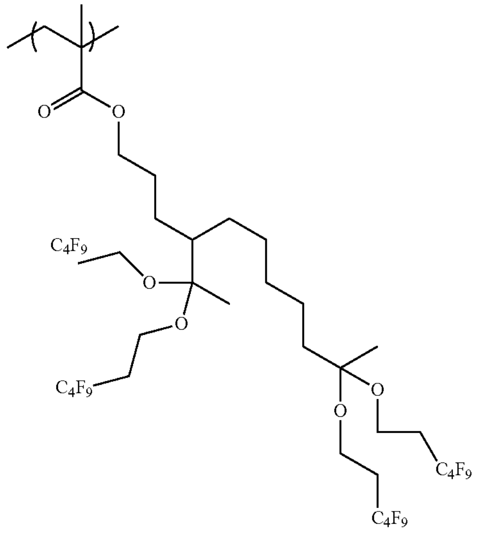

C-4Cl

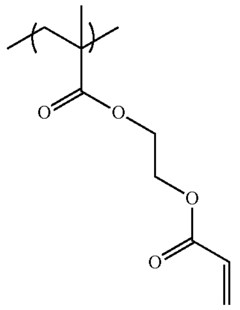

[Production of Optical Laminate]

An optical laminate was produced in the same manner as in Example 1, except the polymer P-9 was used instead of the polymer P-1.

Example 11

[Synthesis of Polymer P-1 (another method 1)]

Toluene (72.9 parts by mass) as a solvent, the following monomer mA-18 (10.20 parts by mass), the following monomer mB-4 (13.86 parts by mass), the following monomer mC-4Cl (16.60 parts by mass), and 2,2'-azobis(isobutyronitrile) (0.668 parts by mass) as a polymerization initiator were put into a flask equipped with a cooling pipe, a thermometer, and a stirrer, and the mixture was stirred for 7 hours while maintaining a reflux state with water bath heating and flowing nitrogen through the flask at 30 mL/min.

mA-18

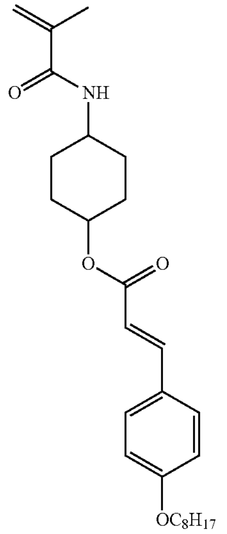

mB-4

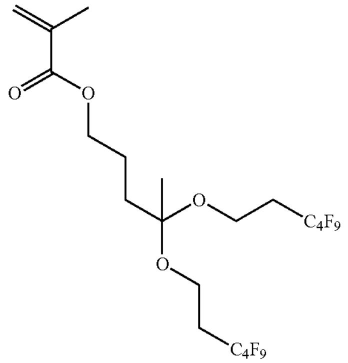

mC-4Cl

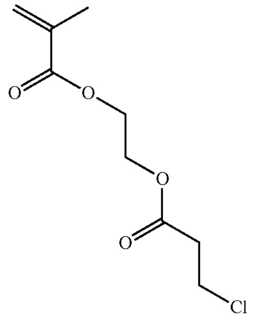

After completion of the reaction, the mixture was allowed to cool to room temperature, and acetone (8 parts by mass) was added to the obtained polymer solution to prepare a polymerization solution A. Approximately ⅓ amount of the polymerization solution A was poured into heptane (1200 mL) having an internal temperature of 20° C. over 15 to 20 minutes, the internal temperature was lowered to 0° C. to 5° C., and the remaining polymerization solution A (approximately ⅔) was added dropwise thereto over 30 to 40 minutes. Furthermore, after stirring at an internal temperature of 5° C. for 10 minutes, the precipitated polymer was separated by filtration, washed with heptane (200 mL) cooled to 5° C. or lower, and vacuum-dried at 40° C. for 6 hours to obtain a copolymer P-1c having the following repeating unit A-18, repeating unit B-4, and repeating unit C-4Cl.

P-1c

A-18

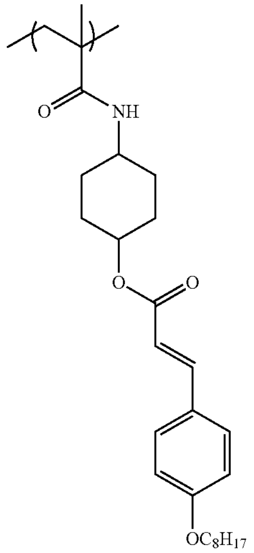

B-4

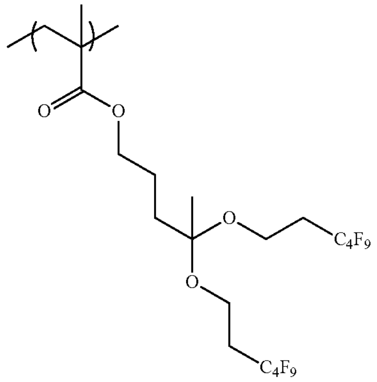

C-4Cl

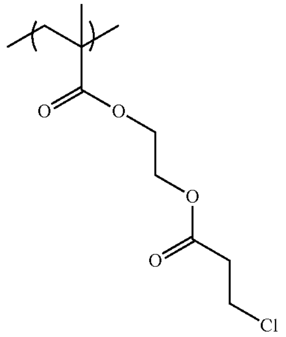

<Synthesis of Polymer P-1>

Subsequently, 4-methoxyphenol (0.013 parts by mass) and dimethylacetamide (9.25 parts by mass) were poured into a flask equipped with a cooling pipe, a thermometer, and a stirrer, the mixture was heated to 40° C. to 45° C. with water bath heating, and the copolymer P-1c (6.5 parts by mass) was added thereto in three portions (dissolution was confirmed in each portion). Furthermore, the internal temperature was raised to 60° C., triethylamine (5.72 parts by mass) was added dropwise thereto over 10 to 15 minutes, and the mixture was stirred for 2 hours.

After completion of the reaction, the mixture was allowed to cool to room temperature (30° C. or lower), acetone (9.75 parts by mass) was added thereto, the precipitated triethylamine hydrochloride was filtered off, a filter cake on Nutsche was spray-washed with acetone (6.50 parts by mass), and the obtained filtrate was poured into methanol/water (volume ratio: 3/2, 280 mL) cooled to 5° C. or lower over 15 to 30 minutes to precipitate a polymer. Thereafter, the collected precipitate was filtered and washed with water (150 mL) cooled to 5° C. or lower.

The obtained crude crystals were poured into methanol/water (volume ratio: 7/3, 280 mL) having an internal temperature of 15° C. to 19° C. and stirred for 60 minutes (hereinafter, this operation is also abbreviated as "reslurry" in this paragraph), and the collected precipitate was filtered and washed with water (100 mL) cooled to 5° C. or lower. Further, the above-described reslurry was repeated.

Subsequently, the obtained crude crystals were poured into methanol/water (volume ratio: 7/3, 280 mL) having an internal temperature of 15° C. to 19° C. and stirred for 60 minutes, and the collected precipitate was filtered and washed with methanol/water (volume ratio: 7/3, 100 mL) cooled to 5° C. or lower. The obtained polymer was vacuum-dried at 40° C. for 6 hours to obtain a polymer P-1 represented by the following formula.

P-1

A-18

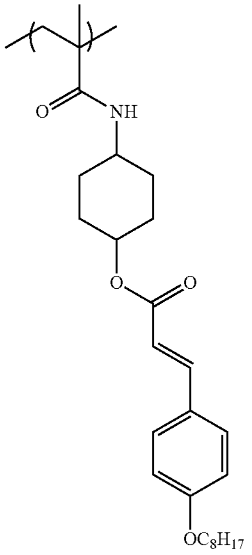

B-4

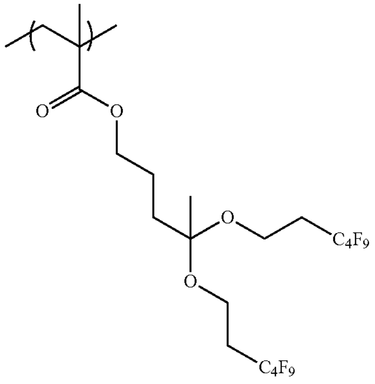

-continued

C-4

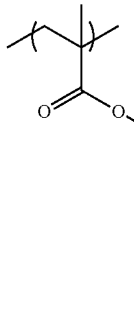

[Production of Optical Laminate]

An optical laminate was produced in the same manner as in Example 1, except the polymer P-1 synthesized by the above-described method was used instead of the polymer P-1 synthesized in Example 1.

Example 12

[Synthesis of Polymer P-1 (Another Method 2)]

<Preparation of Flask Reaction Container>

Toluene (67.7 parts by mass) as a solvent, the following monomer mA-18 (10.20 parts by mass), the following monomer mB-4 (13.86 parts by mass), and the following monomer mC-4Cl (16.60 parts by mass) were put into a flask equipped with a cooling pipe, a thermometer, and a stirrer, and the mixture was heated to 70° C. with water bath heating while flowing nitrogen through the flask at 30 mL/min.

<Preparation of Dropping Liquid (Measuring Cylinder)>

Toluene (5.2 parts by mass) as a solvent and 2,2'-azobis (isobutyronitrile) (0.668 parts by mass) as a polymerization initiator were added and dissolved in a measuring cylinder to prepare a dropping liquid.

Next, the prepared dropping liquid was added dropwise to the above-described flask reaction container over 30 minutes, and then the mixture was stirred while maintaining a reflux state (70° C.) for 6 hours and 30 minutes.

mA-18

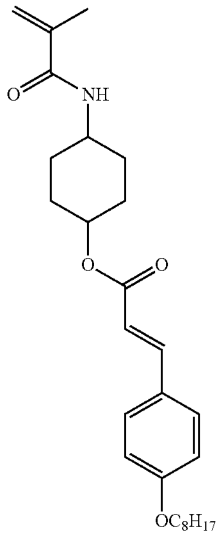

-continued mB-4

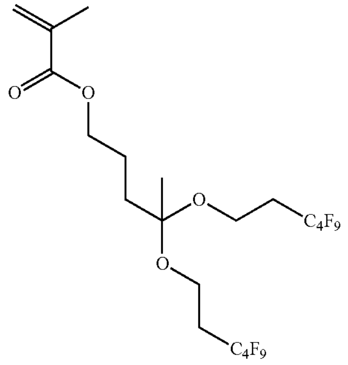

mC-4Cl

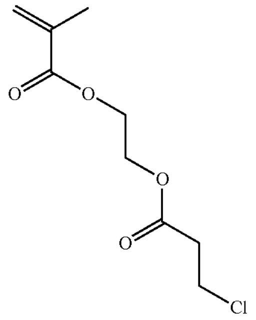

After completion of the reaction, the mixture was allowed to cool to room temperature, and acetone (8 parts by mass) was added to the obtained polymer solution to prepare a polymerization solution A. Approximately ⅓ amount of the polymerization solution A was poured into heptane (1200 mL) having an internal temperature of 20° C. over 15 to 20 minutes, the internal temperature was lowered to 0° C. to 5° C., and the remaining polymerization solution A (approximately ⅔) was added dropwise thereto over 30 to 40 minutes. Furthermore, after stirring at an internal temperature of 5° C. for 10 minutes, the precipitated polymer was separated by filtration, washed with heptane (200 mL) cooled to 5° C. or lower, and vacuum-dried at 40° C. for 6 hours to obtain the following polymer P-1c having the above-described repeating unit A-18, repeating unit B-4, and repeating unit C-4Cl.

Subsequent procedures were the same as in Example 11 to synthesize the polymer P-1.

[Production of Optical Laminate]

An optical laminate was produced in the same manner as in Example 1, except the polymer P-1 synthesized by the above-described method was used instead of the polymer P-1 synthesized in Example 1.

Example 13

[Synthesis of Polymer P-1 (Another Method 3)]

<Preparation of Flask Reaction Container>

Toluene (55.6 parts by mass) as a solvent, the following monomer mA-18 (10.30 parts by mass), the following monomer mB-4 (9.4 parts by mass), and the following monomer mC-4Cl (6.5 parts by mass) were put into a flask equipped with a cooling pipe, a thermometer, and a stirrer, and the mixture was heated to 70° C. with water bath heating while flowing nitrogen through the flask at 30 mL/min.

<Preparation of Dropping Liquid (Measuring Cylinder)>

The monomer mB-4 (4.7 parts by mass), the following monomer mC-4Cl (9.8 parts by mass), toluene (32.4 parts by mass) as a solvent, and 2,2'-azobis(isobutyronitrile) (0.668 parts by mass) as a polymerization initiator were added and dissolved in a measuring cylinder to prepare a dropping liquid.

Next, the prepared dropping liquid was added dropwise to the above-described flask reaction container over 120 minutes, and then the mixture was stirred while maintaining a reflux state (70° C.) for 5 hours.

mA-18

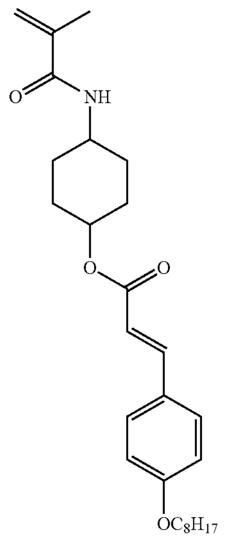

mB-4

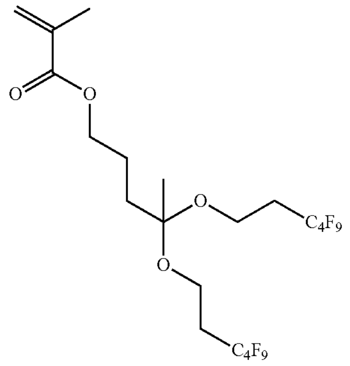

mC-4Cl

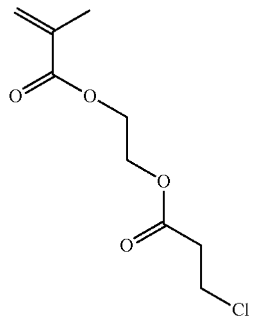

After completion of the reaction, the mixture was allowed to cool to room temperature, and acetone (8 parts by mass) was added to the obtained polymer solution to prepare a polymerization solution A. Approximately ⅓ amount of the polymerization solution A was poured into heptane (1200 mL) having an internal temperature of 20° C. over 15 to 20 minutes, the internal temperature was lowered to 0° C. to 5° C., and the remaining polymerization solution A (approximately ⅔) was added dropwise thereto over 30 to 40 minutes. Furthermore, after stirring at an internal temperature of 5° C. for 10 minutes, the precipitated polymer was separated by filtration, washed with heptane (200 mL) cooled to 5° C. or lower, and vacuum-dried at 40° C. for 6 hours to obtain the copolymer P-1c having the above-described repeating unit A-18, repeating unit B-4, and repeating unit C-4Cl.

Subsequent procedures were the same as in Example 11 to synthesize the polymer P-1.

[Production of Optical Laminate]

An optical laminate was produced in the same manner as in Example 1, except the polymer P-1 synthesized by the above-described method was used instead of the polymer P-1 synthesized in Example 1.

[Evaluation]

[Liquid Crystal Alignment Properties]

Two polarizing plates were arranged in crossed nicols, and the obtained optical laminate was disposed therebetween to observe the degree of light leakage and to observe the surface state with a polarization microscope. The results are shown in Table 1.

B: there was no light leakage, there was partial disorder of liquid crystal directors, and the surface state was stable.

C: there was no light leakage, but the surface state was not stable due to disorder of liquid crystal directors.

D: light leakage was observed, and the surface state was not stable due to disorder of liquid crystal directors.

[Suppression of Air Unevenness]

Two polarizing plates were placed on crossed nicols, a sample of the produced binder layer was placed between the two polarizing plates, and the presence or absence of streak-like unevenness was observed to evaluate suppression of air unevenness according to the following standard. The results are shown in Table 1.

<Evaluation Standard>

A: unevenness was invisible.

B: unevenness was almost invisible.

C: unevenness was visible.

[Upper Layer Coating Properties]

With regard to the produced binder layer, a surface region of A4 size was inspected, and a failure which appeared to be missing in a circular shape or an elliptical shape was regarded as a cissing, and upper layer coating properties were evaluated according to the following standard.

The results are shown in Table 1.

<Evaluation Standard>

A: 0 or 1 failure was observed.

B: 2 to 4 failures were observed.

C: 5 or more failures were observed.

TABLE 1

| | | Repeating unit | | | Content※ | | | Weight-average molecular | Polymerization | Liquid crystal alignment | Suppression of air | Upper layer coating |
|---|---|---|---|---|---|---|---|---|---|---|---|---|
| | Polymer | A | B | C | a | b | c | weight | method | properties | unevenness | properties |
| Example 1 | P-1 | A-18 | B-4 | C-4 | 25 | 40 | 35 | 80000 | Batch polymerization method | AA | A | A |
| Example 2 | P-2 | A-18 | B-6 | C-4 | 25 | 35 | 40 | 90000 | Batch polymerization method | AA | A | A |
| Example 3 | P-3 | A-18 | B-8 | C-4 | 25 | 35 | 40 | 70000 | Batch polymerization method | AA | A | A |
| Example 4 | P-4 | A-18 | B-11 | C-4 | 25 | 30 | 45 | 50000 | Batch polymerization method | AA | A | A |
| Example 5 | P-5 | A-18 | B-12 | C-4 | 25 | 30 | 45 | 90000 | Batch polymerization method | AA | A | A |
| Example 6 | P-6 | A-30 | B-4 | C-4 | 15 | 40 | 45 | 100000 | Batch polymerization method | AA | A | A |
| Example 7 | P-7 | A-18 | B-4 | C-2 | 26 | 20 | 54 | 80000 | Batch polymerization method | AA | A | A |
| Example 8 | P-7 | A-18 | B-4 | C-2 | 26 | 20 | 54 | 80000 | Batch polymerization method | AA | A | A |
| Example 9 | P-8 | — | B-4 | C-4 | 0 | 50 | 50 | 50000 | Batch polymerization method | — | A | A |
| Example 10 | P-9 | A-18 | B-19 | C-4 | 25 | 18 | 57 | 80000 | Dropping method B | AA | A | A |
| Example 11 | P-1 | A-18 | B-4 | C-4 | 26 | 37 | 37 | 40000 | Batch polymerization method (solvent change) | AA | A | A |
| Example 12 | P-1 | A-18 | B-4 | C-4 | 25 | 36 | 39 | 50000 | Dropping method A | AA | A | A |
| Example 13 | P-1 | A-18 | B-4 | C-4 | 27 | 38 | 35 | 60000 | Dropping method B | AA | A | A |
| Comparative Example 1 | H-1 | A-2 | B0-1 | C-4 | 50 | 30 | 20 | 50000 | Batch polymerization method | D | A | B |
| Comparative Example 2 | H-2 | A-2 | B0-2 | C-4 | 25 | 40 | 35 | 70000 | Batch polymerization method | D | A | C |

※The content of the "repeating unit A" is defined as a, the content of the "repeating unit B" is defined as b, and the content at the "repeating unit C" is defined as c.

AA: there was no light leakage, liquid crystal directors were uniformly oriented and aligned, and the surface state was very stable.

A: there was no light leakage, there was no disorder of liquid crystal directors, and the surface state was stable.

From the results shown in Table 1, it was found that, in a case where the polymer having no specific cleavage group was used, although there was an effect of suppressing air unevenness, the upper layer coating properties were deteriorated and the liquid crystal alignment properties were also deteriorated (Comparative Examples 1 and 2).

On the other hand, it was found that, in a case where the polymer having a specific cleavage group was used, the air unevenness could be suppressed and the upper layer coating properties and the liquid crystal alignment properties were improved (Examples 1 to 8 and Examples 10 to 13). In addition, it was found that, even in a case where the polymer which had the specific cleavage group and did not have the repeating unit A (photo-aligned group) was used, the air unevenness could be suppressed and the upper layer coating properties were improved (Example 9).

Example B

[Synthesis of Monomer mB-4 (Another Method)]

A monomer mB-4 represented by Formula mB-4 was synthesized according to the following scheme.

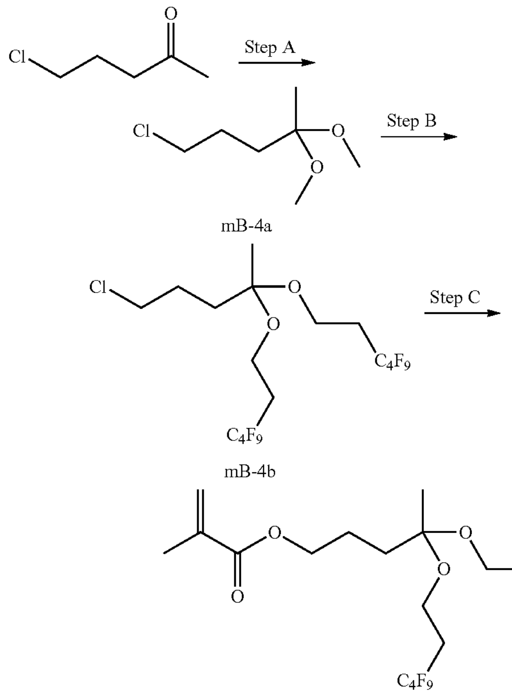

mB-4

<Step A>

300 g of 5-chloro-2-pentanone (Manchester Organics Ltd.), 2.89 g of (+)-10-camphorsulfonic acid, and 120 mL of methanol were weighed into a 2000 mL three-neck eggplant flask, and 277 g of trimethyl orthoformate (NIPPOH CHEMICALS CO., LTD.) was added dropwise thereto over 30 minutes while stirring in a water bath. After completion of the dropwise addition, the reaction solution was stirred in a water bath for 1 hour, and 15 mL of diisopropylethylamine was added thereto to terminate the reaction. Subsequently, methyl formate was distilled off under a reduced pressure of 100 mmHg, the resultant was diluted with 1200 mL of hexane and separately washed twice with 800 mL of solvent-saturated sodium hydrogen carbonate water, and the obtained organic layer was dried over anhydrous magnesium sulfate and concentrated to obtain 441 g of mB-4a in the above-described scheme as a black liquid (yield: 100%).

<Step B>

250 g of mB-4a, 911 g of 2-(perfluorobutyl)ethanol (Unimatec), 3.21 g of (+)-10-camphorsulfonic acid, and 412 mL of hexane were weighed into a 3000 mL three-neck eggplant flask, and the mixture was heated at 72° C. for 30 minutes while flowing nitrogen at 60 mL/min and stirring. Subsequently, while flowing nitrogen at 60 mL/min and keeping the internal temperature at 72° C., hexane was added dropwise thereto at a flow rate of 13.7 mL/min for 5 hours using a dropping pump, and the reaction solution was stirred for 1 hour after completion of the dropwise addition. All the solvent volatilized during the reaction was distilled off using a Dean-Stark tube. 4.6 mL of diisopropylethylamine was added thereto to terminate the reaction, the mixture was cooled to room temperature, diluted with 3300 mL of hexane, and separately washed twice with 1980 mL of acetonitrile/water/triethylamine (5/1/0.005), and the obtained organic layer was dried over anhydrous magnesium sulfate and concentrated to obtain 695 g of mB-4b in the above-described scheme as a brown liquid (yield: 79%).

<Step C>

695 g of mB-4b, 128.4 g of sodium methacrylate (MCC Unitech), 35.9 g of potassium iodide, 70 mg of dibutylhydroxytoluene, and 348 mL of dimethylacetamide were weighed into a 2000 mL three-neck eggplant flask and heated at 85° C. for 6 hours while stirring. After cooling to room temperature, the mixture was diluted with 2322 mL of hexane and separately washed with 1548 mL of ion exchange water, the obtained organic layer was dried over anhydrous magnesium sulfate, 1122 g of active alumina was added thereto, and the mixture was stirred for 10 minutes. The active alumina was removed by filtration, and the obtained solution was concentrated to obtain 592 g of mB-4 in the above-described scheme as a pale yellow liquid (yield: 79%, 98 w %).

[Performance Evaluation of Monomer]

An optical laminate was produced using mB-4 synthesized above in place of the polymer P-1 in the optical laminate of Example 1.

With regard to this optical laminate, in a case where the suppression of air unevenness and the upper layer coating properties were evaluated by the same methods, all of the evaluations were A.

What is claimed is:

1. A binder composition comprising:

a binder; and a compound having a group represented by Formula (B1) or (B2), (B1)

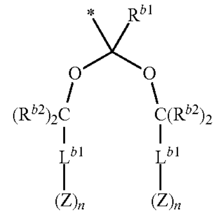

(B2)

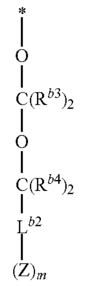

in Formulae (B1) and (B2),

* represents a bonding position, n represents an integer of 1 or more, where a plurality of n's may be the same or different from each other, m represents an integer of 2 or more, $R^{b1}$ represents a hydrogen atom or a substituent, $R^{b2}$, $R^{b3}$, and $R^{b4}$ each independently represent a hydrogen atom or a substituent, where two $R^{b3}$'s may be bonded to each other to form a ring, a plurality of $R^{b2}$'s may be the same or different from each other, a plurality of $R^{b3}$'s may be the same or different from each other, and a plurality of $R^{b4}$'s may be the same or different from each other, $L^{b1}$ represents an (n+1)-valent linking group, where a plurality of $L^{b1}$'s may be the same or different from each other, $L^{b2}$ represents an (m+1)-valent linking group, and Z represents an aliphatic hydrocarbon group having 5 to 25 fluorine atoms or an organosiloxane group, where the aliphatic hydrocarbon group may have an oxygen atom, and a plurality of Z's may be the same or different from each other.

2. The binder composition according to claim 1, further comprising:

a photo-acid generator.

3. The binder composition according to claim 1, wherein the compound is a compound further having a photo-aligned group.

4. The binder composition according to claim 1, wherein the compound is a polymer having a repeating unit B including the group represented by Formula (B1) or (B2).

5. The binder composition according to claim 4, wherein the repeating unit B is a repeating unit represented by Formula (1) or (2), (1)

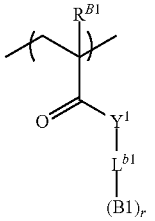

(2)

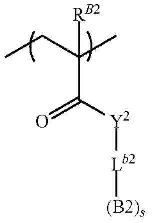

in Formulae (1) and (2), r and s each independently represent an integer of 1 or more, $R^{B1}$ and $R^{B2}$ each independently represent a hydrogen atom or a substituent, $Y^1$ and $Y^2$ each independently represent —O— or —$NR^Z$—, where $R^Z$ represents a hydrogen atom or a substituent, $L^{B1}$ represents an (r+1)-valent linking group, $L^{B2}$ represents an (s+1)-valent linking group, B1 represents the group represented by Formula (B1), in which in a case where * in Formula (B1) represents a bonding position with $L^{B1}$ and r represents an integer of 2 or more, a plurality of B1's may be the same or different from each other, and B2 represents the group represented by Formula (B2), in which in a case where * in Formula (B2) represents a bonding position with $L^{B2}$ and s represents an integer of 2 or more, a plurality of B2's may be the same or different from each other.

6. The binder composition according to claim 4, wherein the compound is a copolymer having a repeating unit A including a photo-aligned group and the repeating unit B.

7. The binder composition according to claim 6, wherein the repeating unit A is a repeating unit represented by Formula (A), (A)

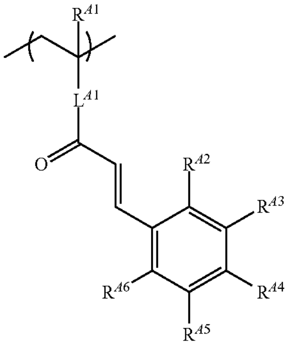

in Formula (A), $R^{A1}$ represents a hydrogen atom or a substituent, $L^{A1}$ represents a single bond or a divalent linking group, and $R^{A2}$, $R^{A3}$, $R^{A4}$, $R^{A5}$, and $R^{A6}$ each independently represent a hydrogen atom or a substituent, and two adjacent groups of $R^{A2}$, $R^{A3}$, $R^{A4}$, $R^{A5}$, and $R^{A6}$ may be bonded to each other to form a ring.

8. The binder composition according to claim 6, wherein the compound is a copolymer having a repeating unit C including a crosslinkable group, the repeating unit B, and the repeating unit A.

9. The binder composition according to claim 1, wherein a weight-average molecular weight of the compound is 10000 to 500000.

10. A compound comprising:

a group represented by Formula (B1) or (B2), (B1)

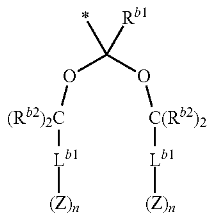

-continued (B2)

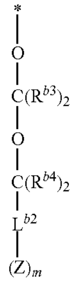

in Formulae (B1) and (B2),

* represents a bonding position, n represents an integer of 1 or more, where a plurality of n's may be the same or different from each other, m represents an integer of 2 or more, $R^{b1}$ represents a hydrogen atom or a substituent, $R^{b2}$, $R^{b3}$, and $R^{b4}$ each independently represent a hydrogen atom or a substituent, where two $R^{b3}$'s may be bonded to each other to form a ring, a plurality of $R^{b2}$'s may be the same or different from each other, a plurality of $R^{b3}$'s may be the same or different from each other, and a plurality of $R^{b4}$'s may be the same or different from each other, $L^{b1}$ represents an (n+1)-valent linking group, where a plurality of $L^{b1}$'s may be the same or different from each other, $L^{b2}$ represents an (m+1)-valent linking group, and Z represents an aliphatic hydrocarbon group having 5 to 25 fluorine atoms or an organosiloxane group, where the aliphatic hydrocarbon group may have an oxygen atom, and a plurality of Z's may be the same or different from each other.

11. The compound according to claim 10, further comprising:

a group represented by Formula (P0), $P^1$-$L^1$-* (P0)

in Formula (P0),

* represents a bonding position with * in Formula (B1) or (B2), $P^1$ represents a polymerizable group, and $L^1$ represents a divalent linking group.

12. The compound according to claim 10, wherein the compound is a polymer having a repeating unit B including the group represented by Formula (B1) or (B2).

13. The compound according to claim 12, wherein the repeating unit B is a repeating unit represented by Formula (1) or (2), (1)

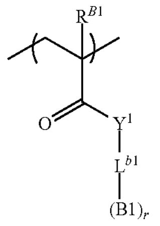

-continued (2)

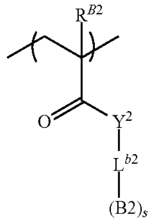

in Formulae (1) and (2), r and s each independently represent an integer of 1 or more, $R^{B1}$ and $R^{B2}$ each independently represent a hydrogen atom or a substituent, $Y^1$ and $Y^2$ each independently represent —O— or —$NR^Z$—, where $R^Z$ represents a hydrogen atom or a substituent, $L^{B1}$ represents an (r+1)-valent linking group, $L^{B2}$ represents an (s+1)-valent linking group, B1 represents the group represented by Formula (B1), in which in a case where * in Formula (B1) represents a bonding position with $L^{B1}$ and r represents an integer of 2 or more, a plurality of B1's may be the same or different from each other, and B2 represents the group represented by Formula (B2), in which in a case where * in Formula (B2) represents a bonding position with $L^{B2}$ and s represents an integer of 2 or more, a plurality of B2's may be the same or different from each other.

14. The compound according to claim 12, wherein the compound is a copolymer having a repeating unit A including a photo-aligned group and the repeating unit B.

15. The compound according to claim 14, wherein the repeating unit A is a repeating unit represented by Formula (A), (A)

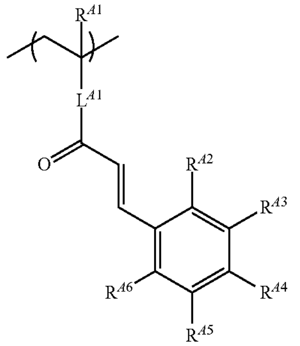

in Formula (A), $R^{A1}$ represents a hydrogen atom or a substituent, $L^{A1}$ represents a single bond or a divalent linking group, and $R^{A2}$, $R^{A3}$, $R^{A4}$, $R^{A5}$, and $R^{A6}$ each independently represent a hydrogen atom or a substituent, and two adjacent groups of $R^{A2}$, $R^{A3}$, $R^{A4}$, $R^{A5}$, and $R^{A6}$ may be bonded to each other to form a ring.

16. The compound according to claim 14, wherein the compound is a copolymer having a repeating unit C including a crosslinkable group, the repeating unit B, and the repeating unit A.

17. The compound according to claim 10, wherein a weight-average molecular weight is 10000 to 500000.

18. A binder layer formed of the binder composition according to claim 1.

19. An optical laminate comprising:
the binder layer according to claim 18; and
an optically anisotropic layer disposed on the binder layer.

20. An optical laminate manufacturing method comprising:
a step of supplying at least one selected from the group consisting of light, heat, acid, and base to a coating film formed of the binder composition according to claim 6, and then performing a photo-alignment treatment to form a binder layer; and
a step of performing coating on the binder layer with a polymerizable liquid crystal composition including a polymerizable liquid crystal compound to form an optically anisotropic layer.

21. An image display device comprising:
the binder layer according to claim 18.

22. A compound comprising:
a group represented by Formula (B1) or (B2),
where the compound having the group represented by Formula (B1) is limited to a polymer having a repeating unit B including the group represented by Formula (B1), (B1)

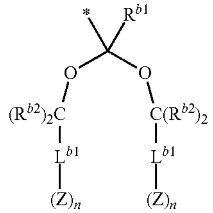

-continued (B2)

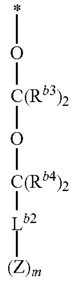

in Formulae (B1) and (B2),
* represents a bonding position,
n represents an integer of 1 or more, where a plurality of n's may be the same or different from each other,
m represents an integer of 2 or more,
$R^{b1}$ represents a hydrogen atom or a substituent,
$R^{b2}$, $R^{b3}$, and $R^{b4}$ each independently represent a hydrogen atom or a substituent, where two $R^{b3}$'s may be bonded to each other to form a ring, a plurality of $R^{b2}$'s may be the same or different from each other, a plurality of $R^{b3}$'s may be the same or different from each other, and a plurality of $R^{b4}$'s may be the same or different from each other,
$L^{b1}$ represents an (n+1)-valent linking group, where a plurality of $L^{b1}$'s may be the same or different from each other,
$L_{b2}$ represents an (m+1)-valent linking group, and
Z represents an aliphatic hydrocarbon group having a fluorine atom or an organosiloxane group, where the aliphatic hydrocarbon group may have an oxygen atom, and a plurality of Z's may be the same or different from each other.

* * * * *